US012768032B2

(12) United States Patent
Lee et al.

(10) Patent No.: US 12,768,032 B2
(45) Date of Patent: Oct. 20, 2026

(54) AREA-SELECTIVE FILM FORMING METHOD USING POLYUREA

(71) Applicant: Samsung Electronics Co., Ltd., Suwon-si (KR)

(72) Inventors: Soyoung Lee, Suwon-si (KR); Jeong-Do Oh, Wanju-gun (KR); Eun Hyea Ko, Suwon-si (KR); Ee-Seul Shin, Wanju-gun (KR); Kwan-Hyun Park, Wanju-gun (KR); Kang-Min Lee, Wanju-gun (KR); Younjoung Cho, Suwon-si (KR); Hoon Han, Suwon-si (KR); Byungkeun Hwang, Suwon-si (KR); Sunhye Hwang, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 98 days.

(21) Appl. No.: 18/753,418

(22) Filed: Jun. 25, 2024

(65) Prior Publication Data

US 2025/0163569 A1 May 22, 2025

(30) Foreign Application Priority Data

Nov. 21, 2023 (KR) ........................ 10-2023-0162022

(51) Int. Cl.
*B05D 1/00* (2006.01)
*C23C 16/02* (2006.01)
(Continued)

(52) U.S. Cl.
CPC .............. *C23C 16/042* (2013.01); *B05D 1/60* (2013.01); *C23C 16/0272* (2013.01); *C23C 16/06* (2013.01)

(58) Field of Classification Search
CPC ........................................................ B05D 1/00
See application file for complete search history.

(56) References Cited

U.S. PATENT DOCUMENTS 10,490,405 B2 11/2019 Yamaguchi et al.
10,748,782 B2 8/2020 Yamaguchi et al.
(Continued)

FOREIGN PATENT DOCUMENTS

EP 997929 A1 5/2000

OTHER PUBLICATIONS

Zhang, C.; Leskelä, M.; Ritala, M. Self-Aligned Thin-Film Patterning by Area-Selective Etching of Polymers. Coatings 2021, 11, 1124. https://doi.org/10.3390/coatings11091124.
(Continued)

*Primary Examiner* — Gordon Baldwin
*Assistant Examiner* — Mohammad Mayy
(74) *Attorney, Agent, or Firm* — Fish & Richardson P.C.

(57) ABSTRACT

An area-selective film forming method may include preparing a substrate having at least two areas made of different materials, forming a polyurea film on the at least two areas of the substrate, annealing the polyurea film and selectively removing the polyurea film on at least one area among the at least two areas, and forming a target film on the one area or a remaining area among the at least two areas. The one area may be an area from which the polyurea film is removed. The remaining area may be an area in which the polyurea film is not removed during the annealing the polyurea film and the selectively removing the polyurea film.

18 Claims, 39 Drawing Sheets

(51) Int. Cl.
*C23C 16/04* (2006.01)
*C23C 16/06* (2006.01)

(56) References Cited

U.S. PATENT DOCUMENTS

| | | | |
|---|---|---|---|
| 10,840,084 | B2 | 11/2020 | Yamaguchi |
| 11,094,535 | B2 | 8/2021 | Tois et al. |
| 11,424,119 | B2 | 8/2022 | Shero et al. |
| 11,569,088 | B2 | 1/2023 | Wang et al. |
| 11,608,557 | B2 | 3/2023 | Givens et al. |
| 11,694,903 | B2 | 7/2023 | Ritala et al. |
| 2018/0233350 | A1* | 8/2018 | Tois .................. H01L 21/76829 |
| 2018/0261458 | A1 | 9/2018 | Yamaguchi et al. |
| 2019/0122894 | A1 | 4/2019 | Yamaguchi et al. |
| 2019/0131125 | A1 | 5/2019 | Yamaguchi |
| 2020/0286726 | A1 | 9/2020 | Shero et al. |
| 2020/0294797 | A1* | 9/2020 | Nozawa ............ H01L 21/67103 |
| 2021/0301391 | A1 | 9/2021 | Givens et al. |
| 2021/0407818 | A1 | 12/2021 | Ritala et al. |
| 2022/0130659 | A1 | 4/2022 | Wang et al. |
| 2022/0359215 | A1 | 11/2022 | Vervuurt et al. |

OTHER PUBLICATIONS

Loscutoff, P et al., Formation of Organic Nanoscale Laminates and Blends by Molecular Layer Deposition, ACS Nano, vol. 4, No. 1, 331-341, 2020.

Loscutoff, P et al., Formation of Organic Nanoscale Laminates and Blends by Molecular Layer Deposition, ACS Nano, vol. 4, No. 1, 331-341, 2010.

* cited by examiner

PU 150 cycle on SiO2

AREA-SELECTIVE FILM FORMING METHOD USING POLYUREA

CROSS-REFERENCE TO RELATED APPLICATIONS

This application claims priority under 35 U.S.C. § 119 to Korean Patent Application No. 10-2023-0162022, filed on Nov. 21, 2023 in the Korean Intellectual Property Office, the entire disclosure of which is incorporated herein by reference.

BACKGROUND

Embodiments of the present disclosure described herein relate to a method of selectively forming a film in an area of a substrate, and more particularly, relate to a method of selectively forming a film in an area on a substrate using polyurea.

In manufacturing semiconductor elements, a process of forming a specific pattern in a specific area may be included. When a specific pattern of the semiconductor element is formed, an area-selective deposition process may be employed. However, a material for implementing the area-selective deposition process according to the related art does not have great area selectivity, and thereafter it may be difficult to remove the material.

SUMMARY

Embodiments of the present disclosure provide an area-selective film forming method using polyurea.

According to an embodiment, an area-selective film forming method may include preparing a substrate having at least two areas, the two areas being made of different materials; forming a polyurea film on the at least two areas of the substrate; annealing the polyurea film and selectively removing the polyurea film on one area among the at least two areas; and forming a target film on the one area or a remaining area among the at least two areas. The one area may be an area from which the polyurea film is removed. The remaining area may be an area in which the polyurea film is not removed during the annealing the polyurea film and the selectively removing the polyurea film.

In some embodiments, the at least two areas made of different materials may include a first area made of a non-metallic film and a second area made of a metallic film.

In some embodiments, the selectively removing the polyurea film may include selectively removing the polyurea film on the second area such that a polyurea film pattern forms on the first area.

In some embodiments, the annealing the polyurea film may be performed at a temperature of 200° C. to 350° C.

In some embodiments, the annealing the polyurea film may be performed under a vacuum state.

In some embodiments, the annealing the polyurea film may completely remove the polyurea film formed on the second area.

In some embodiments, the area-selective film forming method may further include removing the polyurea film pattern on the first area.

In some embodiments, the metallic film may include cobalt (Co), copper (Cu), nickel (Ni), niobium (Nb), molybdenum (Mo), ruthenium (Ru), rhodium (Rh), tungsten (W), palladium (Pd), silver (Ag), gold (Au), iridium (Ir), or platinum (Pt), or a combination thereof.

In some embodiments, the non-metallic film may be made of at least one of a non-metallic compound including one or more group 13 to 17 elements in periods of 3 to 6, one or more oxides thereof, one or more nitrides thereof, or one or more oxy nitrides thereof; a metallic compound including one or more metal oxides, one or more metal nitrides, or one or more metal oxy nitrides; a silicon-based compound; a carbon compound including amorphous carbon, graphite, graphene, or carbon nanotubes, an aluminum compound including aluminum, aluminum oxide, aluminum nitride, or aluminum oxynitride, or a combination thereof.

According to an embodiment, an area-selective film forming method may include preparing a substrate including a non-metallic film in a first area of the substrate and a metallic film in a second area of the substrate; forming a polyurea film having different heights on the first area and the second area of the substrate by one of vapor deposition, molecular layer deposition, or atomic layer deposition, or a combination thereof; annealing the polyurea film under a vacuum state and selectively removing the polyurea film on the second area; selectively depositing a target film on the second area; and removing the polyurea film on the first area.

According to an embodiment, an area-selective film forming method may include preparing a substrate including a first film and a second film having different materials, the first film being in a first area of the substrate, the second film being in a second area of the substrate, and the first area and the second area being different from each other; forming a polyurea film on the first area and the second area; annealing the polyurea film, selectively removing the polyurea film on the second area, and forming a polyurea film pattern on the first area; selectively forming a layer forming inhibitor on the second area from which the polyurea film is removed; removing the polyurea film pattern on the first area; forming a target film on the first area; and removing the layer forming inhibitor on the second area.

BRIEF DESCRIPTION OF THE FIGURES

The above and other aspects and features of the present disclosure will become apparent by describing in detail embodiments thereof with reference to the accompanying drawings.

DETAILED DESCRIPTION

Figure 1A:
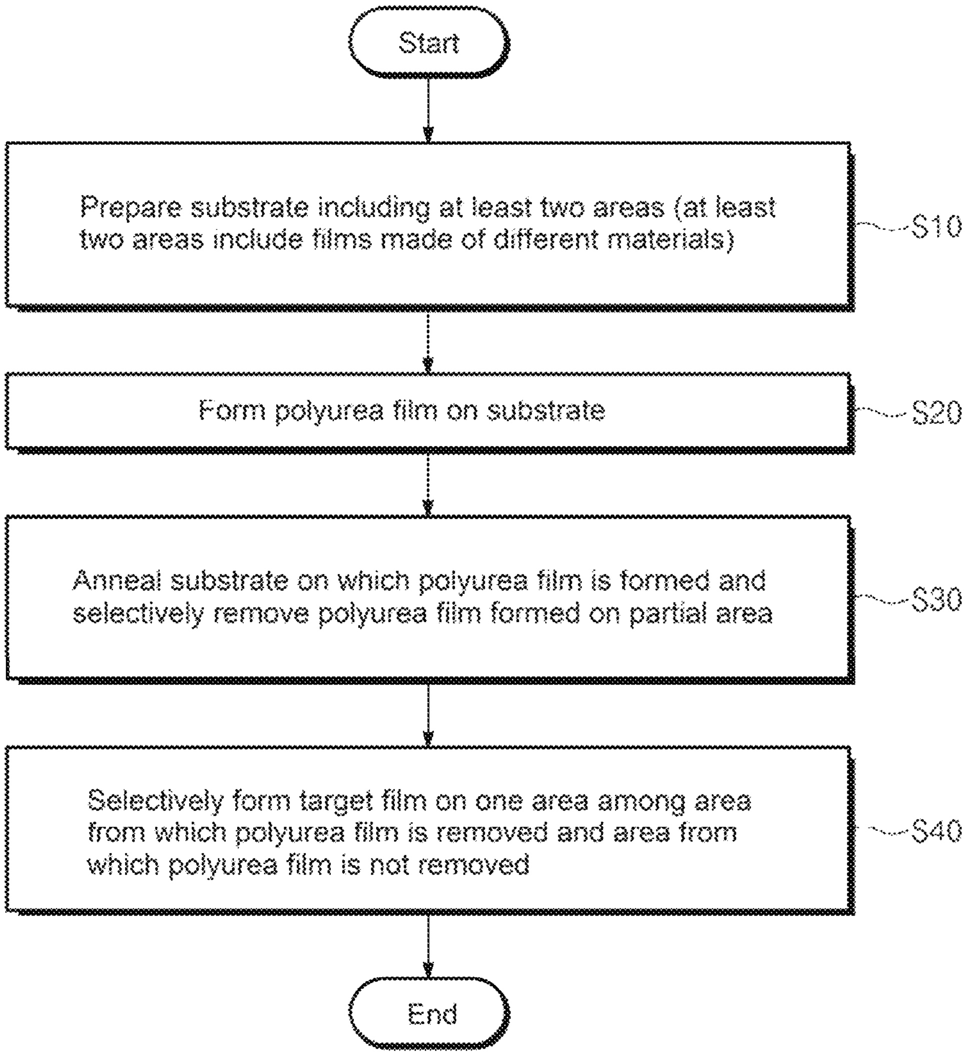
FIG. 1A is a flowchart illustrating an area-selective film forming method according to an embodiment of the present disclosure.

Although the following terms are considered to be well understood by those skilled in the art, the following definitions are described to facilitate description of the presently disclosed subject matter of the present disclosure. Unless otherwise defined, all technical and scientific terms used in the specification have the same meanings as generally understood by those skilled in the art to which the subject matter of the presently disclosed disclosure pertains. An arbitrary method, an arbitrary device, and an arbitrary material that are similar or equivalent to those described herein may be used in implementation or inspection of the subject matter of the presently disclosed disclosure, but now a representative method, a representative device, and a representative material are described.

Unless otherwise indicated, all numbers expressing the amounts of ingredients, reaction conditions, and the like, used in the specification and the appended claims should be understood as being modified by the term "about" in all cases. Thus, unless otherwise indicated, numerical parameters described in the specification and the appended claims are approximate values that may vary depending on desired properties to be achieved by the subject matter of the presently disclosed disclosure. As used herein, the term "about" includes changes from specific amounts by ±20% in some embodiments, ±10% in some embodiments, ±5% in some embodiments, ±1% in some embodiments, ±0.5% in some embodiments, and ±0.1% in some embodiments when referring to a value or amount of a mass, a weight, a time, a volume, a concentration or a percentage, these changes are intended to be included when the disclosed method is suitable for implementation.

An embodiment of the present disclosure relates to an area-selective film forming method of selectively forming a desired (and/or alternatively predetermined) film in a specific area on a substrate. The area-selective film forming method of forming a desired (and/or alternatively predetermined) target film on a substrate may be employed in various fields and may be particularly employed in a process of manufacturing a semiconductor element. For example, an additional metallic film may be laminated on a second area, in which a desired (and/or alternatively predetermined) metallic film is formed, using the area-selective film forming method according to an example embodiment of the present disclosure. Alternatively, an additional metal oxide film may be laminated on the second area, in which the desired (and/or alternatively predetermined) metallic film is formed, using the area-selective film forming method according to an example embodiment of the present disclosure. The area-selective film forming method according to an example embodiment of the present disclosure may be performed in various reaction spaces, for example, in a reaction chamber for a process of manufacturing a semiconductor element.

Hereinafter, example embodiments of the present disclosure will be described in more detail with reference to the accompanying drawings.

Figure 1B:
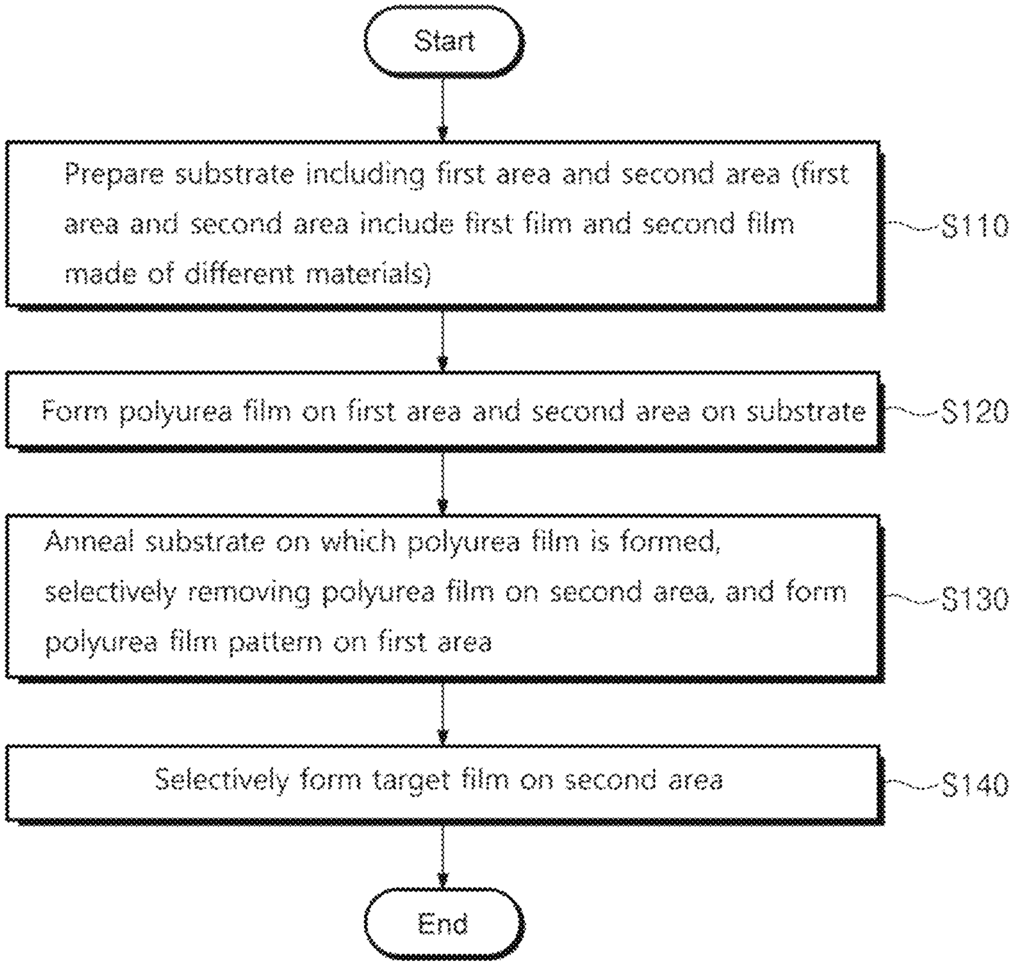
FIG. 1B is a flowchart illustrating the area-selective film forming method in more detail.

FIG. 1A is a flowchart illustrating an area-selective film forming method according to an embodiment of the present disclosure, FIG. 1B is a flowchart illustrating the area-selective film forming method in more detail, as an example, a substrate for forming a target film has different first and second area, and the areas include first and second films made of different materials.

Referring to FIGS. 1A and 1B, the area-selective film forming method according to an example embodiment of the present disclosure includes, as an operation of preparing a substrate having at least two different areas, operation S10 of providing the at least two areas have films made of different materials, operation S20 of forming a polyurea film on the substrate, operation S30 of annealing the substrate on which the polyurea film is formed and selectively removing the polyurea film formed on a partial area, and operation S40 of selectively forming a target film on any one of an area in which the polyurea film is removed or the remaining area in which the polyurea film is not removed.

In more detail, the area-selective film forming method according to an example embodiment of the present disclosure includes operation S110 of preparing a substrate having a first area and a second area that are different from each other and providing the first area and the second area including a first film and a second film made of different materials, operation S120 of forming the polyurea film on the first area and the second area on the substrate, operation S130 of annealing the substrate on which the polyurea film is formed, selectively removing the polyurea film on the second area, and forming a polyurea film pattern on the first area, and operation S140 of selectively forming the target film on the second area.

FIGS. 2A to 2D are cross-sectional views sequentially illustrating operations of the area-selective film forming method according to the flowcharts of FIGS. 1A and 1B.

Figure 2A:
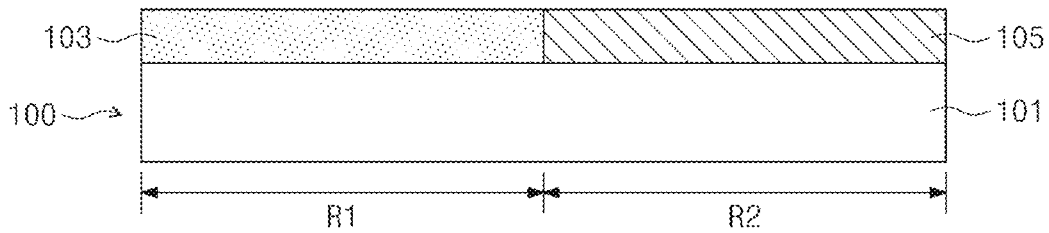
FIGS. 2A to 2D are cross-sectional views sequentially illustrating operations of the area-selective film forming method according to the flowcharts of FIGS. 1A and 1B.

Referring to FIG. 2A, first, a substrate 100 having at least two areas made of different materials is prepared.

The substrate 100 includes a base substrate 101 and a first film 103 and a second film 105 provided on the base substrate 101. In an example embodiment of the present disclosure, the first film 103 and the second film 105 may be made of different materials, the first film 103 may be provided in a first area R1, and the second film 105 may be provided in a second area R2.

Here, the first area R1 and the second area R2 are provided to have the same or substantially the same shape and area of the first film 103 and the second film 105 when viewed on a plane. Accordingly, when a component is provided on the first film 103, it may be interpreted as if a material is provided on the first area R1, and when a component is provided on the second film 105, it may be interpreted as if a material is provided on the second area R2.

The numbers of films made of different materials and areas in which these films are formed are not limited thereto, and the numbers of films made of different materials and areas in which these films are formed may be three or more.

The base substrate 101 may be a semiconductor substrate 100, such as a silicon substrate 100. The base substrate 101 refers to an arbitrary material or an arbitrary material layer in which elements, circuits, or various material layers may be formed. The base substrate 101 may be made of a semiconductor such as silicon or germanium, for example, a group IV material or a group II-VI or group III-V semiconductor. However, a material constituting the base substrate 101 is not limited thereto and may include metal, glass, quartz, or organic polymers such as plastic.

The first area R1 and the second area R2 may be provided as a film having a desired (and/or alternatively predetermined) thickness on the base substrate 101. Here, the films of the first area R1 and the second area R2 may have a thickness in a range of several nanometers to several millimeters.

In an example embodiment of the present disclosure, the first film 103 provided in the first area R1 and the second film 105 provided in the second area R2 may include chemically different materials. For example, the first film 103 may be made of a non-metallic film, and the second film 105 may be made of a metallic film. Here, the first film 103 and the second film 105 may include one or more layers of sub-films, and when the first film 103 and the second film 105 include a plurality layers of sub-films, a non-metallic material or a metallic material is provided on the uppermost layer of the sub-films constituting the first film 103 and the second film 105, that is, on surfaces of the first film 103 and the second film 105.

In an example embodiment of the present disclosure, the non-metallic film constituting the first film 103 refers to a film made of various materials except for pure metals or alloys of pure metals except for metals. The non-metallic film may include non-metallic compounds including group 13 to 17 elements in periods of 3 to 6, oxides thereof, nitrides thereof, or oxy nitrides thereof and/or metallic compounds including metal oxides, metal nitrides, and metal oxy nitrides, or the like. For example, the non-metallic film may include various silicon-based compounds such as silicon oxide, silicon nitride, silicon oxy nitride, doped silicon, silicon, poly-silicon, or silicon carbide, carbon compounds such as amorphous carbon, graphite, graphene, and carbon nanotubes, aluminum compounds such as aluminum, aluminum oxide, aluminum nitride, and aluminum oxy nitride and/or organic polymer compounds. The metal compound may include, for example, an oxide of a transition metal, a nitride of the transition metal, or an oxy nitride of the transition metal. For example, the metal compound may include titanium oxide, cobalt oxide, zinc oxide, nickel oxide, zirconium oxide, hafnium oxide, vanadium oxide, chromium oxide, molybdenum oxide, tungsten oxide, manganese oxide, rhenium oxide, ruthenium oxide, and niobium oxide, rhodium oxide, palladium oxide, platinum oxide, copper oxide, silver oxide, lanthanum oxide, titanium nitride, aluminum nitride, tantalum nitride, niobium nitride, molybdenum nitride, hafnium nitride, tungsten nitride or the like.

In an example embodiment of the present disclosure, the non-metallic layer may include silicon oxide, silicon nitride, hafnium oxide, aluminum nitride, or the like.

In an example embodiment of the present disclosure, the metallic film constituting the second film 105 corresponds to a concept including a film made of a metal alloy as well as a film made of metal. Impurities of oxygen or nitrogen may be present on or in the metallic film, but a concentration of the impurities may be 10 at % or less, for example, 5 at % or less, 1 at % or less, or 0.01 at % or less in the entire metallic film.

The metal constituting the metallic film is not particularly limited thereto, but may be transition metals in periods 4 to 6, and may include, for example, cobalt (Co), copper (Cu), nickel (Ni), niobium (Nb), molybdenum (Mo), ruthenium (Ru), rhodium (Rh), tungsten (W), palladium (Pd), silver (Ag), gold (Au), iridium (Ir), platinum (Pt), or the like. In an example embodiment of the present disclosure, the metal constituting the first area R1 may be cobalt (Co), copper (Cu), nickel (Ni), niobium (Nb), molybdenum (Mo), and ruthenium (Ru), rhodium (Rh), tungsten (W), or alloys thereof.

In an example embodiment of the present disclosure, the metallic film may include tungsten, copper, ruthenium, or the like.

In an example embodiment of the present disclosure, the base substrate 101 may be omitted. When the base substrate 101 is provided, the base substrate 101 may be used as a support structure so that the first film 103 and the second film 105 are formed on an upper surface thereof, and the first film 103 and the second film 105 share the base substrate 101. However, the base substrate 101 is not essential, and the base substrate 101 may be provided only in the first film 103, may be provided only in the second film 105 or may not be provided in both the first film 103 and the second film 105.

When the base substrate 101 is not provided, the substrate 100 may include only the first film 103 and the second film 105.

The first area R1 and the second area R2 may be arranged in an arbitrary suitable pattern. For example, the first area R1 and the second area R2 may be alternating lines, and one area thereof may surround the other one area thereof in a plan view. The patterned structure may be provided on the arbitrary suitable substrate 100.

Figure 2B:
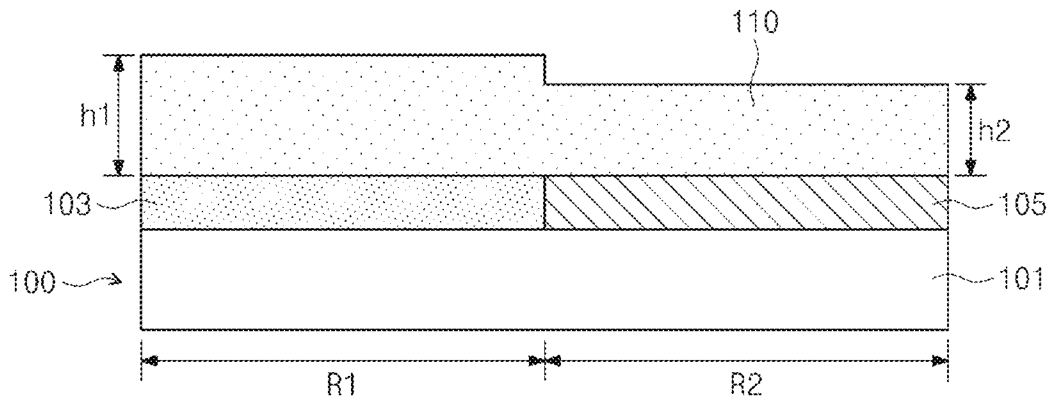

Referring to FIG. 2B, a polyurea film 110 is formed on the substrate 100.

An operation of forming the polyurea film 110 is an operation of reacting an amine precursor other than monoamine with an isocyanate selected from diisocyanate, triisocyanate, and a combination thereof and depositing the reacted material on the substrate 100.

Chemical Formula 1 is a general formula representing the polyurea, and Chemical Formula 2 represents a polymerization reaction by which the polyurea is formed.

[Chemical Formula 1]

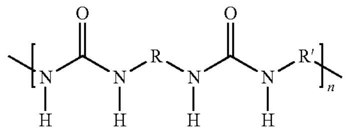

[Chemical Formula 2]

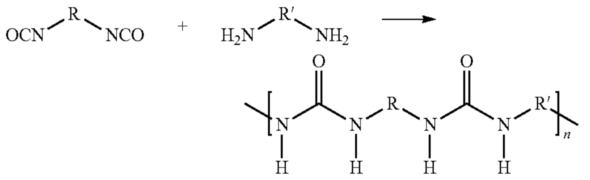

Here, R and R' may be an independently substituted or unsubstituted chain or cyclic alkylene having 1 to 16 carbon atoms, and n is a natural number 2 to 500,000.

The term "substituted" used herein means that a hydrogen atom of the substituted portion is replaced with a substituent. Unless otherwise stated with regard to the substituent, halogen, hydroxyl, (lower) alkyl, haloalkyl, mono- or dialkylamino, aryl, heterocycle, $—NO_2$, $—NR_{a1}R_{b1}$, $—NR_{a1}C(═O)R_{b1}$, $—NR_{a1}C(═O)NR_{a1}R_{b1}$, $—NR_{a1}C(═O)OR_{b1}$, $—NR_{a1}SO_2R_{b1}$, $—OR_{a1}$, —CN, $—C(═O)R_{a1}$, $—C(═O)OR_{a1}$, $—C(═O)NR_{a1}R_{b1}$, $—OC(═O)R_{a1}$, $—OC(═O)OR_{a1}$, $—OC(═O)NR_{a1}R_{b1}$, $—NR_{a1}SO_2R_{b1}$, $—PO_3R_{a1}$, $—PO(OR_{a1})(OR_{b1})$, $—SO_2R_{a1}$, $—S(O)R_{a1}$, $—SO(NR_{a1})R_{b1}$ (e.g., sulfoximine), $—S(NR_{a1})R_{b1}$ (e.g., sulfilimine) and $—SR_{a1}$ may be used as an arbitrary substituted substituents of the present disclosure. Herein, $R_{a1}$ and $R_{b1}$ may be the same or different, may independently be hydrogen, halogen, amino, alkyl, alkoxyalkyl, haloalkyl, aryl, or heterocycle, or may have the form of a heterocycle, which is like the attached nitrogen atom. Here, $R_{a1}$ and $R_{b1}$ may be provided in plurality according to a bonded atom. The alkyl may be C1-C6, the aryl may be C6-C12, and the heterocycle may be C3-C10.

In an example embodiment of the present disclosure, diamine may be ethylene diamine, trimethylenediamine, tetramethylenediamine, pentamethylenediamine, hexamethylenediamine, heptamethylenediamine, octamethylenediamine, diethylene triamine, benzene triamine, triethylenetetraamine, diethylenetriamine, tris(2-aminoethyl)amine), melamine, hexaaminobenzene, polyethyleneimine or combinations thereof. In an example embodiment of the present disclosure, the diamine may be ethylenediamine. When the diamine is ethylenediamine, it is easy to form the polyurea film 110 having low flexibility and a relatively high thickness so that a polymerization reaction may occur a plurality of times without self-termination.

In an example embodiment of the present disclosure, the diisocyanate may be ethylene diisocyanate), trimethylene diisocyanate, tetramethylene diisocyanate, pentamethylene diisocyanate, hexamethylene diisocyanate, heptamethylene diisocyanate, octamethylene diisocyanate, phenylene diisocyanate, diphenylmethane 4,4'-diisocyanate, 4,4,4"-Triphenylmethane triisocyanatem or combinations thereof. In an example embodiment of the present disclosure, the diisocyanate may be phenylene diisocyanate. When phenylene diisocyanate is used as diisocyanate, it is easy to form the polyurea film 110 having low flexibility and a relatively high thickness so that a polymerization reaction may occur a plurality of times without self-termination.

In an example embodiment of the present disclosure, the diisocyanate may be 1,4-phenylene diisocyanate, and the amine other than monoamine may be ethylenediamine as diamine. As an example, a polymerization reaction formula of 1,4-phenylene diisocyanate and ethylenediamine is expressed in Chemical Formula 3 below.

[Chemical Formula 3]

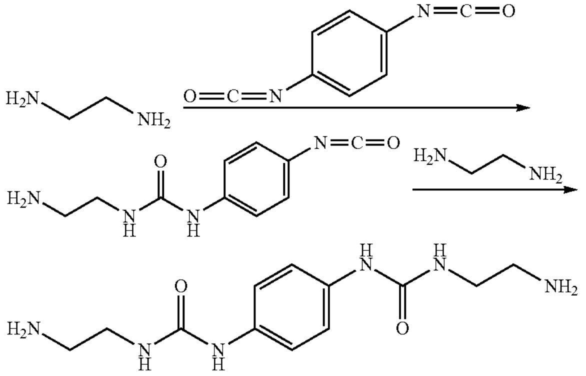

In an example embodiment of the present disclosure, the polyurea film 110 is formed in a desired (and/or alternatively predetermined) thickness on surfaces of the first area R1 and the second area R2.

The polyurea film 110 may be formed by a molecular layer deposition method of sequentially providing diamine and diisocyanate to a reaction space (e.g., reaction chamber). When the polyurea film 110 is formed in the MLD method, an operation of providing and sequentially reacting diamine and diisocyanate may be performed by a periodic deposition method that is repeatedly performed a plurality of times. For example, the performing may be repeated tens, hundreds, or thousands of times. Further, the number of times of the performing may change according to a thickness of the polyurea film 110 to be manufactured, and the performing may be repeatedly performed several thousands of times.

When the polyurea film 110 is formed by the periodic deposition method, diisocyanate is first reacted on the substrate 100 having the first film 103 and the second film 105 inside the reaction space, diamine then comes into contact with the reacted diisocyanate, and thus a chain reaction of diisocyanate and diamine may be induced. Since the first film 103 and the second film 105 provided in the first area R1 and the second area R2 are made of non-metal and metal, the degree of bonding with an amine group of diamine may change. For example, the degree of bonding between a non-metal surface and diamine in the first film 103 may be greater than the degree of bonding between a metal surface and diamine in the second film 105. Bonding between the amine group of diamine and surfaces of the first film 103 and the second film 105 may be a chemical bonding with functional groups present on the first film 103 and the second film 105 or may be a van der Waals interaction. In an example embodiment of the present disclosure, an operation of separately treating (e.g., plasma-treating) the first film 103 and the second film 105 of the substrate 100 may be added to reduce reactivity between the diisocyanate and the surfaces of the first film 103 and the second film 105. One end (e.g., one amine group) of diamine is bonded to the first film 103 and/or the second film 105, and thereafter, the other end (e.g., the other one amine group) of the diamine may react with one end of diisocyanate (e.g., one isocyanate group). Thereafter, when diamine is provided back into the reaction space, the one end of diamine reacts with the other unreacted end (e.g., the other one isocyanate group) of diisocyanate. A polyurea chain is formed in this manner. In the reaction, the chain may extend as well as the reaction may be terminated according to reaction conditions (in particular, a length of R and R' groups of diamine and diisocyanate), but this does not significantly affect the formation of the polyurea film 110, and the reaction may be repeatedly performed until the polyurea film 110 having a desired thickness is obtained.

In an example embodiment of the present disclosure, diamine and diisocyanate may be injected into the reaction space together with a carrier gas. In this case, a flow rate of the carrier gas may be in a range of 50 sccm to 2000 sccm, 100 sccm to 800 sccm, 200 sccm to 600 sccm, or 300 sccm to 500 sccm. The carrier gas may be an inert gas, and for example, argon, nitrogen, hydrogen, helium, or the like may be used as the carrier gas.

A reaction temperature when the polyurea film 110 is deposited may be smaller than a temperature when the polyurea is decomposed. In an example embodiment of the present disclosure, the reaction temperature when the polyurea film 110 is deposited may be selected from a range of about 20° C. to about 120° C. For example, in an example embodiment of the present disclosure, a deposition temperature of the polyurea film 110 may be in a range of about 30° C. to about 80° C. When the reaction temperature when the polyurea film 110 is deposited is greater than 120° C., the polyurea may start to be decomposed, and when the reaction temperature when the polyurea film 110 is deposited is smaller than 20° C., a sufficient polymerization reaction may not be performed.

In an example embodiment of the present disclosure, a reaction chamber pressure while a carbon-containing material such as an organic material may be in a range of about 1 millitorr (mTorr) to about 300 Torr, about 1 mTorr to about 100 Torr, about 10 mTorr to 50 Torr, or 100 mTorr to 30 Torr.

When the polyurea film 110 is deposited on the first area R1 and the second area R2, the polyurea film 110 may have an area-selective thickness. For example, the polyurea film 110 may have different heights in the first area R1 and the second area R2. The polyurea film 110 may be deposited to different degrees depending on the type of a surface of a substrate on which the polyurea film 110 is deposited, and particularly, may be deposited to different degrees on a film made of metal or non-metal like the first film 103 and the second film 105. This is because diamine and/or diisocyanate, especially diamine, reacts and is bonded to different degrees on a metal surface and a non-metal surface. In an example embodiment of the present disclosure, the polyurea film 110 may be deposited thicker in the first area R1 than in the second area R2 when deposited under the same conditions. When a thickness of the polyurea film 110 deposited in the first area R1 is referred to as a first thickness h1, and a thickness of the polyurea film 110 deposited in the second area R2 is referred to as a second thickness h2, the first thickness h1 may be greater than the second thickness h2. A difference between the thicknesses of the polyurea film 110 in the first area R1 and the second area R2 facilitates subsequent removal of the polyurea film 110 in the second area R2.

The above description has been made based on the fact that the polyurea film 110 is formed by molecular layer deposition, but a method of forming the polyurea film 110 is not limited thereto, and the polyurea film 110 may be formed by one method among chemical vapor deposition, atomic layer deposition, or a combination thereof in addition to the molecular layer deposition. The chemical vapor deposition and/or the atomic layer deposition may be performed in a periodic or aperiodic method.

Figure 2C:
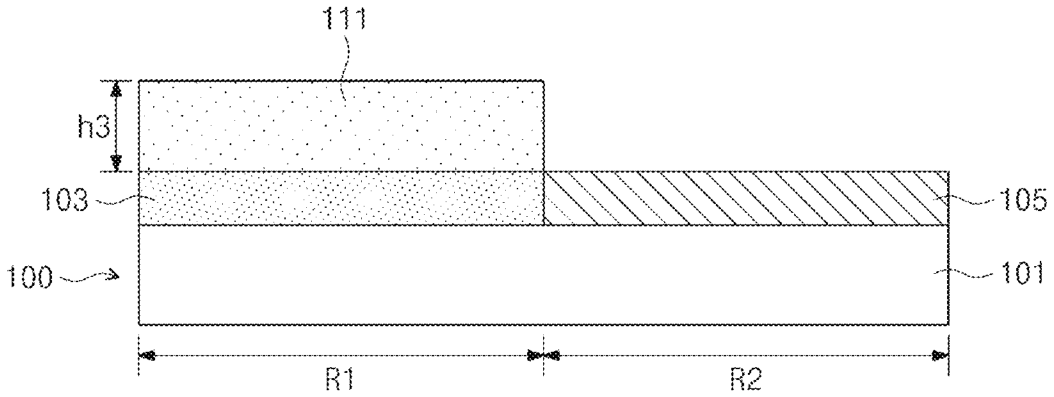

Referring to FIG. 2C, at least one polyurea film 110 among at least two areas is selectively removed by annealing the substrate 100 on which the polyurea film 110 is formed. Here, the polyurea film 110 that is removed may be the polyurea film 110 on the second area R2 on which a metallic film is formed, and the polyurea film 110 having a lower height than that before the annealing is formed on the first area R1. Hereinafter, for convenience of description, the polyurea film 110 remaining in the first area R1 after the initially formed polyurea film 110 is annealed is referred to as a polyurea film pattern 111.

An operation of annealing the polyurea film 110 may be performed by a manner of putting the substrate 100, on which the polyurea film 110 is formed, into the reaction space (e.g., the reaction chamber) and heating the substrate 100.

In an example embodiment of the present disclosure, the operation of annealing the polyurea film 110 may be performed at a temperature of about 150° C. to about 500° C., about 170° C. to about 450° C., about 200° C. to about 350° C. or about 250° C. to about 300° C. In an example embodiment of the present disclosure, an operation of annealing the polyurea film pattern 111 may be performed at a temperature of 200° C. to 350° C.

In an example embodiment of the present disclosure, the operation of annealing the polyurea film 110 may be performed under a pressure significantly lower than the atmospheric pressure. For example, the operation of annealing the polyurea film 110 may be performed under a vacuum state. In an example embodiment of the present disclosure, the vacuum state means a state under a pressure that is significantly lower than the atmospheric pressure and means a pressure inside the reactor, which is 100 Torr or less, 10 Torr or less, or 1 Torr or less.

In an example embodiment of the present disclosure, an operation of annealing the polyurea film 110 under a vacuum state may be performed for about one minute to about 200 minutes, about 1 minute to about 100 minutes, about 1 minute to about 50 minutes, or about 1 minute to about 20 minutes. Here, the annealing time may change depending on the annealing temperature, the type of the polyurea film 110 (e.g., the types of R and R' in Chemical Formula 1), the thickness of the polyurea film 110, or the like.

In an example embodiment of the present disclosure, the polyurea film 110 on the second area R2 is completely removed from a surface of the substrate 100 through the annealing under a vacuum state.

In the specification, the meaning that the polyurea film 110 on the second area R2 is "completely removed" from the substrate 100 includes a case in which the polyurea film 110 is completely removed from the substrate 100 and thus the amount of the polyurea film 110 present on the surface of the substrate 100 is 0 as well as a case in which a small amount of the polyurea film 110 is present such that the polyurea film 110 does not react with other components even when a small amount of the polyurea film 110 is present or other components are not affected even when the polyurea film 110 reacts with other components. A case in which the small amount of the polyurea film 110 is present may correspond to a case in which the polyurea film 110 is present at a substantially noise level and a case in which, when measurement is performed by measurement equipment, a measurement value is 0 in addition to noise measured by the measurement equipment. In an example embodiment of the present disclosure, when the polyurea film 110 is completely removed from the substrate 100, the polyurea film 110 may present on the substrate 100 in less than 2 wt %, preferably less than 1 wt %, more preferably less than 0.5 wt %, and most preferably less than 0.1 wt %.

In an example embodiment of the present disclosure, the polyurea film 110 on the second area R2 is removed from an upper surface of the second film 105 by catalytic cracking the polyurea film 110 by the second film 105 when the annealing process is performed under a vacuum state. Here, the metal contained in the second film 105 acts as a catalyst and accelerates decomposition of the polyurea film 110, thereby accelerating the removal of the polyurea film 110.

A portion of the polyurea film 110 on the first area R1 is decomposed and removed when the annealing process is performed under a vacuum state, but the catalytic reaction does not occur as in the second area R2, and thus the degree of decomposition is significantly lower than that in the second area R2. Accordingly, a removal rate of the polyurea film 110 in the second area R2 is relatively faster than a removal rate of the polyurea film 110 in the first area R1, and after a desired (and/or alternatively predetermined) time point, only the polyurea film 110 in the first area R1 remains and the polyurea film 110 of the second area R2 is completely removed. In particular, in a state in which there is a difference between heights of the polyurea film 110 itself in the first area R1 and the second area R2 before the annealing, in addition, there is a difference between decomposition rates of the polyurea film 110 in the first area R1 and the second area R2, and as a result, the removal rate of the polyurea film 110 in the second area R2 has no choice but to be significantly faster than the removal rate of the polyurea film 110 in the first area R1. As a result, the polyurea film 110 in the first area R1 may not be removed, and the polyurea film pattern 111 having a height (e.g., a third height h3) smaller than the height before the annealing is formed.

As described above, the polyurea film 110 provided in the second area R2 may be selectively removed through the annealing under a vacuum state, and as a result, the polyurea film 110 is formed only in the first area R1, and an upper surface of the second area R2 is exposed to the outside.

Figure 2D:
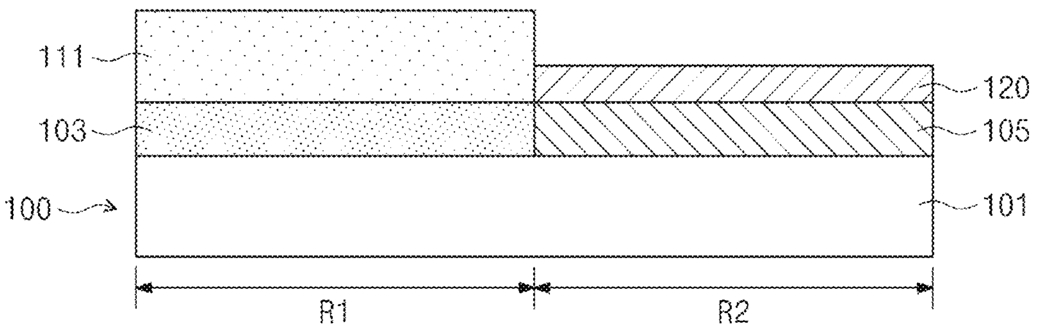

Referring to FIG. 2D, a target film 120 is formed on the second film 105 in the second area R2. In this case, the target film 120 may be selectively deposited only in the second area R2 among the first area R1 in which the polyurea film pattern 111 is formed and the second area R2 in which the polyurea film 110 is removed. In this case, the polyurea film pattern 111 functions as a layer forming inhibitor that limits and/or prevents the target film 120 from being formed in the first area R1.

A material constituting the target film 120 may be selected from those having selective affinity or reactivity with respect to a surface of the polyurea film pattern 111 on the first area R1 and an exposed surface of the second film 105.

For example, materials having affinity for metal among metals and non-metallic organic materials such as polyurea patterns may be selected as the material constituting the target film 120.

In an example embodiment of the present disclosure, the material constituting the target film 120 may include metal. When the target film 120 is made of a metal material, one metallic film may be formed on another metallic film.

The metal constituting the target film 120 is not particularly limited thereto, but may be transition metals in periods 4 to 6, and may include, for example, cobalt (Co), copper (Cu), nickel (Ni), niobium (Nb), molybdenum (Mo), ruthenium (Ru), rhodium (Rh), tungsten (W), palladium (Pd), silver (Ag), gold (Au), iridium (Ir), platinum (Pt), or the like. In an example embodiment of the present disclosure, the metal constituting the target film 120 may be cobalt (Co), copper (Cu), nickel (Ni), niobium (Nb), molybdenum (Mo), and ruthenium (Ru), rhodium (Rh), tungsten (W), or alloys thereof.

The target film 120 may be formed by any one method of molecular layer deposition, chemical vapor deposition, atomic layer deposition, or combinations thereof. The molecular layer deposition, the chemical vapor deposition and/or the atomic layer deposition may be performed in a periodic or aperiodic method.

In an example embodiment of the present disclosure, the material constituting the target film 120 may be selected from an arbitrary material as long as the material has sufficient selectivity between the polyurea film pattern 111 formed in the first area R1 and the second film 105 (e.g., a metallic film) of the second area R2. For example, the material constituting the target film 120 may be a metal compound such as a metal oxide, a metal nitride, or a metal oxy nitride. Alternatively, the material constituting the target film 120 may be a silicon compound such as silicon, silicon oxide, silicon nitride, silicon oxy nitride, or doped silicon, a carbon compound such as amorphous carbon, graphite, graphene, and carbon nanotubes, an aluminum compound such as aluminum, aluminum oxide, aluminum nitride, or aluminum oxy nitride, or an organic polymer.

In an example embodiment of the present disclosure, the target film 120 may be formed for various purposes. For example, the target film 120 formed on the second area R2 may function as a multi-layer wiring line or electrode formed on the metallic film and made of different metals. Alternatively, the target film 120 formed on the second area R2 may be provided on the metallic film of the second area R2 and thus function as a capping film or a passivation film that protects the second film 105 of the second area R2. The target film 120 may also be used as an etch preventing film or the like in a subsequent process.

Figure 3:
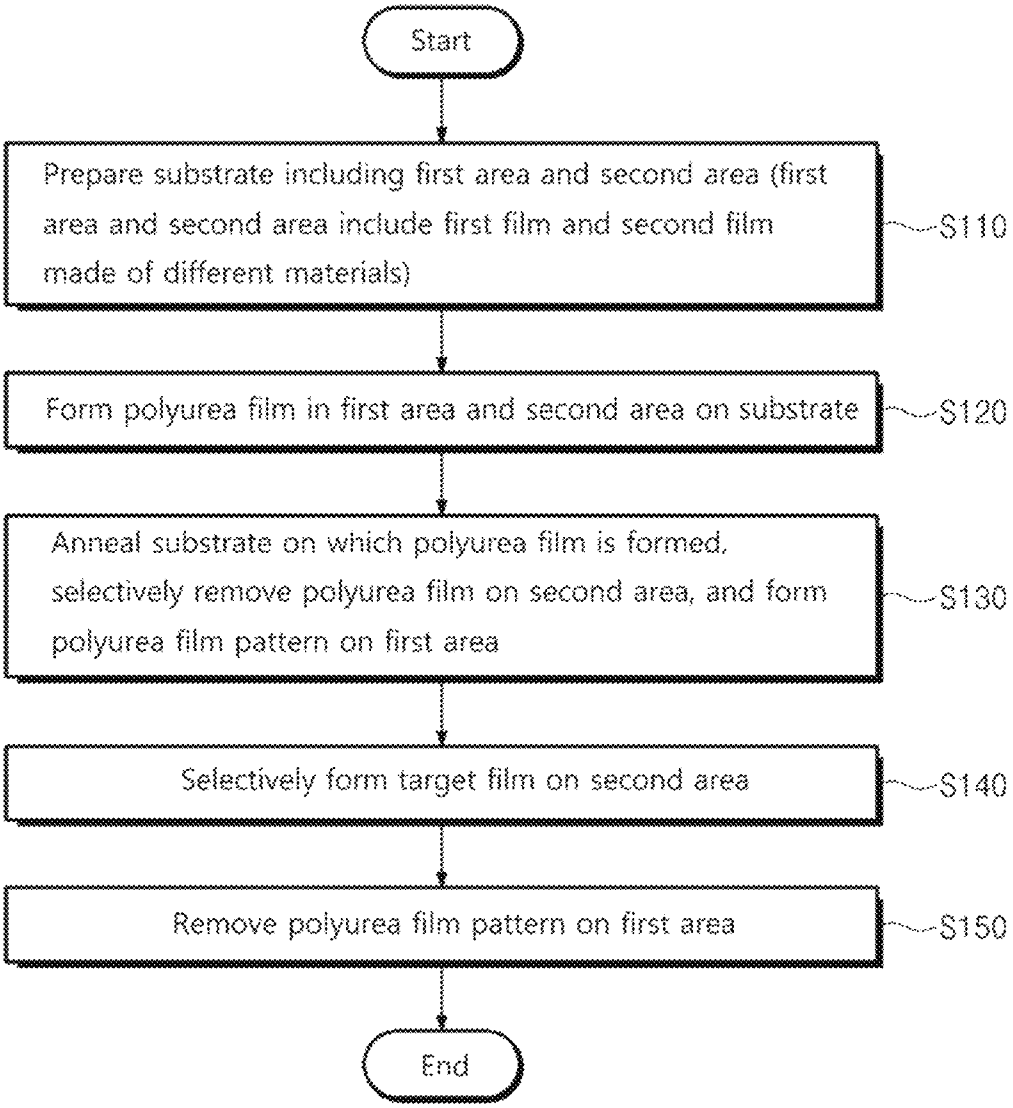
FIG. 3 is a flowchart illustrating the area-selective film forming method according to an example embodiment of the present disclosure.

FIG. 3 is a flowchart illustrating the area-selective film forming method according to an example embodiment of the present disclosure, and FIGS. 4A to 4E are cross-sectional views sequentially illustrating operations of the area-selective film forming method according to the flowchart of FIG. 3.

According to an example embodiment of the present disclosure, the polyurea film pattern 111 on the first area R1 may be selectively removed. The operation of removing the polyurea film pattern 111 is optional, and the polyurea film pattern 111 may be maintained on the first area R1 without change and may be removed only when exposure of an upper surface of the first film 103 is required.

In more detail, the area-selective film forming method according to an example embodiment of the present disclosure includes operation S110 of preparing a substrate having a first area and a second area that are different from each other and providing the first area and the second area including a first film and a second film made of different materials, operation S120 of forming the polyurea film on the first area and the second area on the substrate, operation S130 of annealing the substrate on which the polyurea film is formed, selectively removing the polyurea film on the second area, and forming a polyurea film pattern on the first area, operation S140 of selectively forming the target film on the second area, and operation S150 of removing the polyurea film pattern in the first area.

FIGS. 4A to 4D are like FIGS. 2A to 2D. That is, the operation of preparing the substrate 100 including the first film 103 and the second film 105 made of different materials on the first area R1 and the second area R2 that are different from each other, forming the polyurea film 110 on the first film 103 and the second film 105 on the substrate 100, annealing the substrate 100 on which the polyurea film 110 is formed, selectively removing the polyurea film 110 on the second area R2, and forming a polyurea film pattern 111 on the first area R1, and selectively forming the target film 120 on the second area R2 may be performed in the same manner as in the present embodiment. In the present embodiment, to avoid duplicated description, the description of parts (e.g., FIGS. 4A to 4D) that are the same or substantially the same as the above-described embodiments will be omitted, and a difference from the above-described embodiments will be mainly described.

Figure 4A:
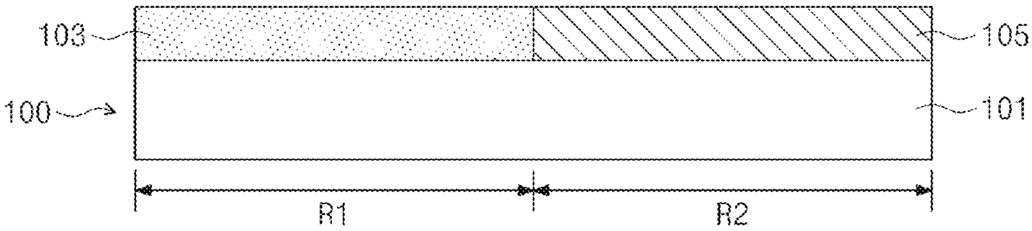
FIGS. 4A to 4E are cross-sectional views sequentially illustrating operations of the area-selective film forming method according to the flowchart of FIG. 3.
Figure 4B:
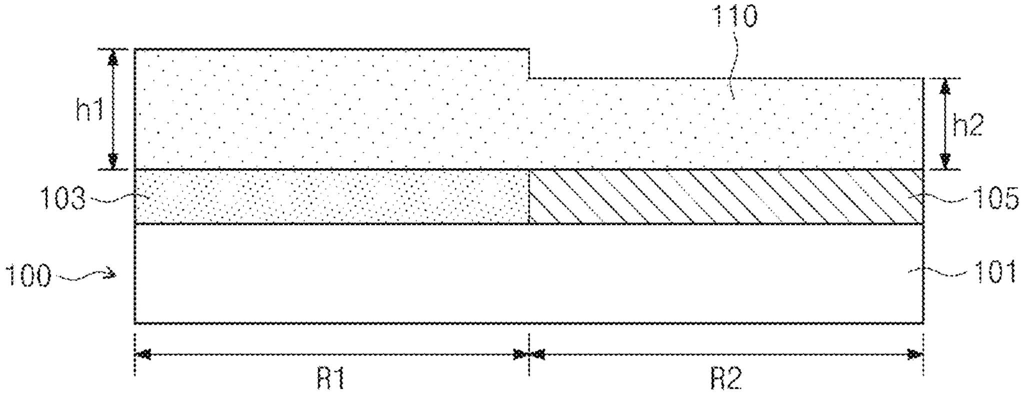
Figure 4C:
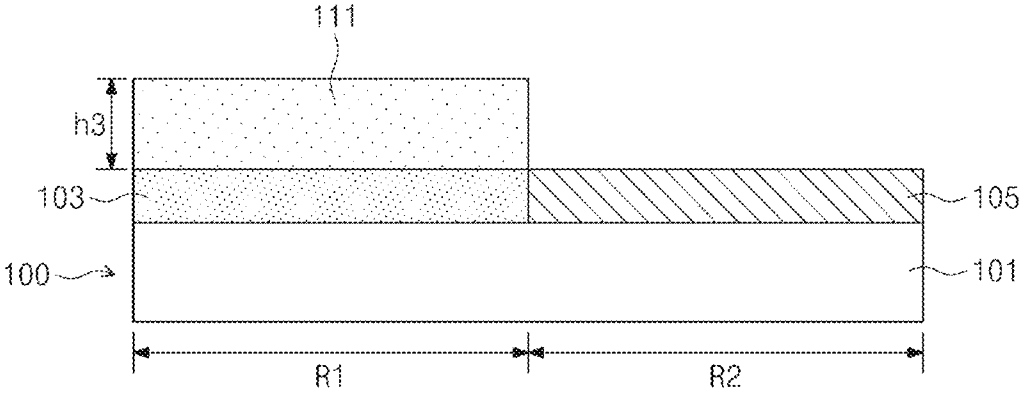
Figure 4D:
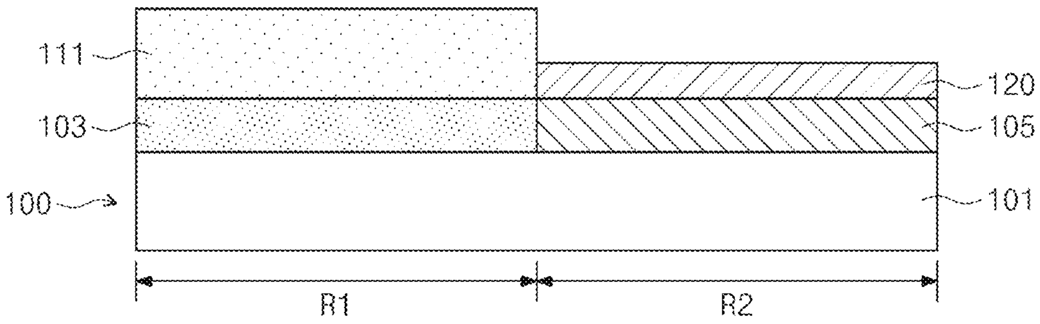
Figure 4E:
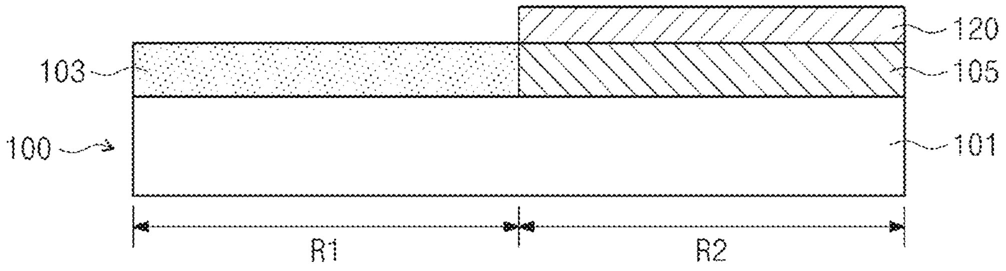

Referring to FIG. 4E, the polyurea film pattern 111 on the first area R1 may be later removed.

The polyurea film pattern 111 may be removed in various manners, and for example, the polyurea film pattern 111 may be removed using a method that is the same or substantially the same as the method of annealing and removing the substrate 100, on which the polyurea film 110 is formed, in FIG. 2C. That is, the polyurea film pattern 111 remaining on the first area R1 may be removed by annealing the substrate 100 on which the polyurea film pattern 111 is formed. In an example embodiment of the present disclosure, the operation of annealing the polyurea film pattern 111 may be performed at a temperature of about 150° C. to about 500° C., about 170° C. to about 450° C., about 200° C. to about 350° C., about 200° C. to about 300° C., or about 200° C. to about 250° C. In an example embodiment of the present disclosure, an operation of annealing the polyurea film pattern 111 may be performed at a temperature of 200° C. to 350° C.

In an example embodiment of the present disclosure, the operation of annealing the polyurea film pattern 111 may be performed under a pressure significantly lower than the atmospheric pressure. For example, the operation of annealing the polyurea film pattern 111 may be performed under a vacuum state. In an example embodiment of the present disclosure, the vacuum state means a state under a pressure that is significantly lower than the atmospheric pressure and means a pressure inside the reactor, which is 100 Torr or less, 10 Torr or less, or 1 Torr or less. In an example embodiment of the present disclosure, the operation of annealing the polyurea film pattern 111 under a vacuum state may be performed for 10 minutes to 200 minutes, 10 minutes to 150 minutes, or 10 minutes to 120 minutes. Here, the annealing time may change depending on the type of the polyurea film pattern 111 (e.g., the types of R and R' in Chemical Formula 1), the thickness of the polyurea film pattern 111, or the like. In an example embodiment of the present disclosure, the polyurea film pattern 111 on the first area R1 may be completely removed from the surface of the substrate 100 through the annealing under a vacuum state. The polyurea film pattern 111 among the target film 120 of the second area R2 may be selectively removed using the above-described annealing under a vacuum state. Under the same conditions, the polyurea film pattern 111 may decompose faster than the target film 120 in the second area R2. Accordingly, by adjusting an etching condition (particularly, an etching time) of the polyurea film pattern 111, only the polyurea film pattern 111 may be removed while the target film 120 of the second area R2 is maintained.

In an example embodiment of the present disclosure, the polyurea film pattern 111 on the first area R1 may be removed through the annealing under a vacuum state as described above, but the present disclosure is not limited thereto. For example, the polyurea film pattern 111 on the first area R1 may be removed using annealing inside a gas chamber, plasma treatment, or a combination thereof in addition to the annealing inside a vacuum chamber. When the gas chamber is used, a used gas may be hydrogen, oxygen, ammonia, argon, nitrogen, or combinations thereof.

The target film is selectively formed on the second area through the above-described processes. Thus, selective forming of a desired (and/or alternatively predetermined) film only on a specific area without a separate complicated process such as photolithography, that is, area-selective film forming is possible.

In an example embodiment of the present disclosure, the polyurea film pattern is formed only in the first area to selectively form the target film on the second area. Thus, the polyurea film has very great selectivity for annealing removal compared to other organic compounds, and the polyurea film pattern is easily removed as compared to other organic compounds when the remaining polyurea film pattern is removed after the target film is formed. For example, polyimide may be formed only in the first area to selectively form the target film on the second area. However, in the case of polyimide, it is difficult to completely remove polyimide from the metallic film that is the second film, and it is impossible to completely remove the polyimide from the non-metallic film that is the first film. In particular, when a material such as polyimide is used, polyimide may be removed through thermal annealing using oxygen or plasma treatment. In this case, the oxygen annealing or the plasma treatment may cause interface defects such as oxidation of the metallic film. However, when the polyurea film is used as in the present disclosure, the polyurea is easily and selectively removed through the annealing under a vacuum state, and thus there is no need for the annealing including oxygen or the plasma treatment, making it possible to form a film-forming structure having fewer defects.

Further, in an example embodiment of the present disclosure, the polyurea film may be selectively formed in a specific area in various thicknesses in a range of several nanometers to a several millimeters, and as the polyurea films having various thicknesses are used as the layer forming inhibitor, the target film that is targeted may be easily manufactured without defects. For example, when the polyurea film is formed on the first area to have a relatively large thickness, defects such as side deposition on a polyurea side of the target film to be formed in the second area or deposition on the polyurea film are limited and/or prevented.

According to an example embodiment of the present disclosure, an additional layer forming inhibitor is area-selectively formed in the second area using the area-selective film forming method, and the target film may be formed even on the first area using the same.

Figure 5:
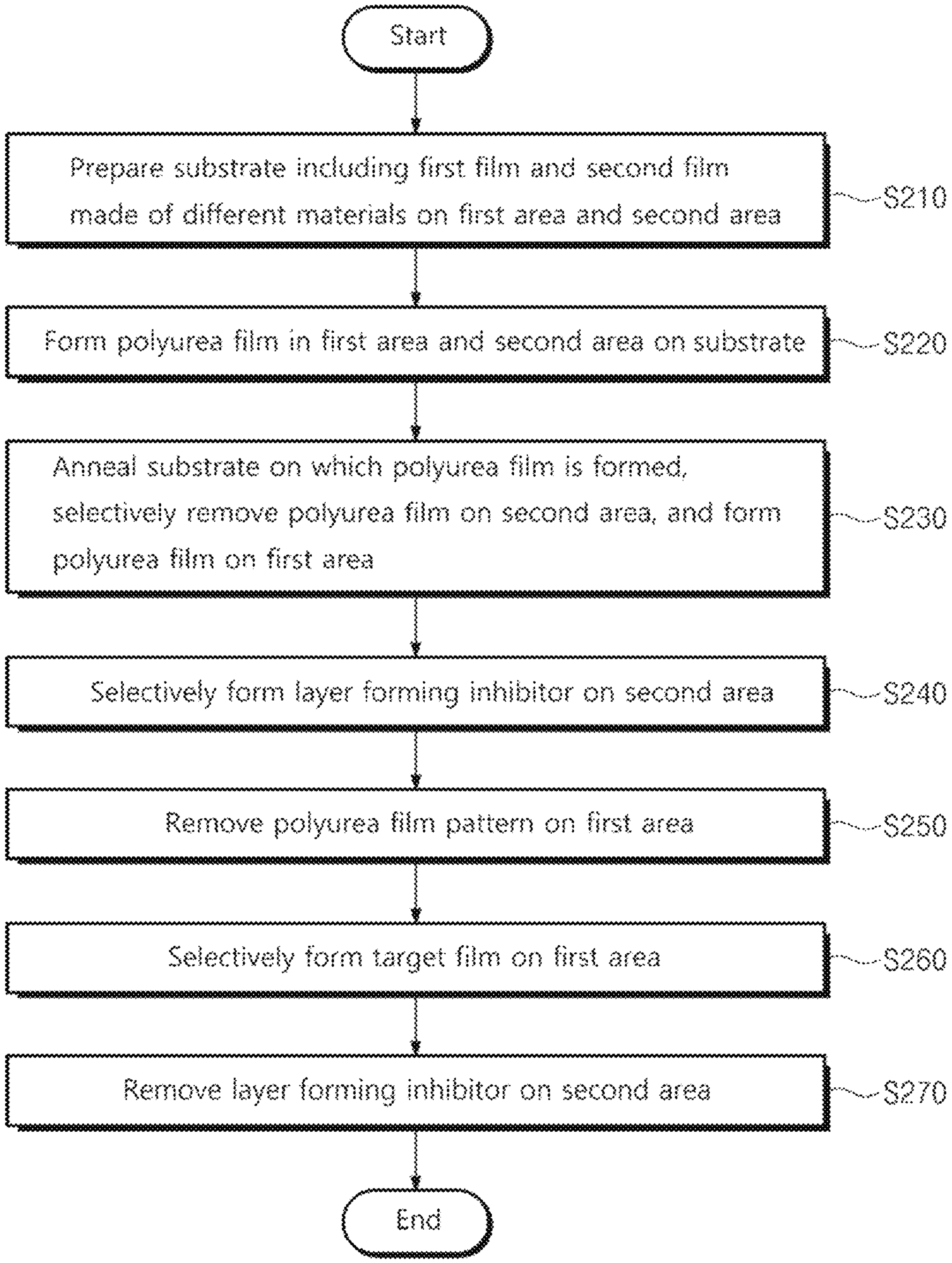
FIG. 5 is a flowchart illustrating the area-selective film forming method according to an example embodiment of the present disclosure.

FIG. 5 is a flowchart illustrating the area-selective film forming method according to an example embodiment of the present disclosure, and FIGS. 6A to 6G are cross-sectional views sequentially illustrating operations of the area-selective film forming method according to the flowchart 5.

First, referring to FIG. 5, the film forming method according to an example embodiment of the present disclosure includes operation S210 of preparing a substrate including a first film and a second film made of different materials on a first area and a second area that are different from each other, operation S220 of forming a polyurea film on the first film and the second film on the substrate, operation S230 of annealing the substrate on which the polyurea film is formed and selectively removing the polyurea film on the second area, operation S240 of forming a layer forming inhibitor on the second area in which the polyurea film is removed, operation S250 of removing a polyurea film pattern on the first area, operation S260 of forming a target film in the first area in which the layer forming inhibitor is not formed, and operation S270 of removing the layer forming inhibitor on the second area.

Figure 6A:
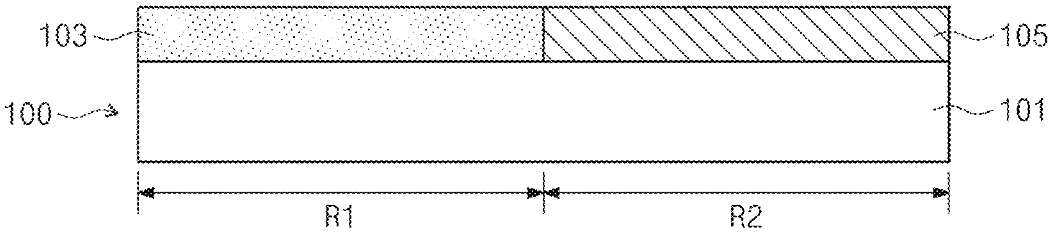
FIGS. 6A to 6G are cross-sectional views sequentially illustrating operations of the area-selective film forming method according to the flowchart 5.
Figure 6B:
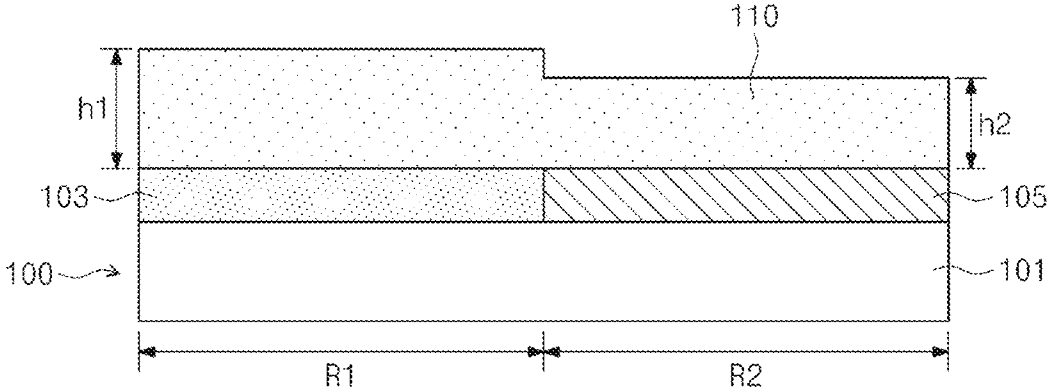
Figure 6C:
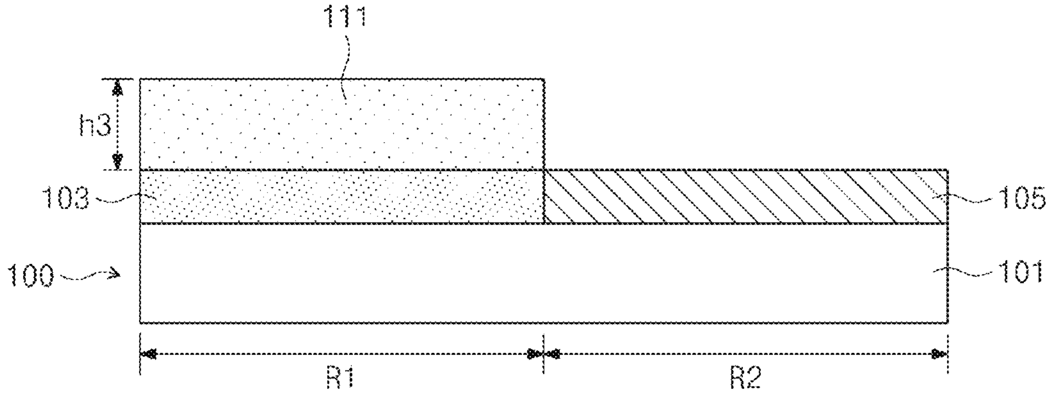

In the present embodiment, the drawings illustrated in FIGS. 6A to 6C are like FIGS. 2A to 2C. That is, the operation of preparing the substrate 100 including the first film 103 and the second film 105 made of different materials on the first area R1 and the second R2 that are different from each other, forming the polyurea film 110 on the first film 103 and the second film 105 on the substrate 100, and selectively removing the polyurea film 110 on the second area R2 by annealing the substrate 100 on which the polyurea film 110 is formed may be performed the same or substantially the same as in the present embodiment. After the polyurea film 110 on the second area R2 is selectively removed, the polyurea film pattern 111 is formed on the first area R1, and the second film 105 on the second area R2 is exposed to the outside.

To avoid duplicated description, the description of parts (e.g., FIGS. 6A to 6C) that are the same or substantially the same as the above-described embodiments will be omitted, and a difference from the above-described embodiments will be mainly described.

Figure 6D:
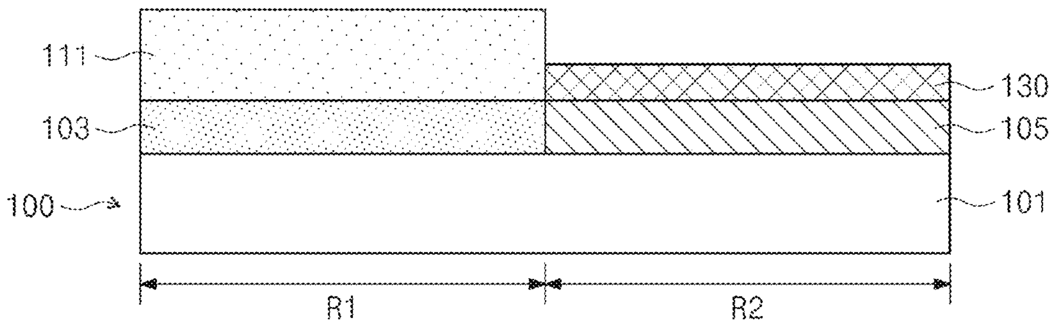

Referring to FIG. 6D, a layer forming inhibitor 130 is formed on the substrate 100. The layer forming inhibitor 130 may be provided on the second film 105 of the second area R2, which is exposed to the outside. The layer forming inhibitor 130 serves to limit and/or prevent an additional target film 140 from being formed in the second area R2 and allows the target film 140 to be formed only in the first area R1 when an additional film is formed after the layer forming inhibitor 130 is formed.

The layer forming inhibitor 130 may be selectively deposited only in the second area R2 among the first area R1 in which the polyurea film pattern 111 is formed and the second area R2 in which the polyurea film 110 is removed.

A material constituting the layer forming inhibitor 130 may be selected from those having selective affinity or reactivity with respect to the surface of the polyurea film pattern 111 on the first area R1 and the exposed surface of the second film 105. For example, the material constituting the layer forming inhibitor 130 may be selected from those having affinity for a metal constituting the second film 105, that is, the metallic film, rather than the polyurea constituting the polyurea film pattern 111. When the material having affinity for metal is deposited on the substrate 100, the layer forming inhibitor 130 may be selectively formed only on the second film 105 of which a metallic film surface is exposed to the outside.

In an example embodiment of the present disclosure, the material constituting the layer forming inhibitor 130 may include metal. The metal constituting the layer forming inhibitor 130 is not particularly limited, but may be a transition metal of periods 4 to 6. The layer forming inhibitor 130 may be formed by any one method of molecular layer deposition, chemical vapor deposition, atomic layer deposition, or combinations thereof. The molecular layer deposition, the chemical vapor deposition and/or the atomic layer deposition may be performed in a periodic or aperiodic method. In an example embodiment of the present disclosure, the material constituting the layer forming inhibitor 130 may be selected from an arbitrary material in addition to the metal as long as the material has sufficient selectivity between the polyurea film pattern 111 formed in the first area R1 and the second film 105 (e.g., a metallic film) of the second area R2. For example, the material constituting the layer forming inhibitor 130 may be a metal compound such as a metal oxide, a metal nitride, or a metal oxy nitride. Alternatively, the material constituting the layer forming inhibitor 130 may be a silicon compound such as silicon, silicon oxide, silicon nitride, silicon oxy nitride, or doped silicon, a carbon compound such as amorphous carbon, graphite, graphene, and carbon nanotubes, an aluminum compound such as aluminum, aluminum oxide, aluminum nitride, or aluminum oxy nitride, or an organic polymer.

In an example embodiment of the present disclosure, the layer forming inhibitor 130 may be formed for various purposes. For example, the layer forming inhibitor 130 formed on the second area R2 may be provided on the metallic film of the second area R2 and thus function as a capping film or a passivation film that protects the second film 105. The layer forming inhibitor 130 may also be used as an etch preventing film or the like in a subsequent process.

Figure 6E:
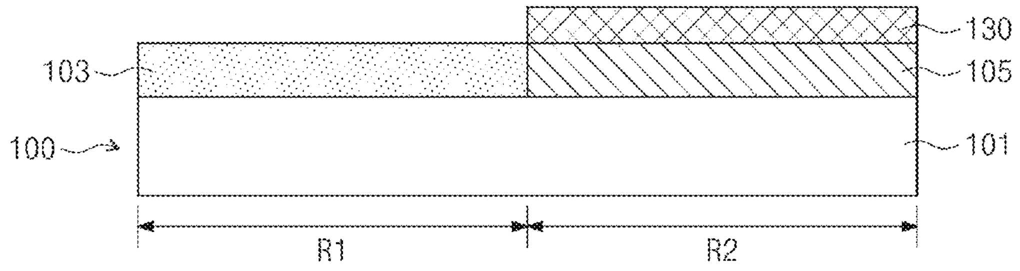

Referring to FIG. 6E, the polyurea film pattern 111 on the first area R1 may be removed. To form the target film 140 on the first film 103 of the first area R1, it may be necessary to expose the first film 103 to the outside, and to this end, the polyurea film pattern 111 may be removed to expose the first film 103 to the outside.

The polyurea film pattern 111 may be removed in various manners, and for example, the polyurea film pattern 111 may be removed using the method that is the same or substantially the same as the method of annealing and removing the substrate 100, on which the polyurea film 110 is formed, in FIG. 2C. That is, the polyurea film pattern 111 remaining on the first area R1 may be selectively removed by annealing the substrate 100 on which the polyurea film pattern 111 is formed. The layer forming inhibitor 130 on the second area R2 may be removed at a different rate from that of the polyurea film pattern 111, and accordingly, the polyurea film pattern 111 may be selectively removed.

In an example embodiment of the present disclosure, the operation of annealing the polyurea film pattern 111 may be performed under a pressure significantly lower than the atmospheric pressure. For example, the operation of annealing the polyurea film pattern 111 may be performed under a vacuum state. The polyurea film pattern 111 among the layer forming inhibitor 130 of the second area R2 may be selectively removed using the above-described annealing under a vacuum state. Under the same conditions, the polyurea film pattern 111 may decompose faster than the layer forming inhibitor 130 in the second area R2. Accordingly, by adjusting an etching condition (particularly, an etching time) of the polyurea film pattern 111, only the polyurea film pattern 111 may be removed while the layer forming inhibitor 130 of the second area R2 is maintained.

In an example embodiment of the present disclosure, the polyurea film pattern 111 on the first area R1 may be removed through the annealing under a vacuum state as described above, but the present disclosure is not limited thereto. For example, the polyurea film pattern 111 on the first area R1 may be removed using annealing inside a gas chamber, plasma treatment, or a combination thereof in addition to the annealing inside a vacuum chamber.

The upper surface of the first film 103 is exposed to the first area R1 by removing the polyurea film pattern 111 on the first area R1. The layer forming inhibitor 130 is formed in the second area R2.

Figure 6F:
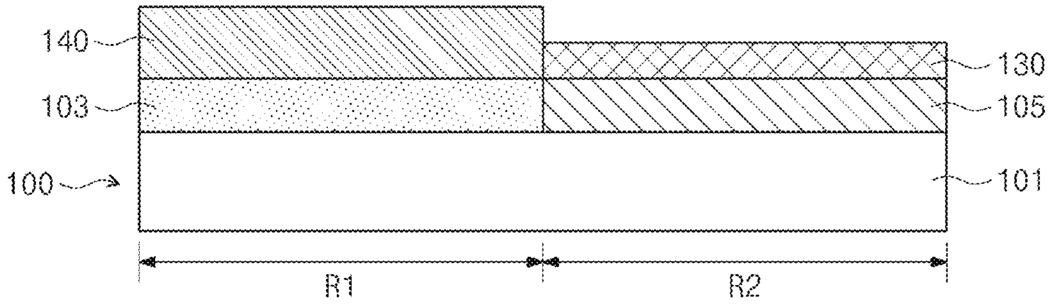

Referring to FIG. 6F, the target film 140 is selectively formed on the first area R1. The target film 140 may be selectively deposited only on the first area R1 among the first area R1 exposed by removing the polyurea film pattern 111 and the second area R2 in which the layer forming inhibitor 130 is formed.

The material constituting the target film 140 may be selected from those having selective affinity or reactivity with respect to a surface of the first film 103 (e.g., the non-metallic film) on the first area R1 and a surface of the layer forming inhibitor 130 on the second area R2. In particular, the material constituting the target film 140 may be selected from those having high affinity and reactivity with respect to the surface of the first film 103. For example, the target film 140 may be selected from those having affinity with respect to the non-metallic material of the first film 103 among the non-metallic material of the first film 103 of the exposed first area R1 and the layer forming inhibitor 130, and in this case, the target film 140 may be selectively formed only on the first film 103.

The target film 140 may be made of various materials, for example, a non-metallic film material. When the target film 140 is made of a non-metallic material, one insulating film may be formed on another insulating film.

The non-metallic film constituting the target film 140 may include non-metallic compounds including group 13 to 17 elements in periods of 3 to 6, oxides thereof, nitrides thereof, or oxy nitrides thereof and/or metal compounds including metal oxides, metal nitrides, and metal oxy nitrides, or the like. For example, the non-metallic film may include various silicon-based compounds such as silicon oxide, silicon nitride, silicon oxy nitride, doped silicon, silicon, polysilicon, or silicon carbide, carbon compounds such as amorphous carbon, graphite, graphene, and carbon nanotubes, aluminum compounds such as aluminum, aluminum oxide, aluminum nitride, and aluminum oxy nitride and/or organic polymer compounds. The metal compound may include, for example, an oxide of a transition metal, a nitride of the transition metal, or an oxy nitride of the transition metal. For example, the metal compound may include titanium oxide, cobalt oxide, nickel oxide, zirconium oxide, hafnium oxide, vanadium oxide, chromium oxide, molybdenum oxide, tungsten oxide, manganese oxide, rhenium oxide, ruthenium oxide, tantalum oxide, rhodium oxide, palladium oxide, platinum oxide, copper oxide, silver oxide or the like.

In an example embodiment of the present disclosure, the material constituting the target film 140 may be selected from arbitrary materials as long as the materials have sufficient selectivity between the non-metallic material of the first film 103 of the first area R1 and the layer forming inhibitor 130 of the second area R2.

The target film 140 may be formed by any one method of molecular layer deposition, chemical vapor deposition, atomic layer deposition, or combinations thereof. The molecular layer deposition, the chemical vapor deposition and/or the atomic layer deposition may be performed in a periodic or aperiodic manner.

In an example embodiment of the present disclosure, the target film 140 may be formed for various purposes. For example, the target film 140 formed on the first area R1 may be provided on the first film 103 (e.g., the non-metallic film) and thus may function as a capping film or a passivation film that protects the first film 103 of the first area R1. The target film 140 may also be used as an etch preventing film or the like in a subsequent process.

Figure 6G:
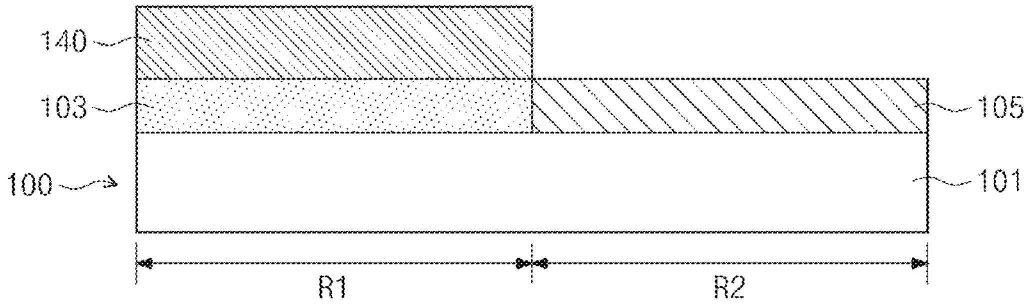

Referring to FIG. 6G, after the film forming on the first area R1 is completed, the layer forming inhibitor 130 on the second area R2 may be removed. The layer forming inhibitor 130 may not be removed according to the embodiment. The layer forming inhibitor 130 may be removed by various methods including annealing, dry etching, wet etching, and the like.

According to an example embodiment of the present disclosure, a method of forming a film having a specific pattern in an area-selective manner on a metal and a non-metal is provided. When this area-selective film forming method is used, a high-resolution pattern structure may be implemented using a low-cost and simple method instead of expensive and complex processes such as photolithography. In particular, in a semiconductor element manufacturing process, a fine structure including a pattern down to units of nanometers should be formed. In forming the pattern in units of nanometers using photolithography, high costs are consumed, and a process itself is complicated. In an example embodiment of the present disclosure, in the semiconductor element manufacturing process, photolithography is completely replaced or at least partially replaced, and thus the fine structure may be easily formed. In particular, in the area-selective film forming method according to an example embodiment of the present disclosure, the target films 120 that are automatically aligned according to an area may be formed. Thus, an expensive mask is not required, and exposure or development processes in a photolithography process are not required.

In an example embodiment of the present disclosure, the polyurea film 110 is used as a film for providing area selectivity when the pattern is formed. As described above, the decomposition rate of the polyurea film 110 is easily adjusted through the annealing under a vacuum state, and accordingly, the thickness of the polyurea film 110 is also easily adjusted. When the polyurea film 110 is formed on the metallic film or the non-metallic film, abnormal growth (e.g., abnormal growth on a side surface and/or in an upward direction) of the target film 120 when the subsequently deposited target film 120 is deposited may be limited and/or prevented by adjusting the thickness of the polyurea film 110. In particular, when the polyurea film 110 is formed to be relatively thicker than the target film 120, the abnormal growth of the target film 120 when the target film 120 is deposited is limited and/or prevented.

According to an example embodiment of the present disclosure, a capping film may be formed on a specific film inside the semiconductor element using the area-selective film forming method. Thus, this capping film is particularly applied onto a wiring line made of a metallic film, so that an electromigration (EM) phenomenon inside the semiconductor element may be improved. The capping film according to the related art is formed in a deposition method on a specific metal wiring line using an inherent precursor. However, in this case, there is an issue in that a seed is formed on the non-metallic film having a low dielectric constant. Thus, a process such as plasma treatment is required to remove the seed. The problem is that the plasma treatment causes damage to the non-metallic film.

In contrast, in an example embodiment of the present disclosure, the capping film may be area-selectively formed on the specific film inside the semiconductor element regardless of the type of precursor used for the metal surface. Further, since the capping layer may be formed at a relatively low temperature without the plasma treatment, damage to the non-metallic film having a low dielectric constant may be limited and/or prevented.

The area-selective film forming method according to an example embodiment of the present disclosure may be specified according to an experimental example and thus will be described together with the following experimental examples.

Experimental Example 1

A SiN film and a $SiO_2$ film as a first film was formed on a basic substrate, and a tungsten thin film as a second film was formed on the basic substrate. Next, the polyurea film was deposited in the MLD method. The MLD process conditions are as follows. Next, a polyurea film was formed by the present method unless otherwise mentioned.

MLD Process Condition

- Process temperature: 50° C.
- 1,4-phenylene diisocyanate canister heating temperature: 60° C.
- Canister heating temperature for ethylenediamine: Room temperature
- Source carrier argon flow rate: 400 sccm
- Pure argon flow rate: 1300 sccm
- Operating pressure: 0.8 Torr
- Operating period: The one period included ① diisocyanate provision—② diisocyanate purge—③ diamine provision—④ diamine purge and was performed for the following time.
  - ① Provision time of 1,4-phenylene diisocyanate: 200 sec
  - ② Purge time: 300 sec
  - ③ Provision time of ethylenediamine: 20 sec
  - ④ Purge time: 300 sec
- MLD period 20 periods, 40 periods, and 100 periods The MLD was performed on the SiN film and the $SiO_2$ film corresponding to the first film and the W film corresponding to the second film without pretreatment according to a basic deposition condition at 20 periods, 40 periods, and 100 periods.

Figure 7:
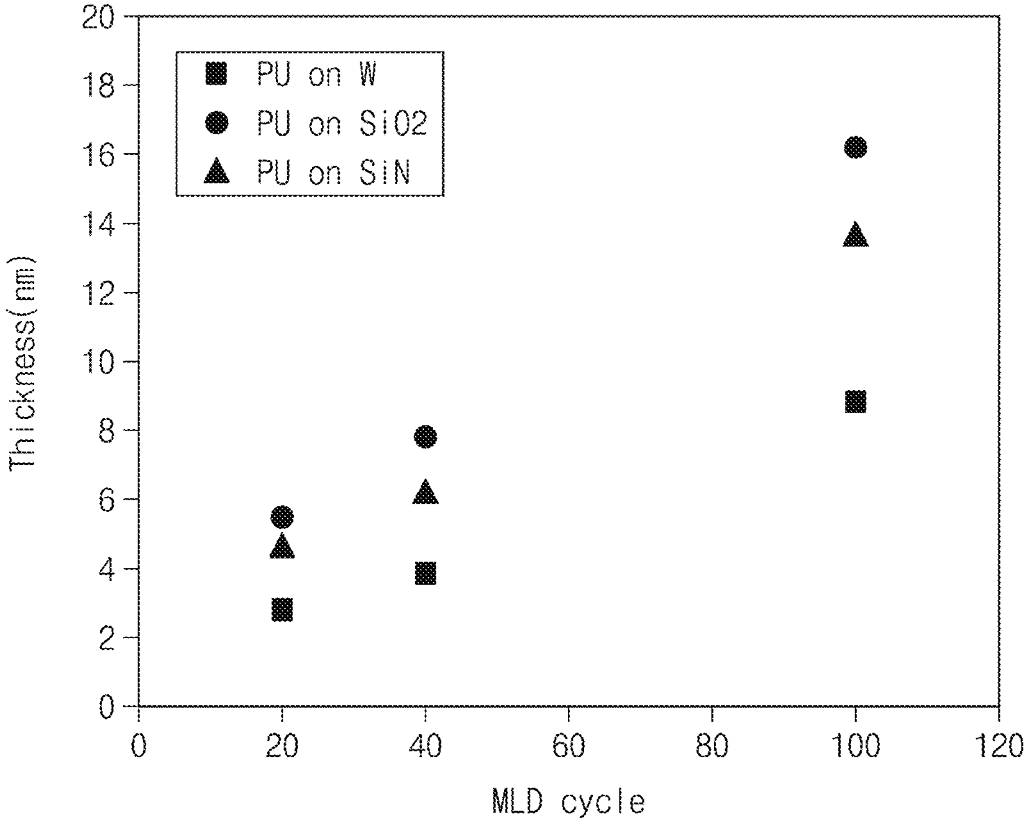
FIG. 7 illustrates an ellipsometry analysis result of a thickness of a polyurea film formed on a first film and a second film according a molecular layer deposition (MLD) period.

Table 1 and FIG. 7 was a result of ellipsometry analysis of a thickness of the polyurea film formed on the first film and the second film according to the MLD period. In Table 1 and FIG. 7, the result of the thickness of the polyurea film was written, and reliability of the ellipsometry analysis was identified using X-ray reflectivity (XRR) analysis and alpha-step.

TABLE 1

| MLD | Thickness of polyurea film (nm) | | |
|---|---|---|---|
| period | SiN | $SiO_2$ | W |
| 20 | 4.6 | 5.5 | 2.8 |
| 40 | 6.2 | 7.8 | 3.9 |
| 100 | 13.6 | 16.2 | 8.9 |

Figure 8A:
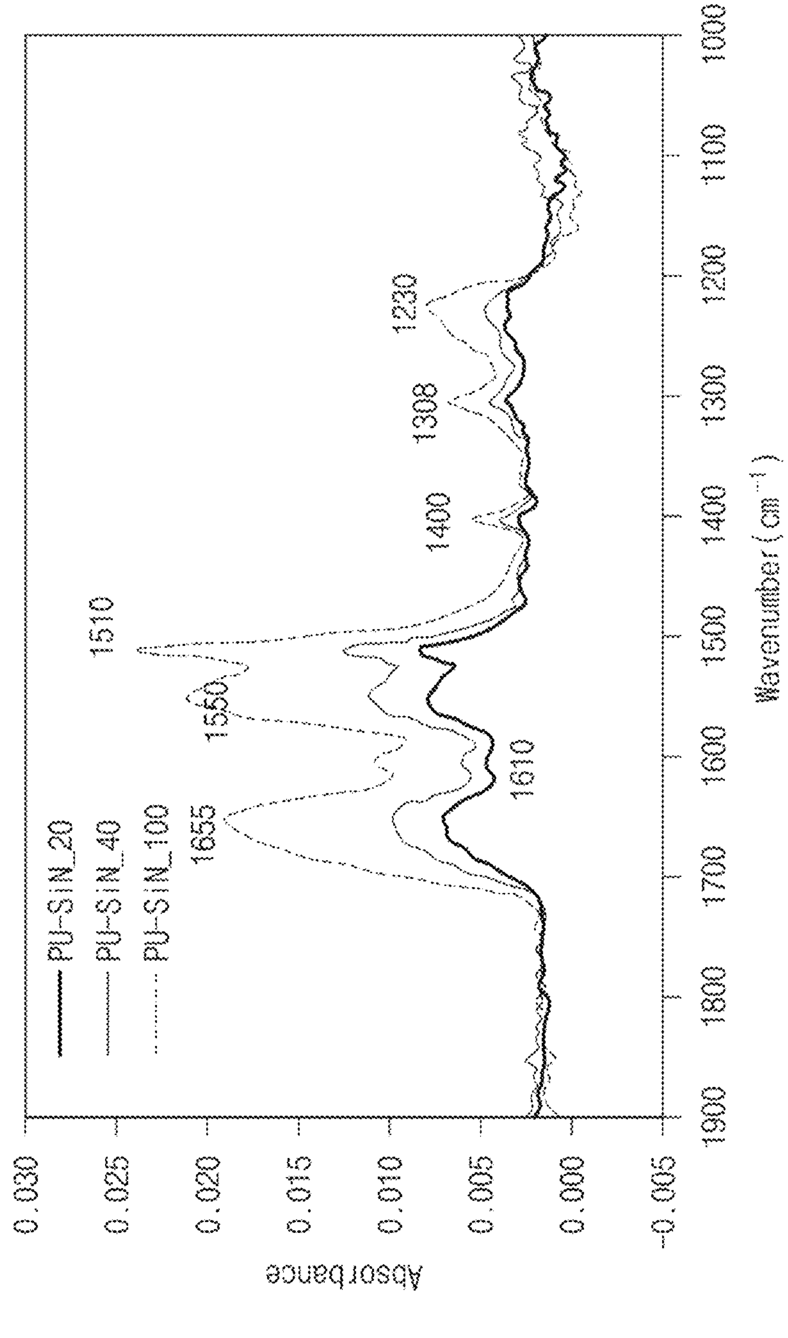
FIGS. 8A to 8C illustrate attenuated total reflection-infrared spectroscopy (ATR-IR) analysis results of the polyurea film deposited on a silicon nitride (SiN) film, a silicon oxide ($SiO_2$) film, and a tungsten (W) film according to MLD.
Figure 8B:
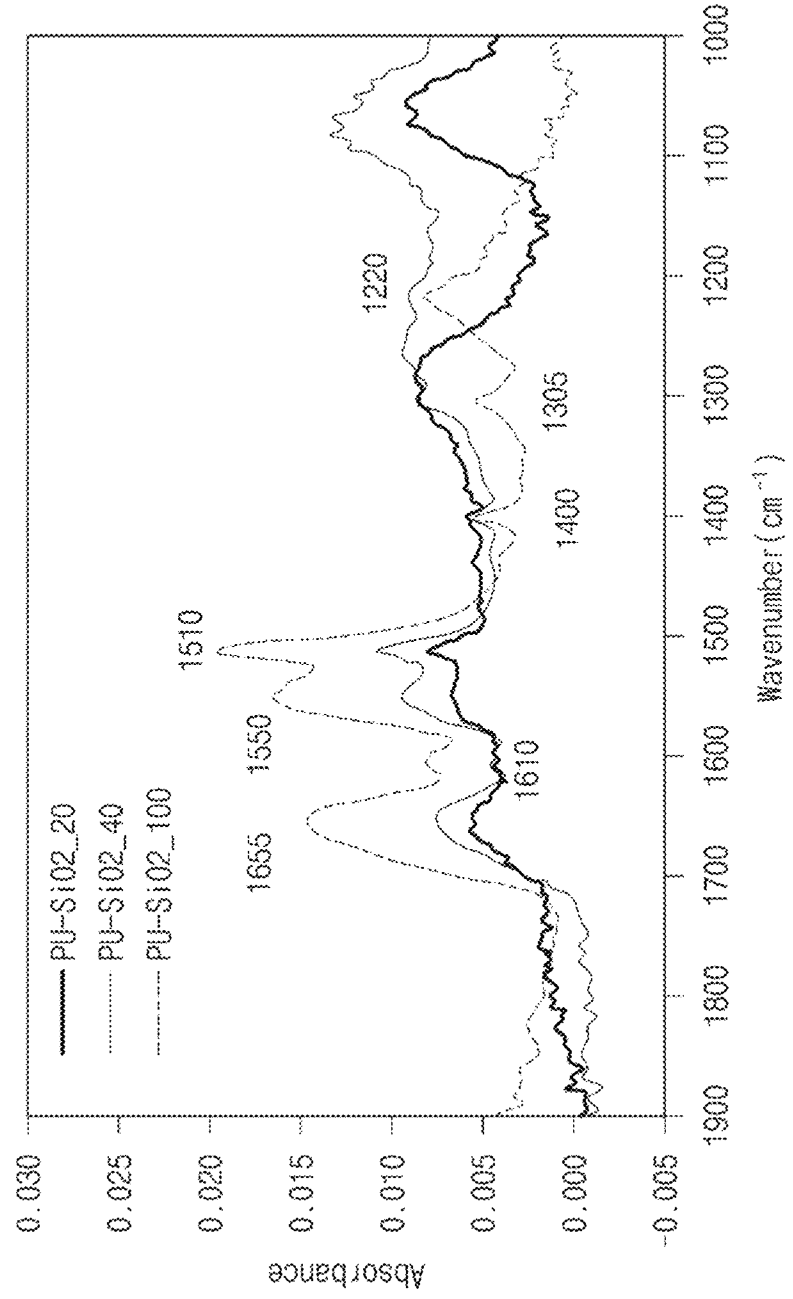
Figure 8C:
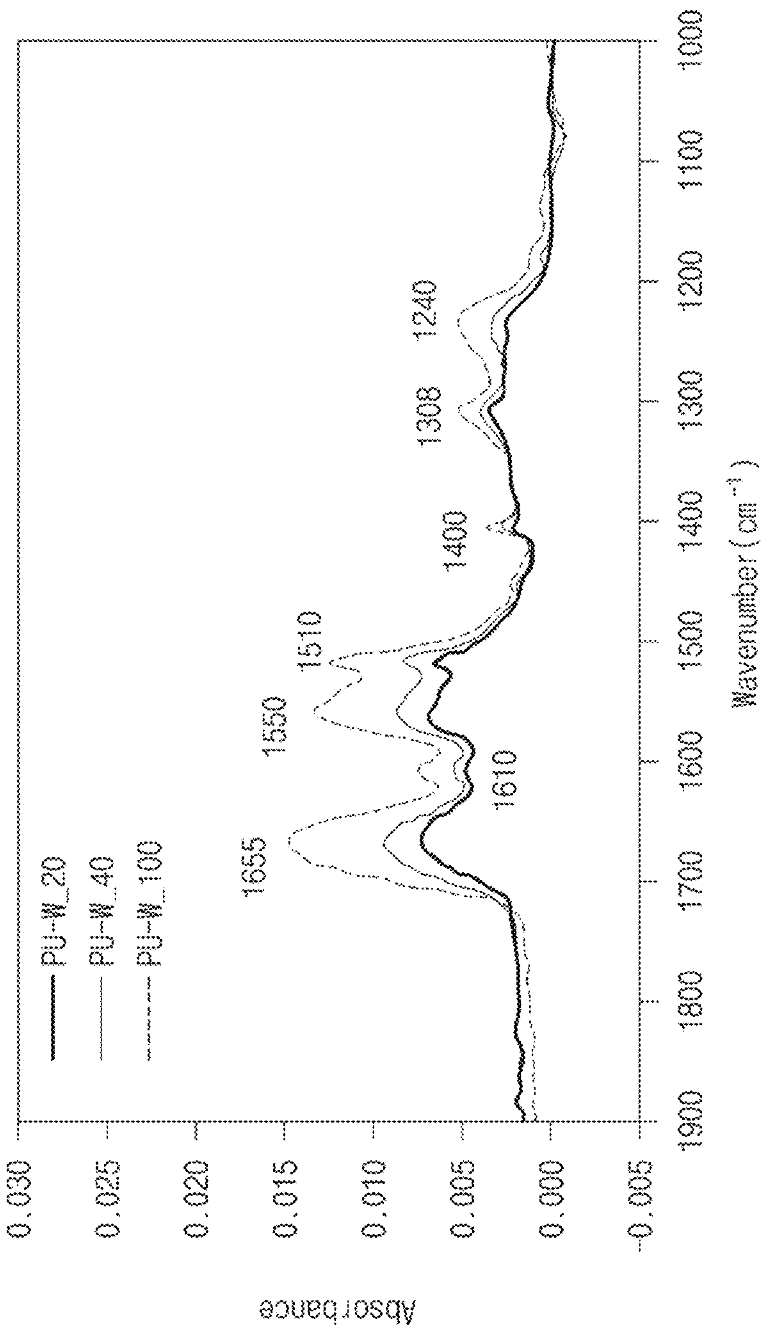

Referring to Table 1 and FIG. 7, it might be identified that, as the MLD period became greater, the thickness of the polyurea film became greater. Therefore, the MLD period was controlled in consideration of the thickness of the film to be actually manufactured, and thus the targeted thickness of the film might be easily implemented. Here, the thickness of the polyurea film had different values according to whether the polyurea film was positioned on the first film or positioned on the second film. The thickness of the polyurea film formed on the SiN film and the $SiO_2$ film that were non-metallic materials was greater than the thickness of the polyurea film formed on the tungsten film that was a metallic material. FIGS. 8A to 8C were attenuated total reflection-infrared spectroscopy (ATR-IR) analysis results for the polyurea film deposited on the silicon nitride SiN film, the silicon oxide ($SiO_2$) film, and the tungsten (W) film in the MLD, and the ATR-IR result reported in the present disclosure were differential spectrum representing differences from a bare wafer. A peak area (1,200 $cm^{-1}$ to 1,750 $cm^{-1}$) in which urea bonding might be identified was expanded.

Experimental Example 2

Before native oxide on the metal tungsten film was removed and the polyurea film was deposited in the MLD, plasma pretreatment with $H_2$ was performed on the SiN film and the $SiO_2$ film that was the first film and the tungsten film that was the second film. Thereafter, the polyurea film was deposited (for 40 periods) in the MLD according to the deposition conditions. A plasma treatment condition with $H_2$ was as follows.

Plasma Treatment Condition

- Plasma power: 50 W, 100 W, 250 W, 500 W, 800 W
- Plasma treatment time: 2 min
- Plasma treatment temperature: 400° C.

Figure 9:
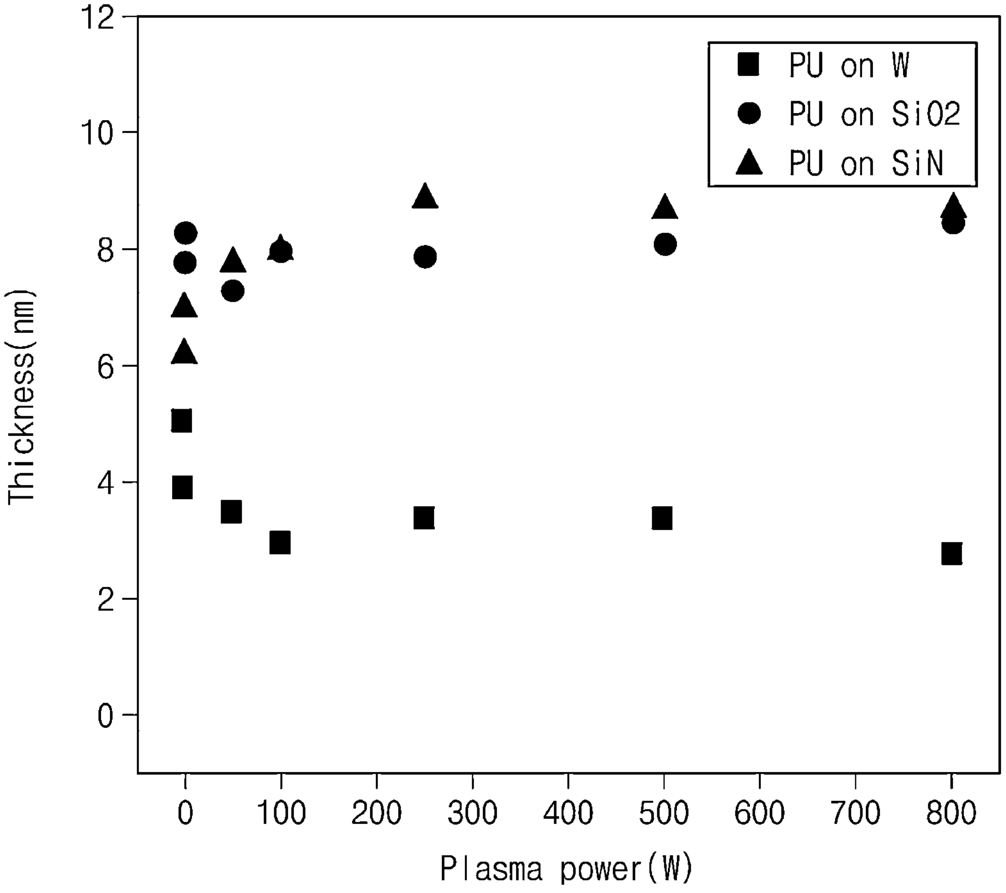
FIG. 9 illustrates a thickness analysis result of the polyurea film according to pretreatment conditions.

Table 2 and FIG. 9 illustrated a thickness analysis result of the polyurea film according to pretreatment conditions.

TABLE 2

| | Thickness of polyurea film (nm) | | |
|---|---|---|---|
| Pretreatment condition | SiN | $SiO_2$ | W |
| No treatment | 6.2 | 7.8 | 3.9 |
| No treatment | 7 | 8.3 | 5.1 |
| 800 W | 8.7 | 8.5 | 2.8 |
| 500 W | 8.7 | 8.1 | 3.4 |
| 250 W | 8.9 | 7.9 | 3.4 |
| 100 W | 8 | 9.1 | 3 |
| 50 W | 7.8 | 7.3 | 3.5 |

Due to $H_2$ plasma treatment for the first film and the second film, impurities on surfaces of the first film and the second film were removed. Thus, the thickness of the polyurea film on the first film increased slightly, the native oxide was reduced, and the thickness of the polyurea film on the tungsten film that was the second film decreased slightly.

Here, even after the $H_2$ plasma treatment, the thickness of the polyurea film represented different values according to the polyurea film was positioned on the first film or positioned on the second film, and the thickness of the polyurea film formed on the SiN film and the $SiO_2$ film that were the non-metallic materials was greater than the thickness of the polyurea film formed on the tungsten film that was the metallic material. Based on these results, a 100 W condition in which saturation occurred in which the thickness no longer increased was selected as the $H_2$ plasma pretreatment condition. Thereafter, the $H_2$ plasma pretreatment was performed under basic conditions of 100 W, 2 min, and 400° C.

Figure 10:
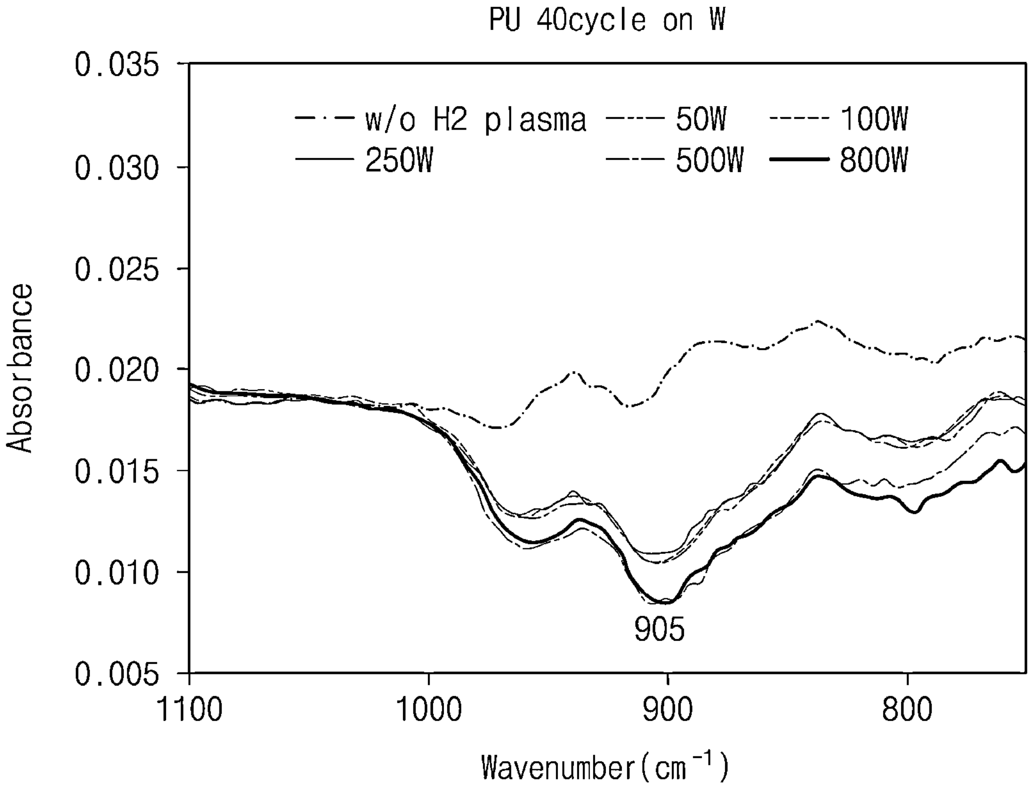
FIG. 10 illustrates an ATR-IR peak change of a tungsten oxide $WO_x$ (905 $cm^{-1}$) on a "W" surface according to a $H_2$ plasma treatment intensity.

FIG. 10 illustrated an ATR-IR peak change of a tungsten oxide $WO_x$ (905 $cm^{-1}$) on a "W" surface according to a $H_2$ plasma treatment intensity.

Referring to FIG. 10, absorbance when the plasma treatment was performed was smaller than absorbance when the plasma treatment was not performed. Thus, it might be identified that naturally occurring oxides (e.g., tungsten oxide) on a tungsten surface were reduced due to the plasma pretreatment.

Experimental Example 3

After the pretreatment of experimental example 2, the MLD of experimental example 1 was performed for 150 periods on the SiN film and $SiO_2$ film that were the first films and on the tungsten film that was the second film, and thus the polyurea film was deposited. Thereafter, the polyurea film was decomposed through annealing under the following conditions in a state in which an annealing gas was input. In the following annealing gas items, a vacuum referred to a case in which the annealing gas was not provided.

Gas Annealing Condition

Figure 11:
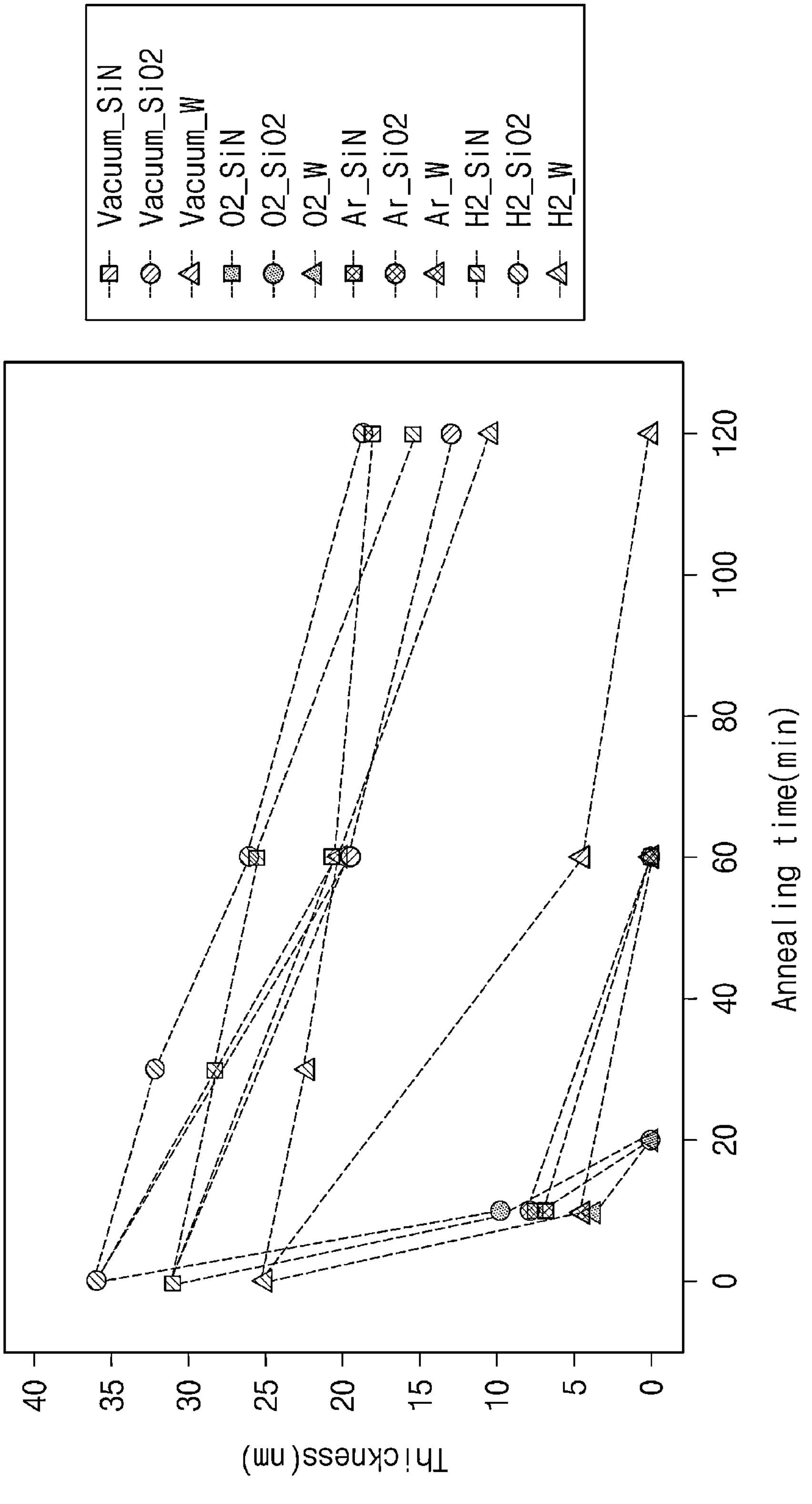
FIG. 11 is a graph depicting a change in a thickness of the polyurea film according to the type of an annealing gas.
Figure 12:
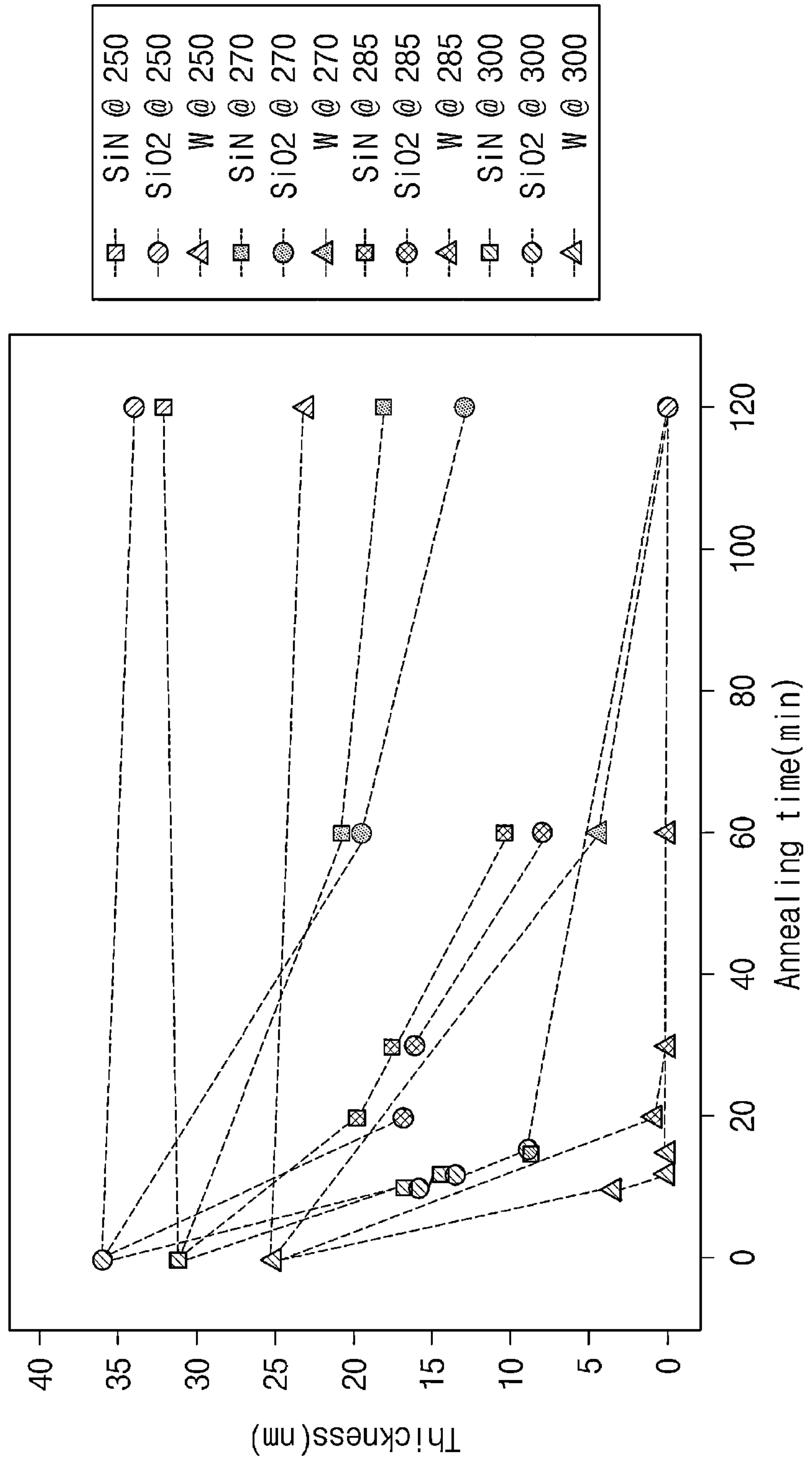
FIG. 12 is a graph depicting a change in a thickness of the polyurea film according to a temperature under vacuum annealing gas conditions.
Figure 13A:
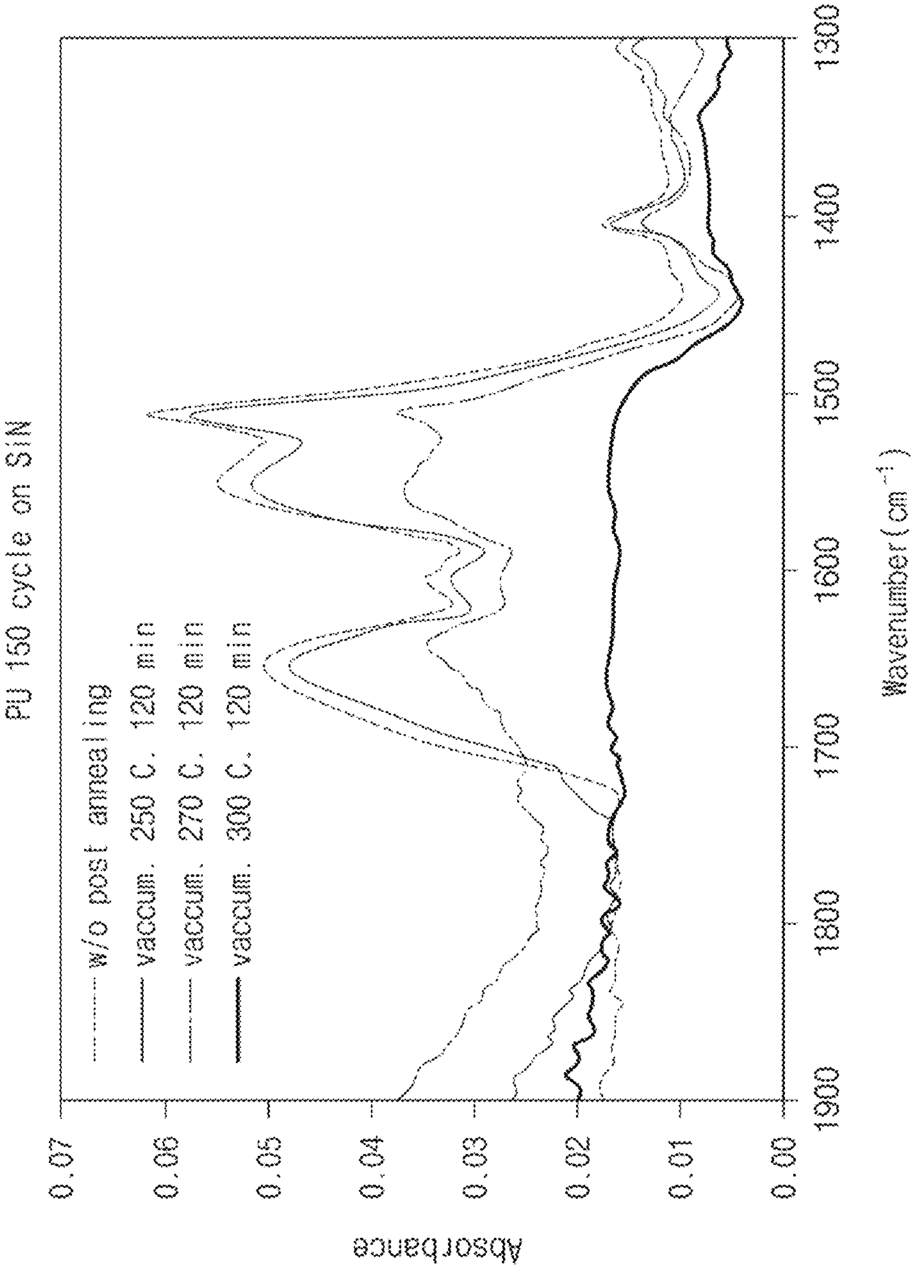
FIGS. 13A to 13C illustrate ATR-IR results obtained by analyzing peaks of the polyurea in the first film and the second film according to a temperature condition under a vacuum state.
Figure 13B:
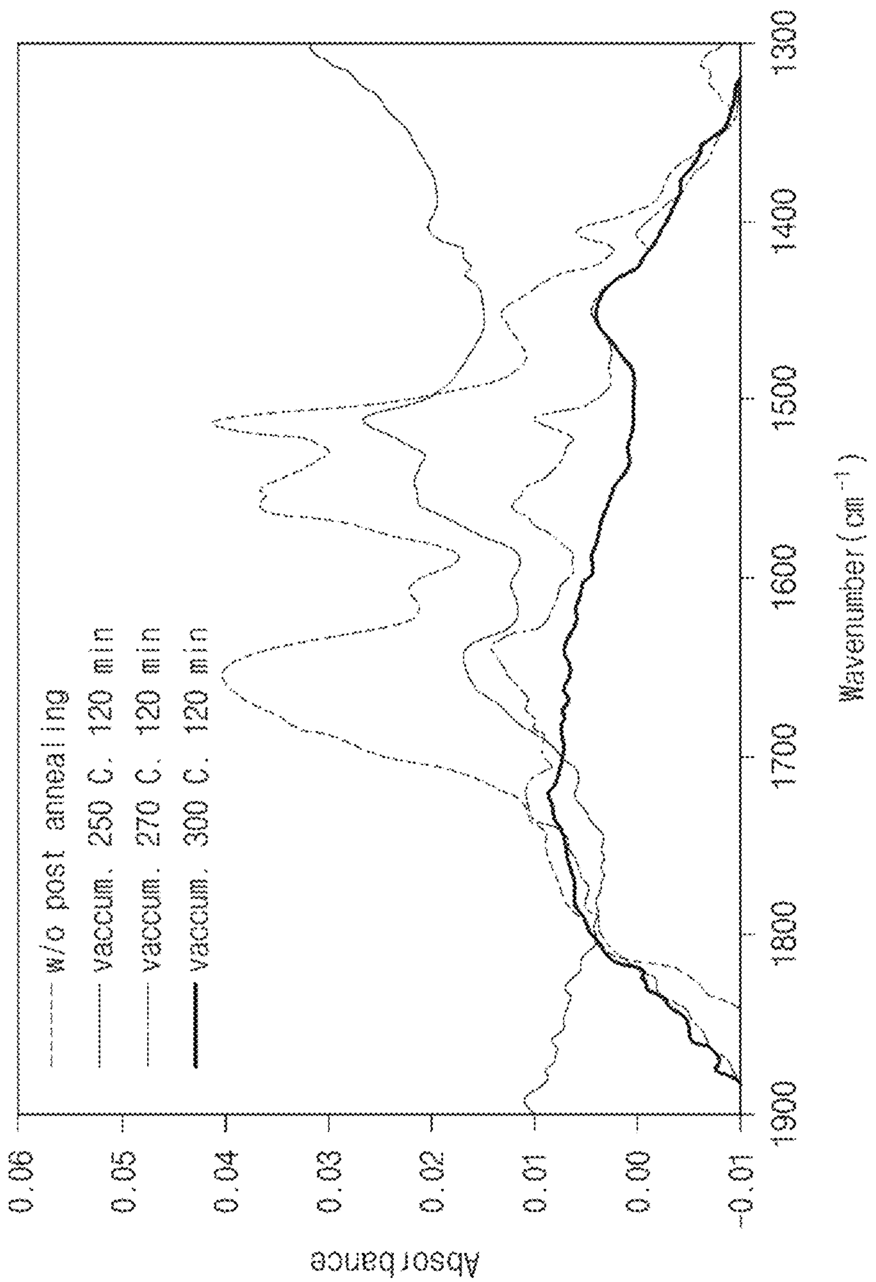
Figure 13C:
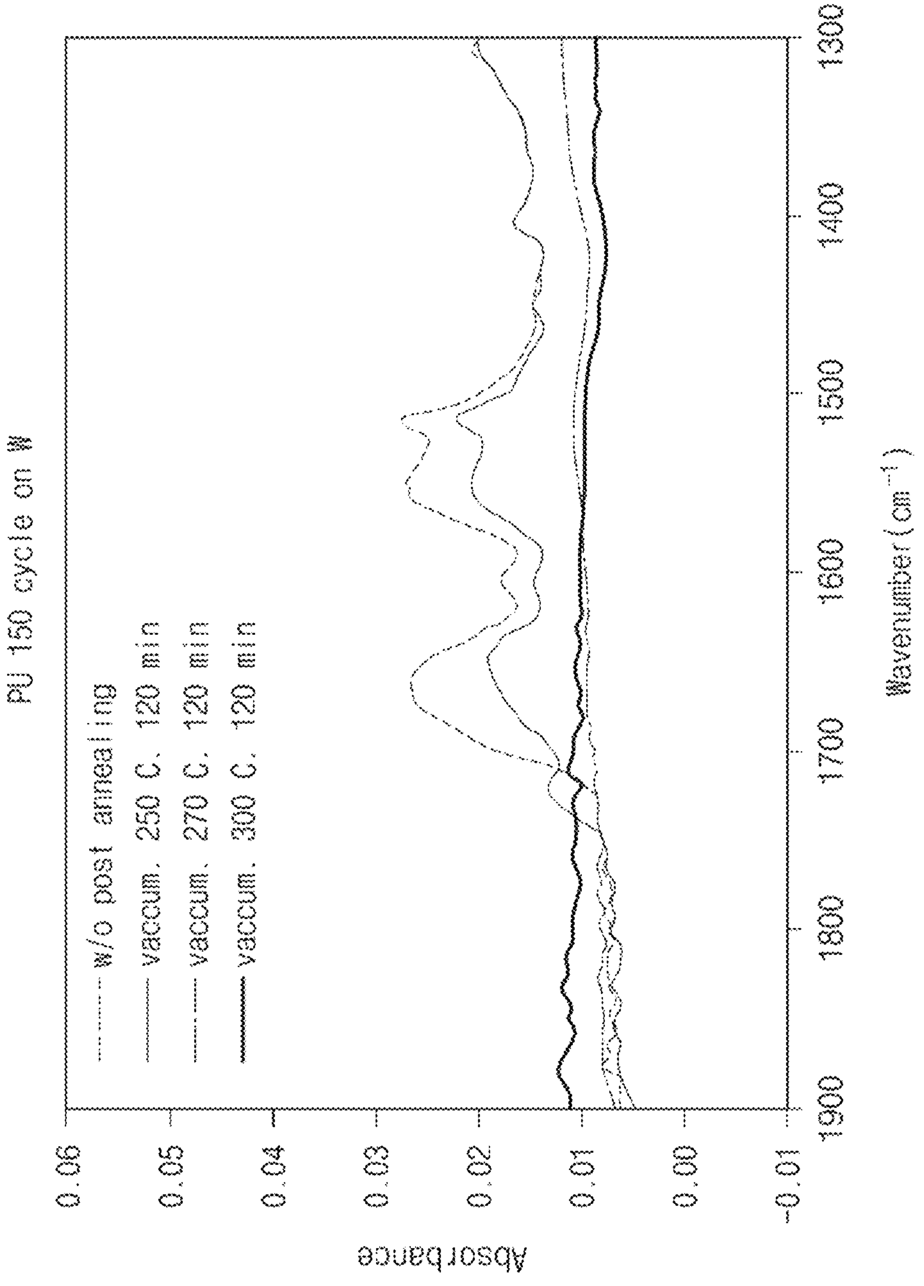

- Annealing gas: Vacuum, $O_2$, Ar, $H_2$
- Annealing temperature: 200° C., 250° C., 270° C., 285° C., 300° C.
- Annealing time: 10 min, 12 min, 15 min, 20 min, 30 min, 60 min, 120 min Table 3 represented a thickness analysis result of the polyurea film according to annealing conditions, FIG. 11 was a graph depicting a change in the thickness of the polyurea film according to the types of annealing gas, and FIG. 12 was a graph depicting a change in the thickness of the polyurea film according to a temperature under a vacuum annealing gas condition. FIGS. 13A to 13C illustrate ATR-IR results obtained by analyzing peaks of the polyurea in the first film and the second film according to a temperature condition under a vacuum state. A peak intensity of the polyurea film decreased according to the temperature under the same time conditions, which indicated decomposition of the polyurea film.

TABLE 3

| Annealing gas | Process temperature (° C.) | Process time (min) | Thickness of polyurea film (nm) SiN | $SiO_2$ | W |
|---|---|---|---|---|---|
| | Before annealing | | 31 ± 3 | 36 ± 3 | 25 ± 1 |
| Vacuum | 250 | 120 | 32.2 | 34.2 | 23.4 |
| | 270 | 60 | 20.6 | 19.5 | 4.4 |
| | | 120 | 18 | 12.9 | 0 |
| | 285 | 20 | 19.7 | 16.9 | 0.8 |
| | | 30 | 17.3 | 16 | 0 |
| | | 60 | 10.3 | 7.9 | 0 |
| | 300 | 10 | 16.8 | 15.9 | 3.4 |
| | | 12 | 14.4 | 13.6 | 0 |
| | | 15 | 8.6 | 8.8 | 0 |
| | | 120 | 0 | 0 | 0 |
| $O_2$ | 250 | 10 | 19.9 | 21.7 | 16.9 |
| | | 20 | 8.4 | 9.3 | 4.6 |
| | | 30 | 0.5 | 2.6 | 1.8 |
| | 270 | 10 | 7.5 | 9.8 | 3.7 |
| | | 20 | 0 | 0 | 0 |
| Ar | 270 | 10 | 6.7 | 7.9 | 4.5 |
| | | 60 | 0 | 0 | 0 |
| $H_2$ | 270 | 30 | 28.3 | 32.2 | 22.4 |
| | | 60 | 25.4 | 26.1 | 20.3 |
| | | 120 | 15.4 | 18.8 | 10.4 |

Referring to Table 3, FIG. 11, FIG. 12, and FIGS. 13A to 13C, when hydrogen was used as the annealing gas, there was a difference between the thicknesses of the first film (SiN and $SiO_2$) and the second film (W), but the difference was not large. Further, even when the annealing time was relatively long, for example, 120 minutes, the thickness of the polyurea film on the second film did not become 0. When hydrogen and argon were used as the annealing gas, the thicknesses of the polyurea film on both the first film and the second film significantly decreased in a relatively short period of time, and a difference between the thicknesses of the polyurea film on the first film and the second film was also not large. In contrast, when the annealing was performed in a vacuum state, the difference between the thicknesses of the polyurea film on the first film and the second film was significant, and when the thickness of the polyurea film on the second film was 0, the thickness of the first film might be maintained at a significant level. Based on these results, it might be identified that the polyurea film on the second film among the polyurea film on the first film and the second film might be selectively removed through the annealing under a vacuum state. In addition, when the annealing was performed while the annealing temperature was changed between 250° C. and 300° C., in the case of 250° C., the polyurea film on the first film and the second film was maintained at a significant overall thickness during the annealing time of about 120 minutes. Thus, it might be identified that the degree of etching due to the decomposition of the polyurea film was not large. In the case of 300° C., the thicknesses on both the first film and the second film were overall significantly reduced during the annealing time of merely about 30 minutes, and as a result, the films were completely removed. In contrast, in the case of 270° C. or 285° C., the thicknesses of the polyurea film on the first film and the second film were different from each other during the annealing time of 20 minutes to 120 minutes, and thus it might be identified that the polyurea film on the first film and the second film might be selectively etched.

Here, when argon or oxygen was used as the annealing gas, the polyurea film on the first film and the second film was removed in a relatively short period of time, and thus it might be identified that this treatment might be used when the entire polyurea film was non-selectively removed regardless of the type of films.

Figure 14A:
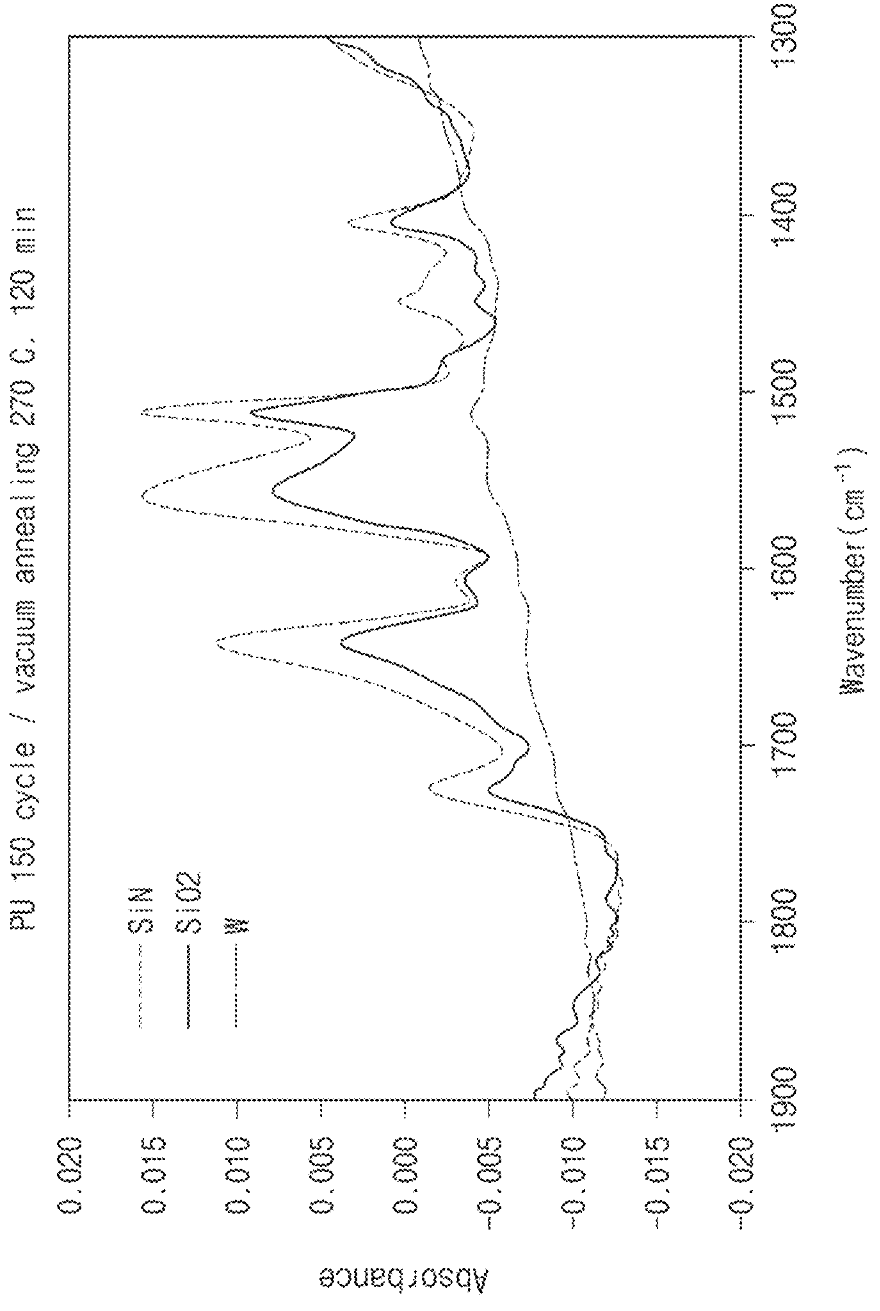
FIG. 14A to 14C illustrate results in Table 3.
Figure 14B:
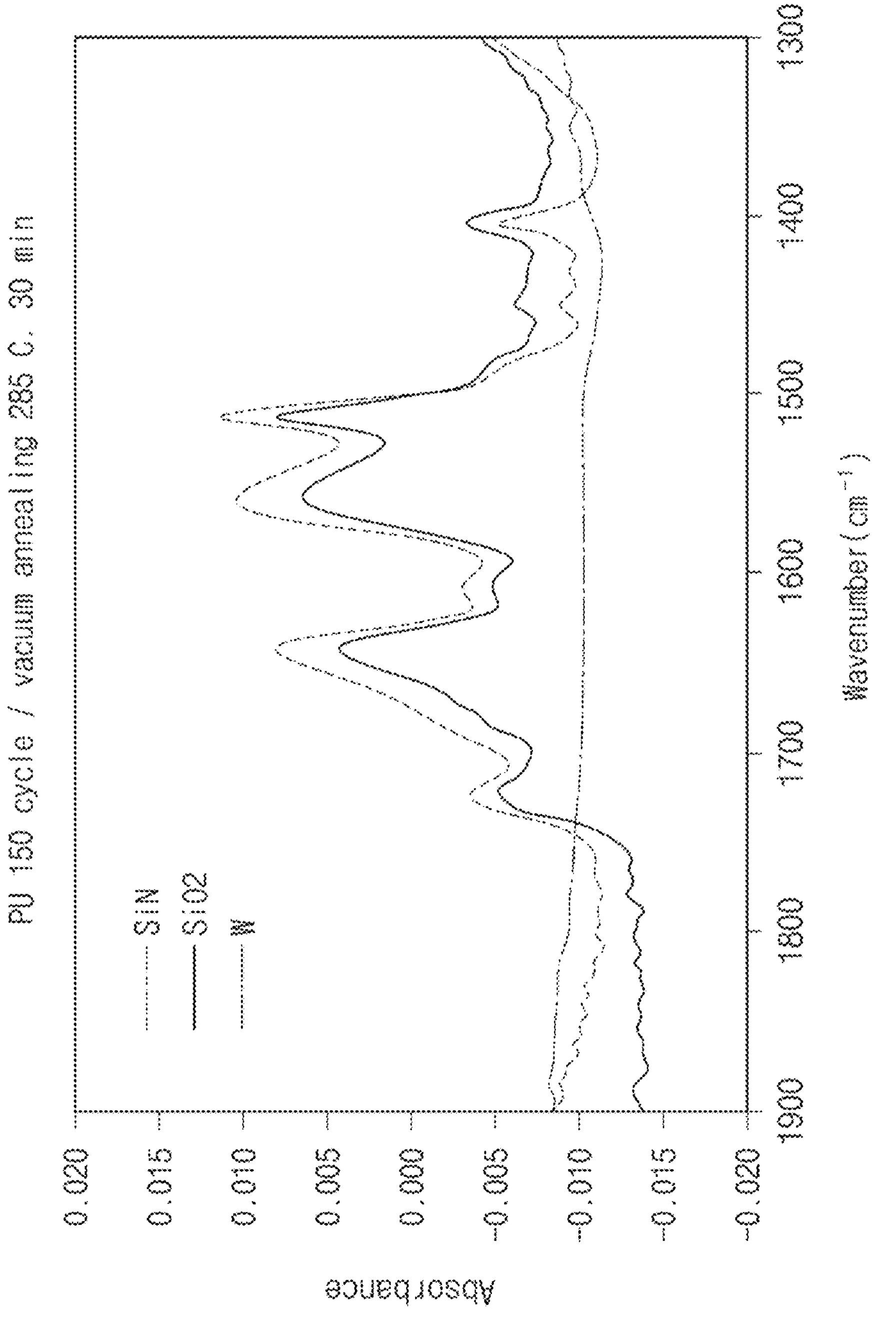
Figure 14C:
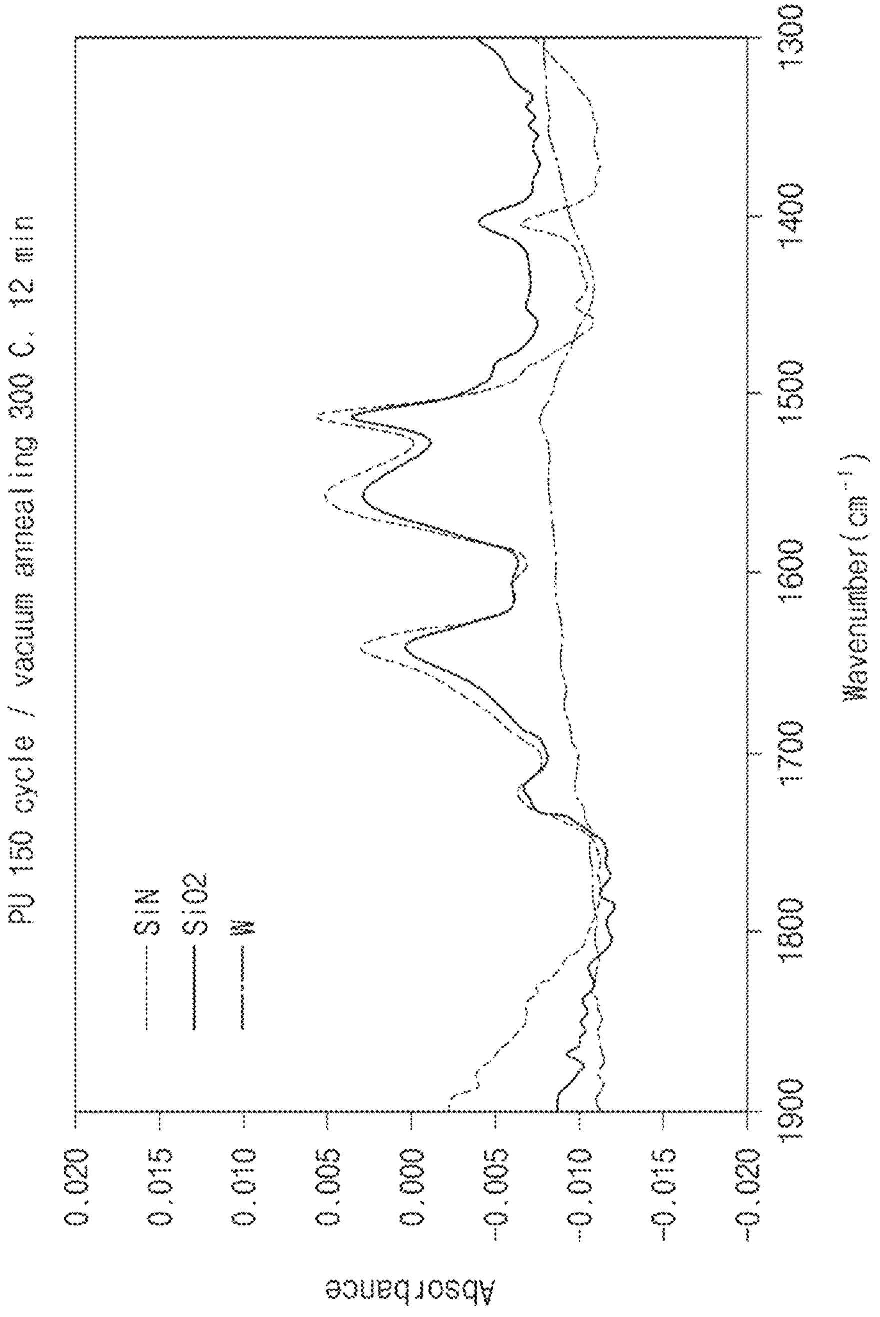

FIGS. 14A to 14C illustrated a result of Table 3 and corresponded to ATR-IR analysis results on the first film and the second film in a condition in which the thickness of the polyurea film on the tungsten film that was the second film was 0 Å according to the process temperature of the vacuum annealing. It might be identified that, after the vacuum annealing, the polyurea film only on the tungsten film was removed, and the polyurea film remained on the SiN film and the $SiO_2$ film corresponding to the first film.

Experimental Example 4

After the pretreatment of experimental example 2 was performed on the SiN film and the $SiO_2$ film that were the first film and the tungsten film that was the second film, the polyurea film was deposited for 150 periods under the MLD condition of the experimental example 1. Thereafter, a substrate on which the polyurea film was formed was plasma-treated with $H_2$ under the following condition, thereby decomposing the polyurea film.

Plasma Treatment Condition

Plasma power: 50 W
Plasma treatment time: 30 sec, 60 sec, 90 sec
Plasma treatment temperature: 200° C.

Figure 15:
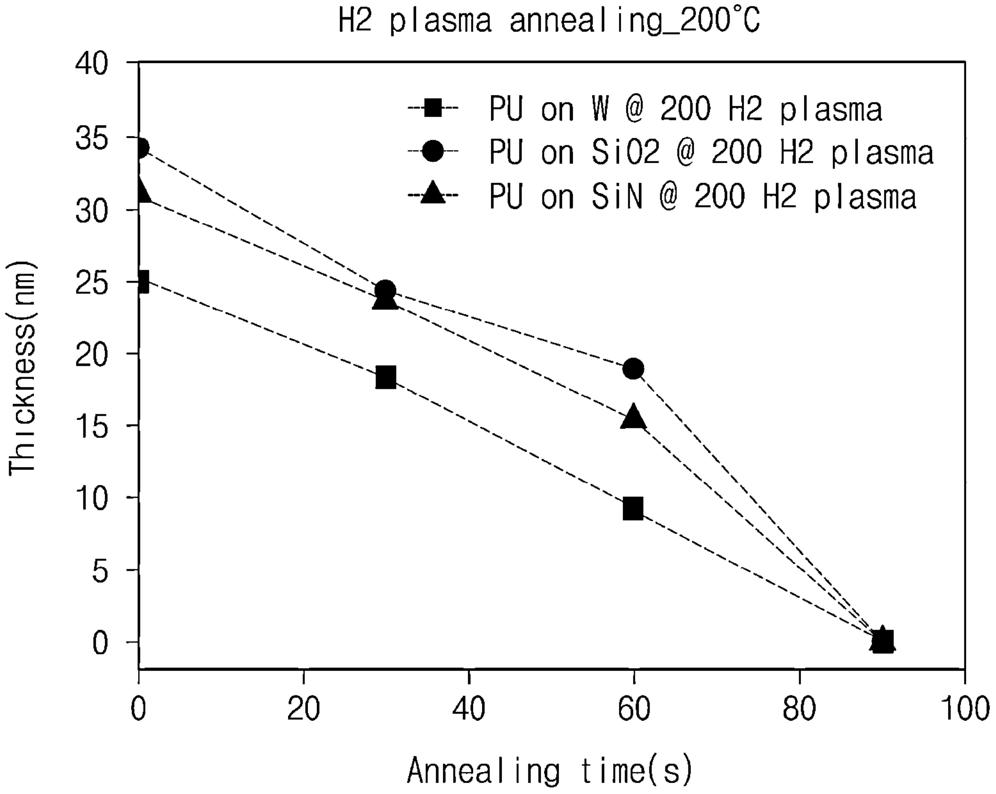
FIG. 15 illustrates a thickness analysis result of the polyurea film according to $H_2$ plasma treatment conditions.
Figure 16A:
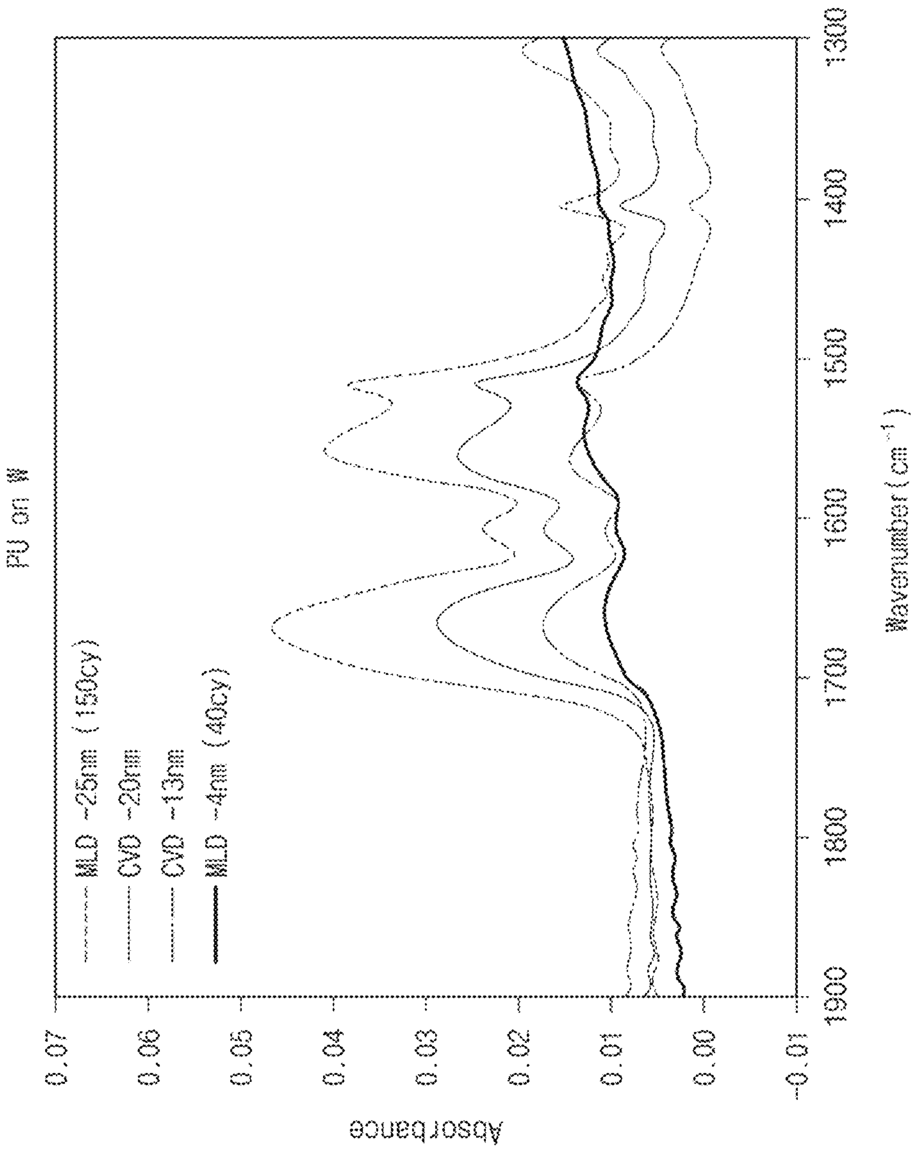
FIGS. 16A to 16C are graphs depicting changes in the thickness of the polyurea film according to plasma treatment conditions.
Figure 16B:
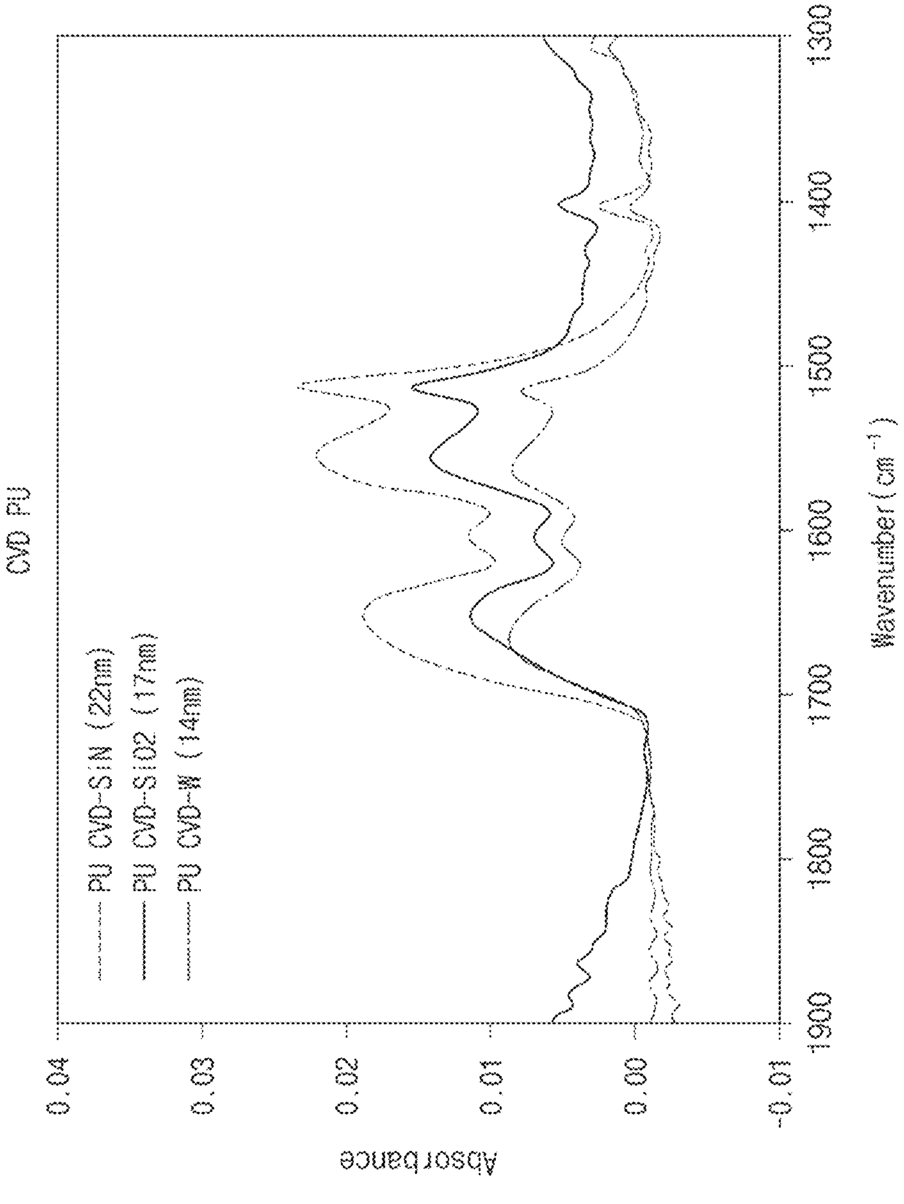
Figure 16C:
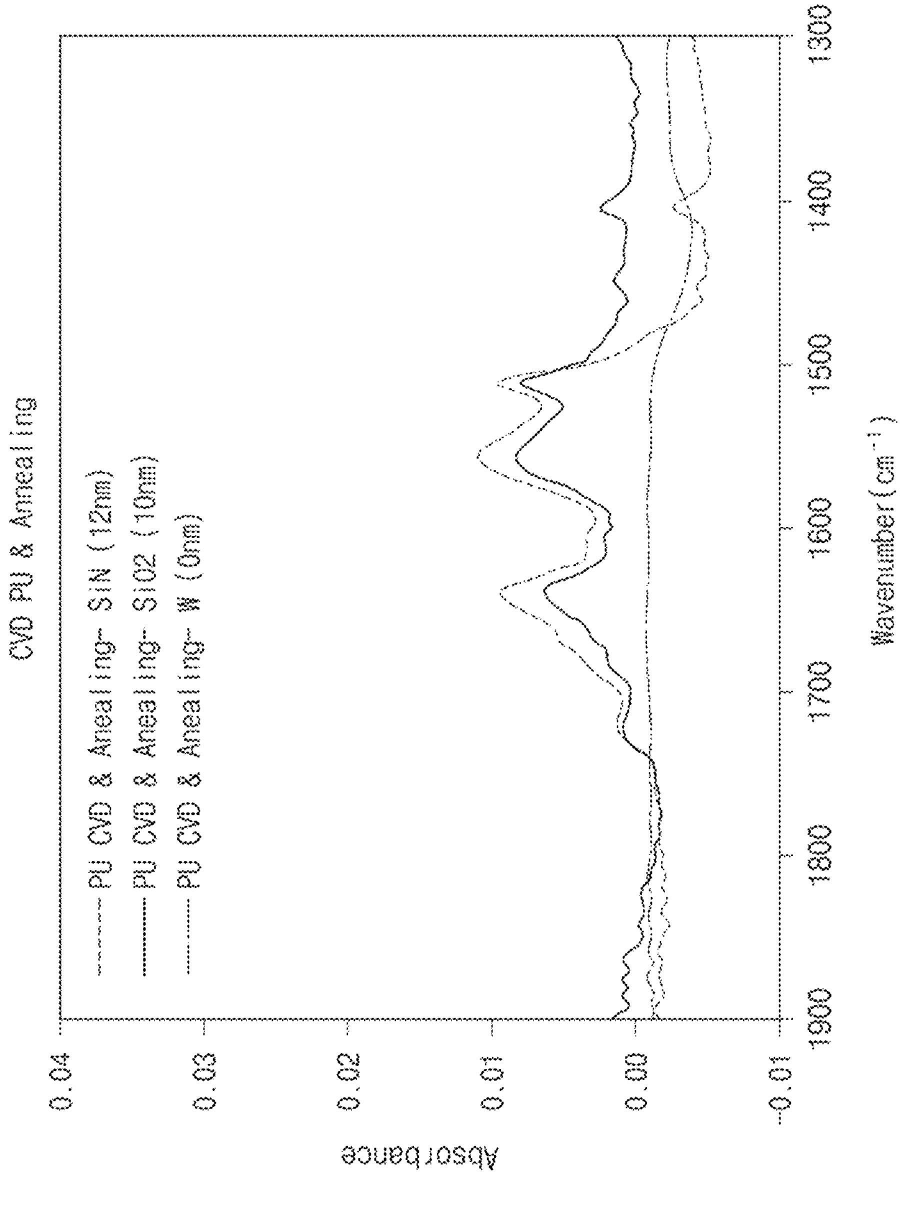

Tables 4 and FIG. 15 illustrated a thickness analysis result of the polyurea film according to $H_2$ plasma treatment conditions. FIGS. 16A to 16C are graphs depicting changes in the thickness of the polyurea film according to plasma treatment conditions.

TABLE 4

| Process time | Thickness of polyurea film (nm) | | |
|---|---|---|---|
| (sec) | SiN | $SiO_2$ | W |
| 0 | 31 ± 3 | 36 ± 3 | 25 ± 1 |
| 30 | 23.6 | 24.2 | 18.3 |
| 60 | 15.3 | 18.9 | 9.2 |
| 90 | 0 | 0 | 0 |

Referring to Table 4, FIG. 15, and FIGS. 16A to 16C, when the polyurea film on the first film and the second film was removed, when the polyurea film was etched through the plasma treatment, selectivity between the first film and the second film was not large. When plasma etching was performed, the polyurea film on the first film and the second film was quickly cracked regardless of a position thereof as compared to thermal annealing, and thus both the first film and the second film were removed within a few seconds. Accordingly, it was difficult to selectively remove the polyurea film on the first film and the second film through the plasma treatment.

Experimental Example 5

After the pretreatment of experimental example 2, the MLD of experimental example 1 was performed for 10 periods on the SiN film and $SiO_2$ film that were the first films and on the tungsten film that was the second film, and thus the polyurea film was deposited. Thereafter, the polyurea film was decomposed through the vacuum annealing under the following conditions.

Vacuum Annealing Condition

Vacuum annealing temperature: 285° C.
Vacuum annealing time: 5 sec, 10 sec, 15 sec, 20 sec Table 5 represented a result of analyzing the thicknesses of the polyurea film on the first film and the second film using ellipsometry.

TABLE 5

| MLD | Annealing | Annealing Temperature | Process Time | Thickness of polyurea film (nm) | | |
|---|---|---|---|---|---|---|
| Period | Gas | (° C.) | (min) | SiN | $SiO_2$ | W |
| 10 | Polyurea removal not performed | | | 4 | 4 | 0.8 |
| | Vacuum | 285 | 5 | 3.8 | 3.5 | 0.6 |
| | | | 10 | 3.7 | 3.6 | 0.4 |
| | | | 15 | 3.2 | 3 | 0 |
| | | | 20 | 3 | 2.6 | 0 |

Referring to Table 5, after the MLD was performed for 10 periods, the polyurea film formed on the second film was selectively removed through the vacuum annealing, and the polyurea film having a thickness of about 3 nm selectively remained on the first film. Here, even when a very thin polyurea film on a scale of several nanometers was formed on the first film and the second film, selective polyurea film removal was possible.

Experimental Example 6

After the pretreatment of experimental example 2 was performed on the SiN film and $SiO_2$ film that were the first films and the tungsten film that was the second film, two types of diamine and diisocyanate precursors (e.g., ethylenediamine and 1,4-phenylene diisocyanate) as a source were injected simultaneously to deposit the polyurea film and thus the polyurea film was deposited in a chemical vapor deposition (CVD) method. A cyclic CVD process was used to ensure uniformity of the polyurea film, and CVD conditions were as follows.

CVD Condition

Process temperature 50° C.
1,4-phenylene diisocyanate canister heating temperature: 60° C.
Canister heating temperature of ethylenediamine: Room temperature
Source carrier argon flow rate: 400 sccm
Pure argon flow rate: 1300 sccm
Operating pressure: >10 Torr
Operating period: The one period included ① diisocyanate provision—② diisocyanate purge—③ diamine provision—④ diamine purge and was performed for the following time.
① Provision time of 1,4-phenylene diisocyanate: 100 sec
② Purge time: 50 sec
③ Provision time of ethylenediamine: 200 sec
④ Purge time: 300 sec
CVD period: 30 period Experimental Example 7

After the pretreatment of experimental example 2 was performed on the SiN film and the $SiO_2$ film that were the first film and the tungsten film that was the second film, the deposited polyurea film was vacuum-annealed under the following conditions. A subsequent vacuum annealing process was performed as described below.

Vacuum Annealing Condition

Vacuum annealing temperature: 285° C.

Vacuum annealing time: 30 min

Table 6 represented a result obtained by analyzing the thickness of the polyurea film after the polyurea film obtained through experimental example 6 was vacuum-annealed.

TABLE 6

| | Thickness of polyurea film (nm) | | |
|---|---|---|---|
| Condition | SiN | $SiO_2$ | W |
| CVD | 22 | 17 | 14 |
| After annealing | 12 | 10 | 0 |

FIG. 16A was a graph depicting a result obtained by comparing ATR-IR between the polyurea film deposited on the tungsten film that was the second film in the cyclic CVD manner and the polyurea film deposited in the MLD manner of experimental example 1, FIG. 16B was a graph depicting the results of ATR-IR of the polyurea film when the polyurea film was deposited on the first film and the second film for 30 periods in the cyclic CVD method of experimental example 6, and FIG. 16C was a graph depicting an ATR-IR analysis result after the polyurea film deposited in the cyclic CVD manner was decomposed through the annealing process of experimental example 8. Referring to Table 6 and FIGS. 16A to 16C, it was identified that the polyurea film deposited in the cyclic CVD manner also had the same IR peak as that of the polyurea film deposited in the MLD manner of experimental example 1, and it was identified that the polyurea film was made by a chemical bonding having the same polymerization form. Further, when the vacuum annealing process of experimental example 7 was performed on the polyurea film deposited in the CVD manner, the polyurea film on the tungsten film that was the second film was selectively removed first. This corresponded to the same result as that of the polyurea film deposited in the MLD manner.

Here, the forming of the polyurea film using the CVD manner was performed for a much shorter time that that of the MLD manner, and thus when the polyurea film was formed, a process time might be shortened.

Experimental Example 8

The annealing process was performed under the following conditions after the MLD deposition to identify whether to additionally decrease the process time for the MLD conditions of experimental example 1 on the SiN film and the $SiO_2$ film that were the first film and the tungsten film that was the second film. The $H_2$ plasma treatment of experimental example 2 was not performed before the MLD deposition. The MLD and the annealing, which would be described below, were performed under the following process conditions.

MLD and Annealing Condition

Process temperature: 30° C.

1,4-phenylene diisocyanate canister heating temperature: 60° C.

Ethylenediamine canister heating temperature: Room temperature

Source carrier argon flow rate: 400 sccm

Pure argon flow rate: 1300 sccm

Operating pressure: 0.8 Torr

Operating period: The one period included ① diisocyanate provision—② diisocyanate purge—③ diamine provision—④ diamine purge and was performed for the following time.

① Provision time of 1,4-phenylene diisocyanate: 50 sec

② Purge time: 100 sec

③ Provision time of ethylenediamine: 20 sec

④ Purge time: 100 sec

MLD period: 40 period

Annealing gas: Vacuum

Annealing temperature: 285° C.

Annealing time: 30 min

Table 7 was a result obtained by analyzing the thickness of the polyurea film after the MLD process and the thickness of the polyurea film after the annealing according to the present experimental example.

TABLE 7

| | Thickness of polyurea film (nm) | | |
|---|---|---|---|
| Condition | SiN | $SiO_2$ | W |
| MLD | 25 ± 1 | 29 ± 1 | 20 ± 1 |
| After annealing | 16 ± 1 | 14 ± 2 | 0 |

Figure 17:
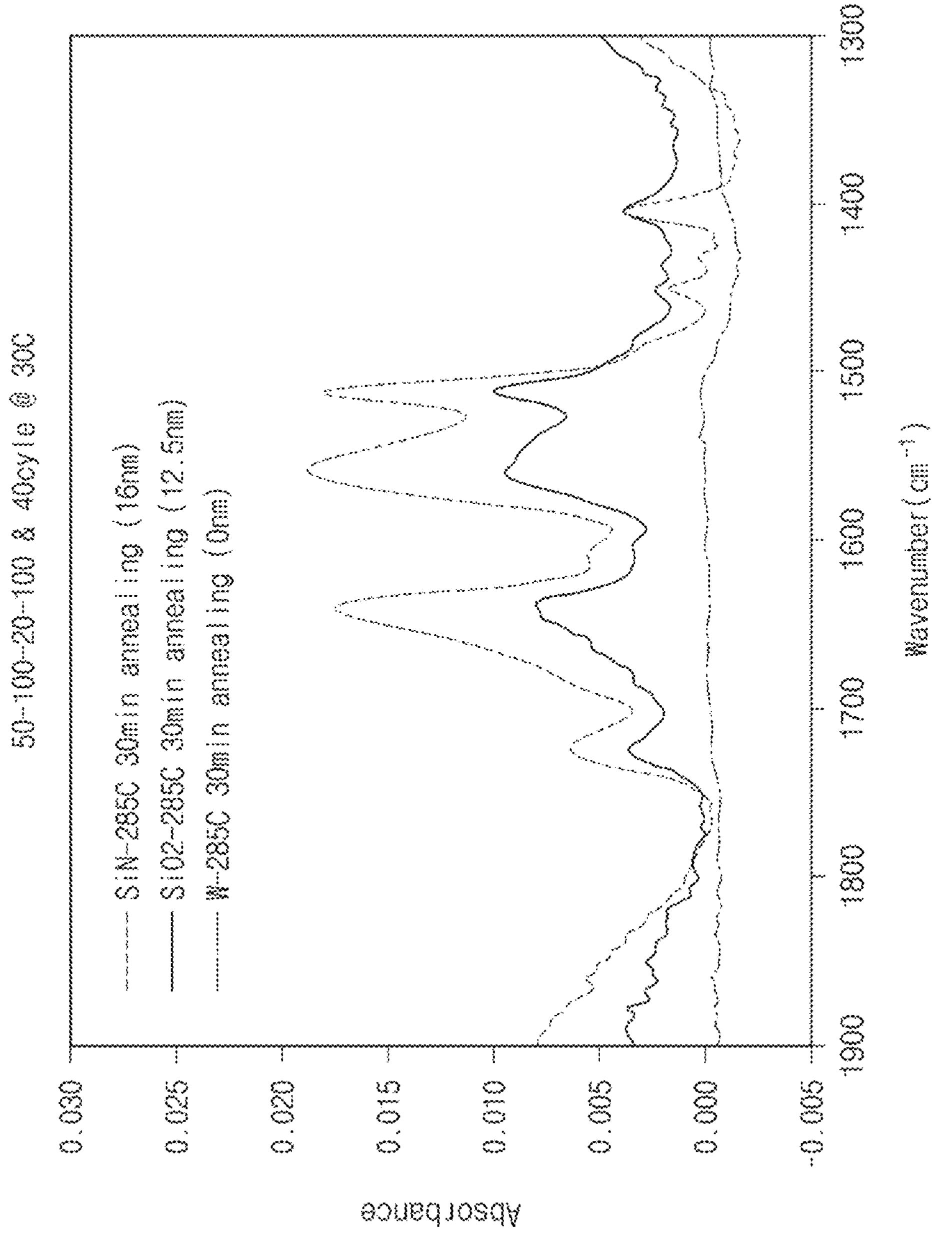
FIG. 17 illustrates an ATR-IR result obtained by analyzing the polyurea film after the polyurea film is annealed after an MLD process.

FIG. 17 illustrated an ATR-IR result obtained by analyzing the polyurea film after the polyurea film was annealed after an MLD process. Referring to Table 7 and FIG. 17, in the case of the present experimental example, the polyurea film was deposited using the MLD manner for a much shorter time than that of experimental example 1. However, despite this short time for depositing polyurea film, it was identified that the polyurea film was selectively removed only from the second film, that is, the tungsten film.

Experimental Example 9

Evaluation was performed while the diisocyanate material among the two precursors used for depositing the polyurea film was changed. The polyurea film was deposited on the SiN film and the $SiO_2$ film that were the first film and the tungsten film that was the second film in the MLD manner and then was annealed. MLD deposition and annealing conditions were as follows.

MLD and Annealing Condition

MLD process temperature: 30° C.

1,4-diisocyanatohexane canister heating temperature: 100° C.

Canister heating temperature of ethylenediamine: Room temperature

Operating period: The one period included ① diisocyanate provision—② diisocyanate purge—③ diamine provision—④ diamine purge and was performed for the following time.

① Provision time of 1,4-phenylene diisocyanate: 50 sec
② Purge time: 100 sec
③ Provision time of ethylenediamine: 20 sec
④ Purge time: 100 sec MLD period: 100 period
Annealing gas: Vacuum
Annealing temperature: 270° C.
Annealing time: 20 min Table 8 was a result obtained by analyzing the thickness of the polyurea film after the polyurea film was deposited and annealed using the MLD in the present experimental example.

TABLE 8

| | Thickness of polyurea film (nm) | | |
|---|---|---|---|
| Condition | SiN | $SiO_2$ | W |
| MLD 100 period | 25 | 26 | 18 |
| After annealing | 13 | 10 | 0 |

Figure 18:
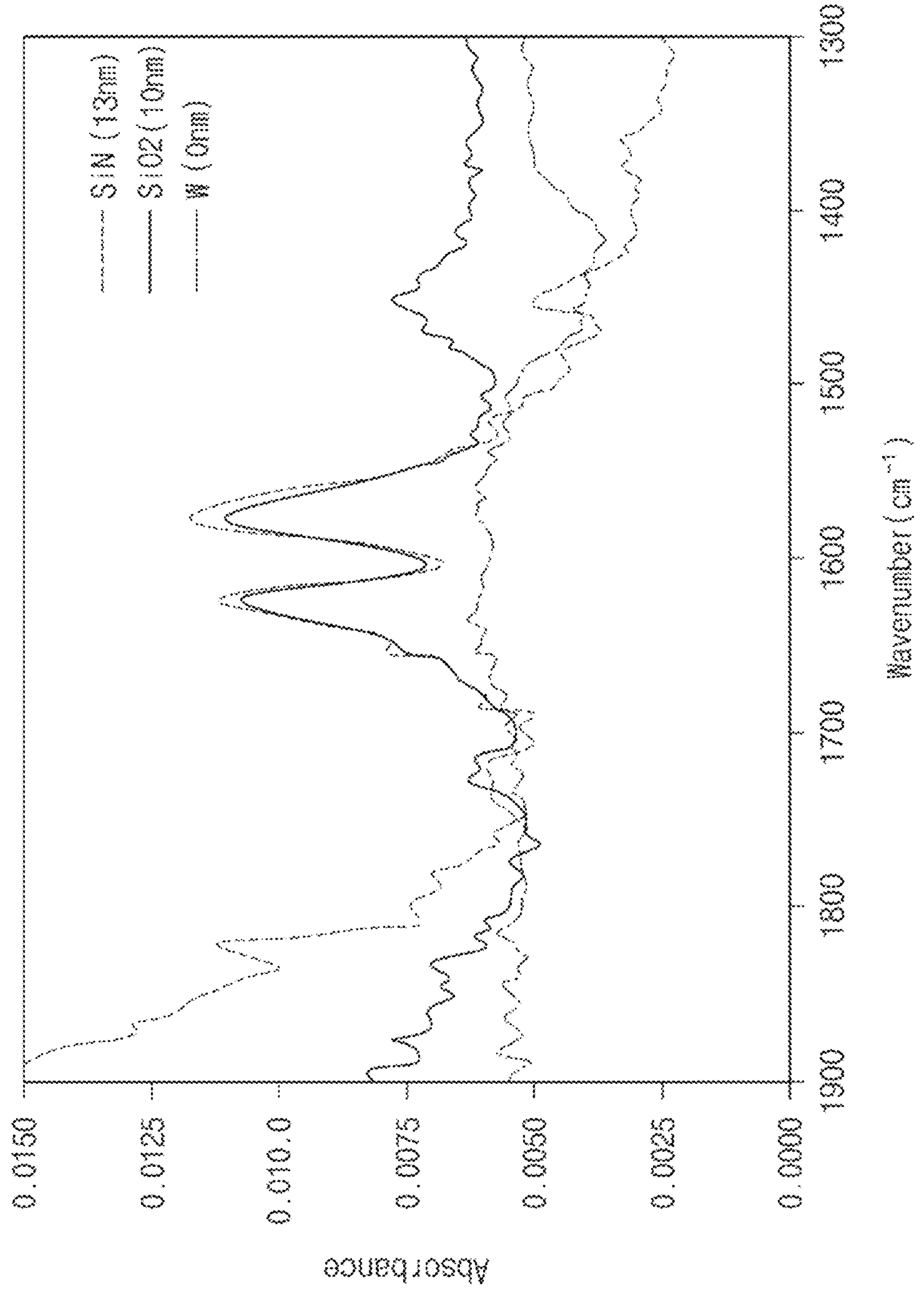
FIG. 18 illustrates a result of the ATR-IR analysis of the polyurea film annealed after MLD deposition according to the present experimental example.

FIG. 18 illustrated a result of the ATR-IR analysis of the polyurea film annealed after MLD deposition according to the present experimental example. Referring to Table 8 and FIG. 18, even when a different type of diisocyanate material from that according to the above-described embodiments was used, the polyurea film may be selectively removed.

Experimental Example 10

A film made of silicon-based compounds (e.g., SiN, $SiO_2$, Si, SiOC, and porous SiOC), metal nitrides (e.g., TiN and AlN), metal oxides (e.g., $AlO_x$, $HfO_x$, and $WO_x$), and amorphous carbon was formed as the first film, and a film made of tungsten, ruthenium, copper, and cobalt was formed as the second film. The polyurea film was deposited and then annealed on the first film and the second film in the MLD according to experimental example 8. In the following tables and drawings, the porous SiOC was referred to as LK and the amorphous carbon was referred to as ACL.

Table 9 was a result obtained by analyzing the thickness of the polyurea film after the polyurea film was deposited and annealed.

TABLE 9

| | | Thickness of polyurea film (nm) | |
|---|---|---|---|
| | | MLD | After annealing |
| First film | SiN | 25 ± 1 | 16 ± 1 |
| | $SiO_2$ | 29 ± 1 | 14 ± 1 |
| | Si | 20 | 13 |
| | SiOC | 28 | 17 |
| | LK | 26 | 18 |
| | TiN | 26 | 6 |
| | AlN | 25 | 20 |
| | $AlO_x$ | 32 | 20 |
| | $HfO_x$ | 29 | 19 |
| | $WO_x$ | 27 | 18 |
| | ACL | 25 | 13 |
| Second film | W | 20 ± 1 | 0 |
| | Ru | 20 | 0 |
| | Mo | 21 | 0 |
| | Cu | 20 | 0 |
| | Co | 19 | 0 |

Figure 19:
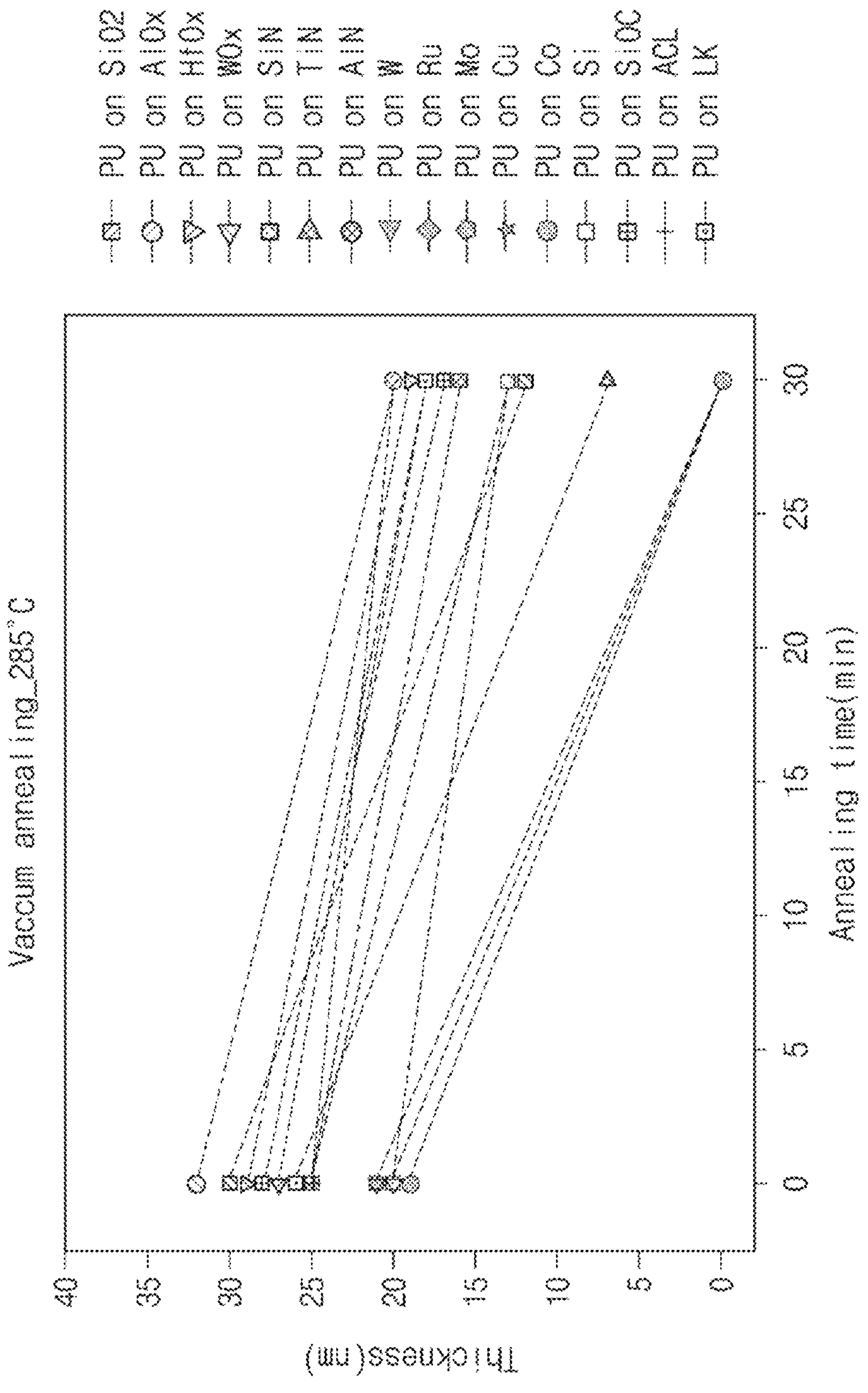
FIG. 19 is a graph illustrating a change in a thickness after the polyurea film is deposited and then annealed according to the present experimental example.
Figure 20A:
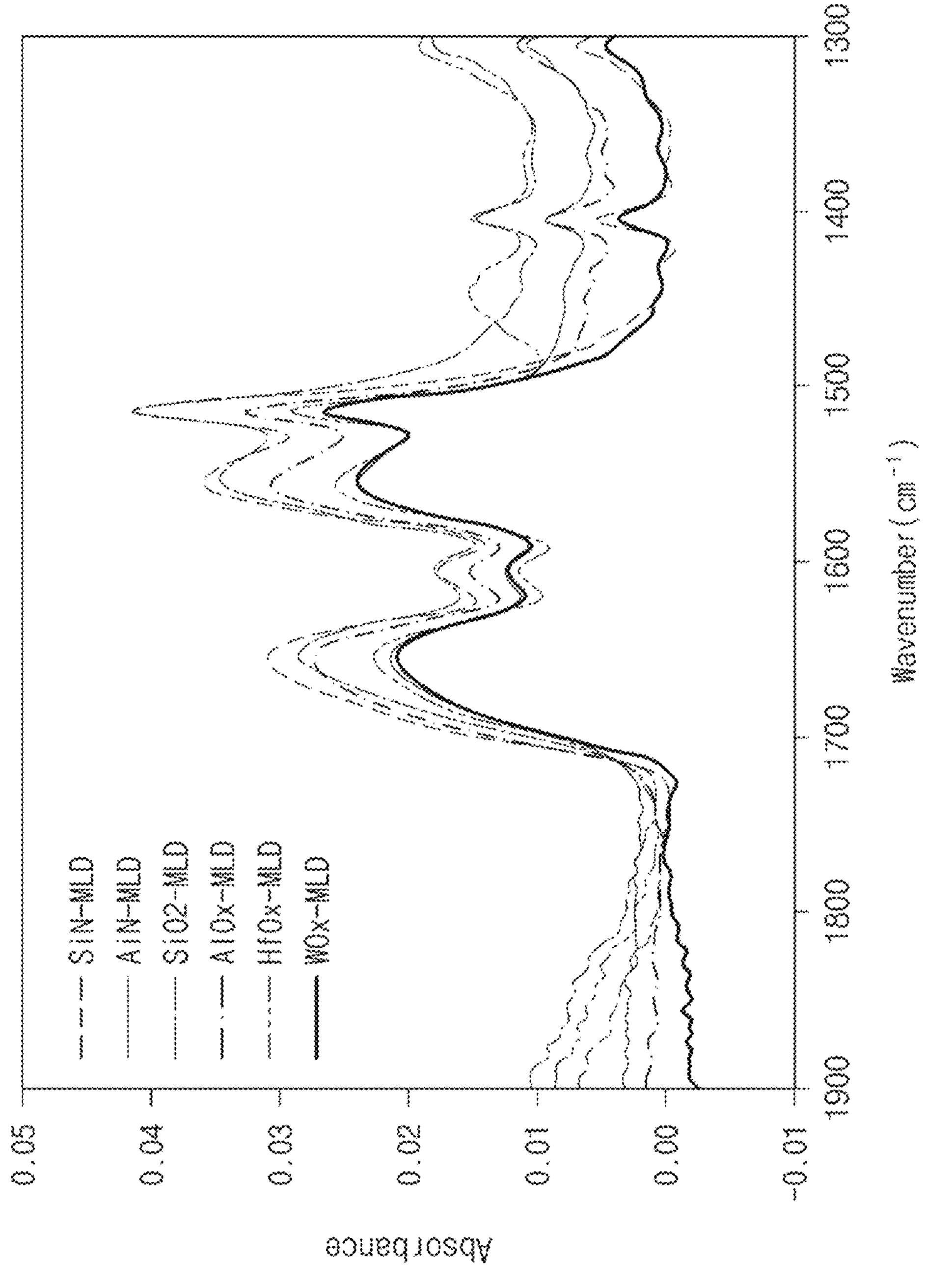
FIG. 20A illustrates an ATR-IR analysis result of the polyurea film when SiN, AlN, $SiO_2$, $AlO_x$, $HfO_x$, $WO_x$ are used as the first film and the polyurea film is deposited according to an experimental example 9.
Figure 20B:
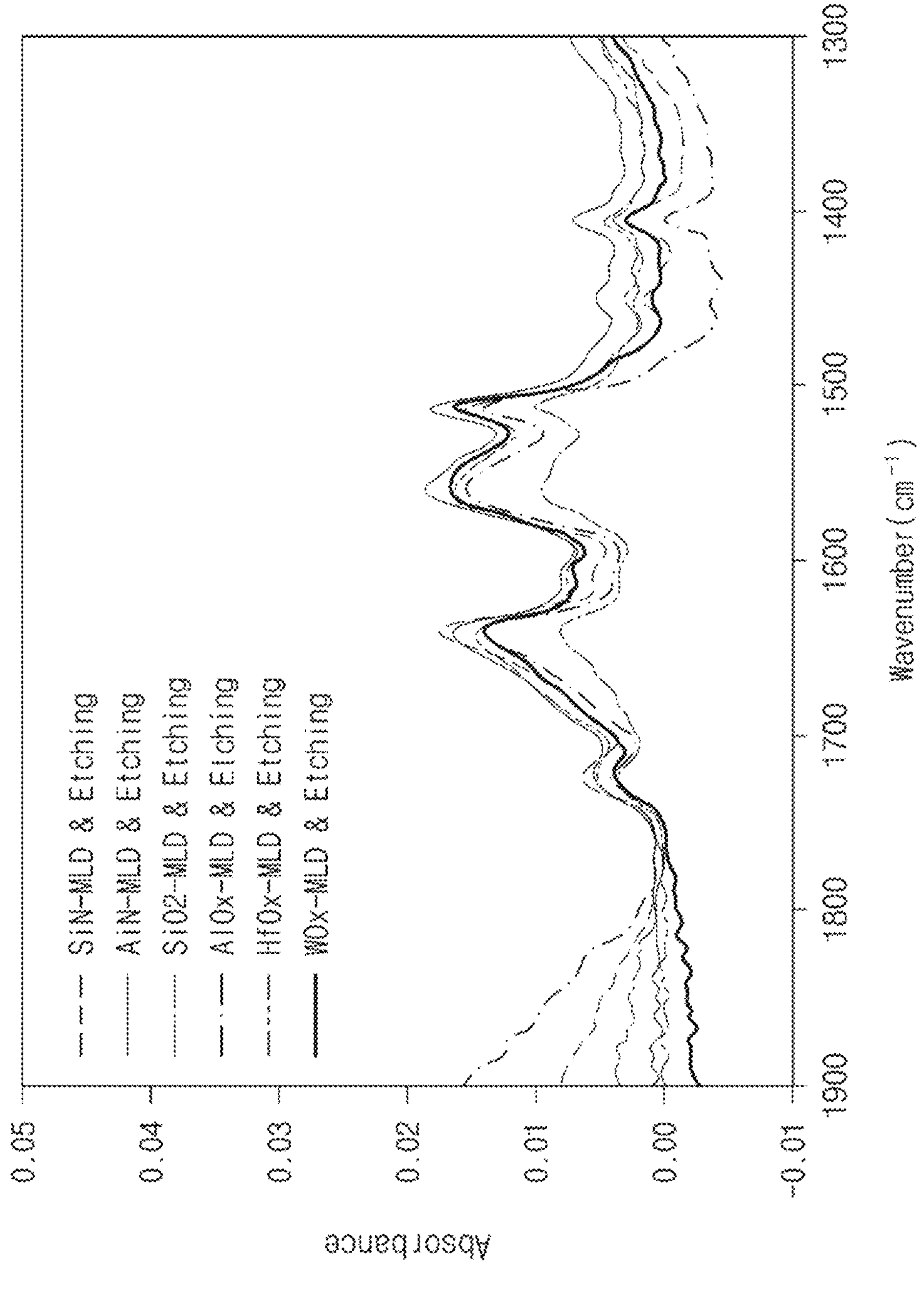
FIG. 20B illustrates an ATR-IR analysis result of the polyurea film after SiN, AlN, $SiO_2$, $AlO_x$, $HfO_x$, $WO_x$ are used as the first film and the polyurea film is deposited and annealed according to the experimental example 9.

FIG. 19 is a graph illustrating a change in a thickness after the polyurea film is deposited and then annealed according to the present experimental example. FIG. 20A illustrated an ATR-IR analysis result of the polyurea film when SiN, AlN, $SiO_2$, $AlO_x$, $HfO_x$, $WO_x$ were used as the first film and the polyurea film is deposited according to an experimental example 9, and FIG. 20B illustrated an ATR-IR analysis result of the polyurea film after SiN, AlN, $SiO_2$, $AlO_x$, $HfO_x$, $WO_x$ are used as the first film and the polyurea film is deposited and annealed according to the experimental example 9.

Figure 21A:
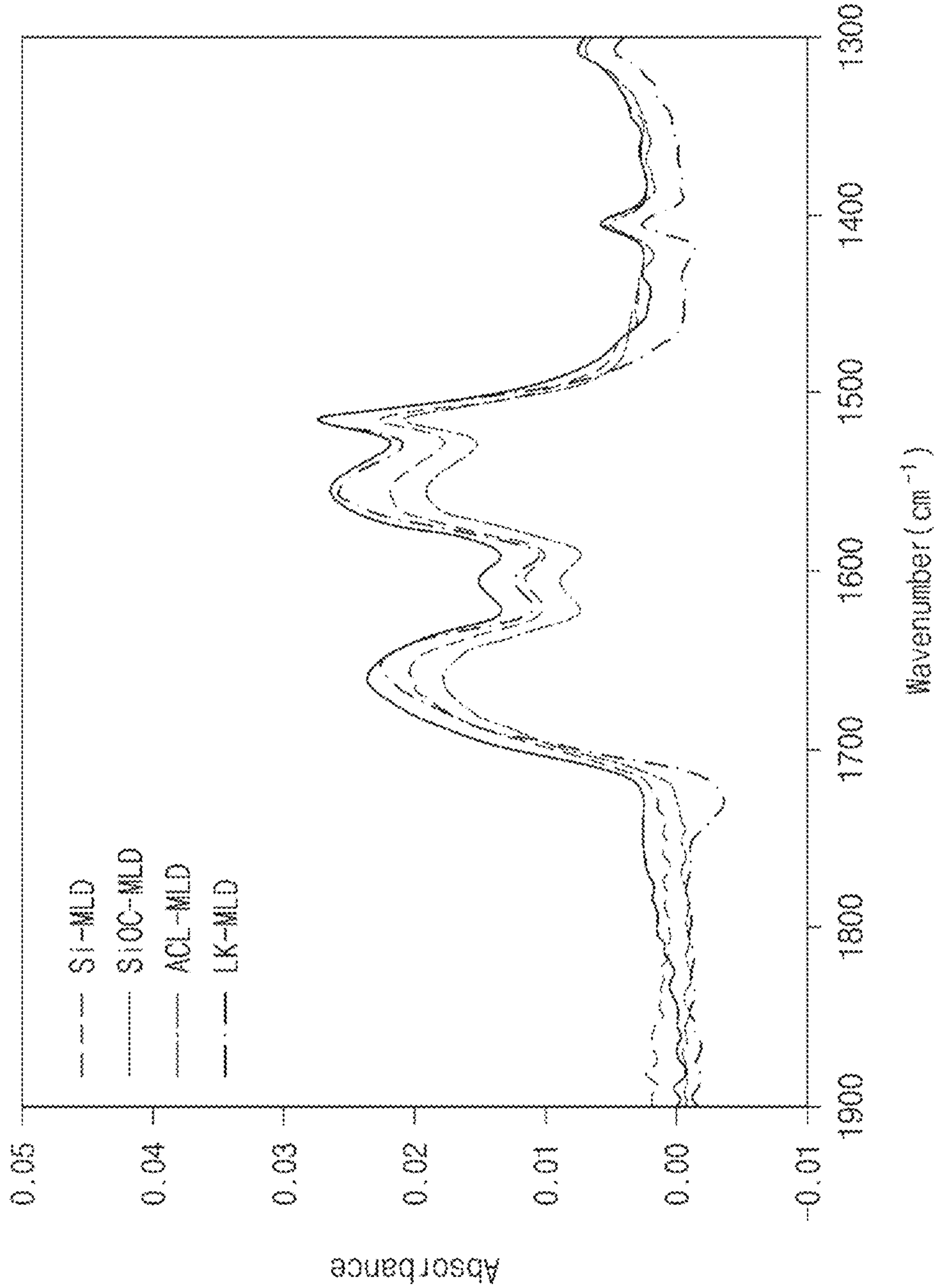
FIG. 21A illustrates an ATR-IR analysis result of the polyurea film when Si, SiOC, ACL, and LK are used as the first film and the polyurea film is deposited according to the experimental example 9.
Figure 21B:
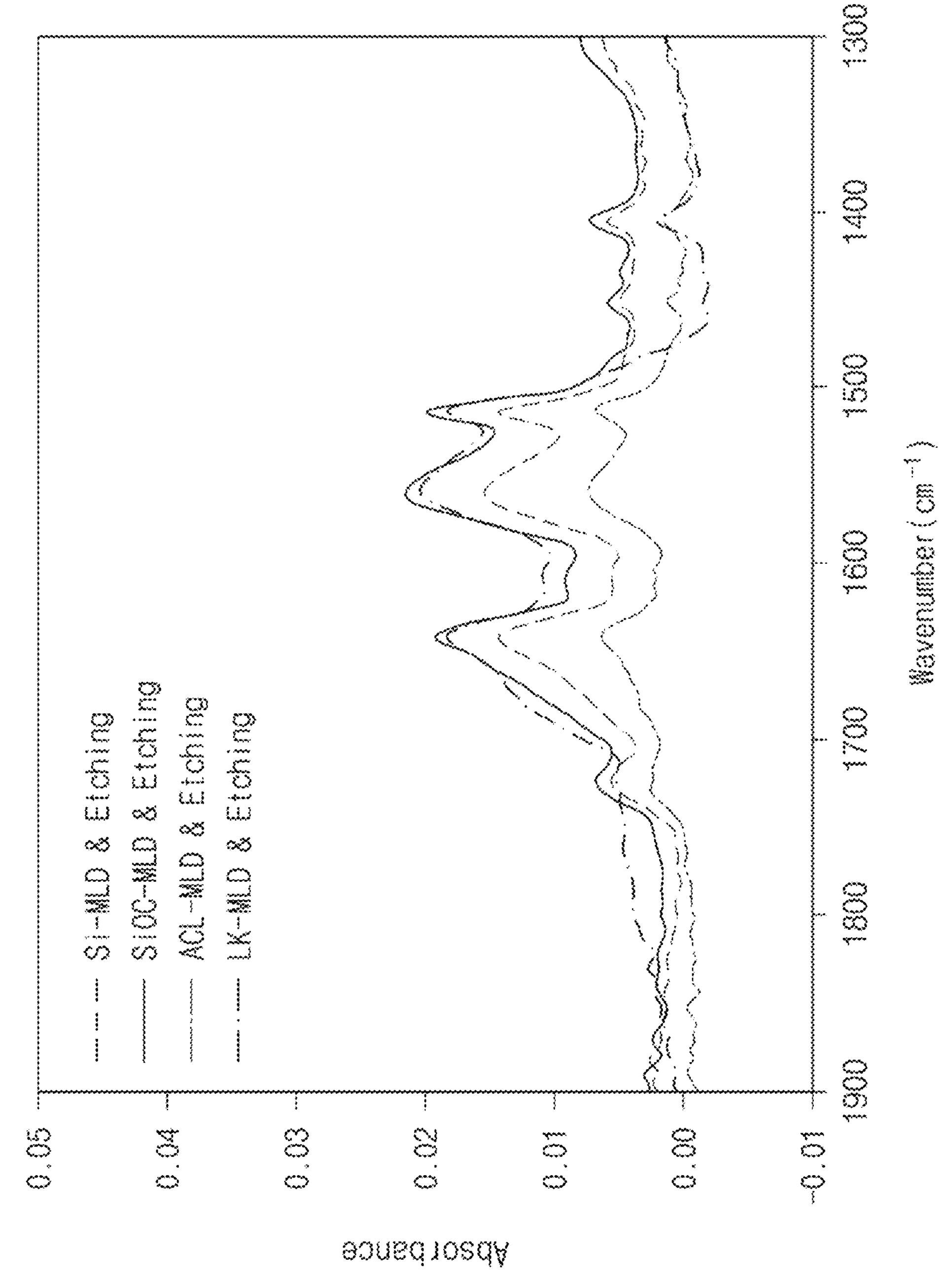
FIG. 21B illustrates an ATR-IR analysis result of the polyurea film after Si, SiOC, ACL, and LK are used as the first film and the polyurea film is deposited and annealed according to the experimental example 9.

FIG. 21A illustrated an ATR-IR analysis result of the polyurea film when Si, SiOC, ACL, and LK are used as the first film and the polyurea film is deposited according to the experimental example 9, and FIG. 21B illustrated an ATR-IR analysis result of the polyurea film after Si, SiOC, ACL, and LK are used as the first film and the polyurea film is deposited and annealed according to the experimental example 9.

Figure 22A:
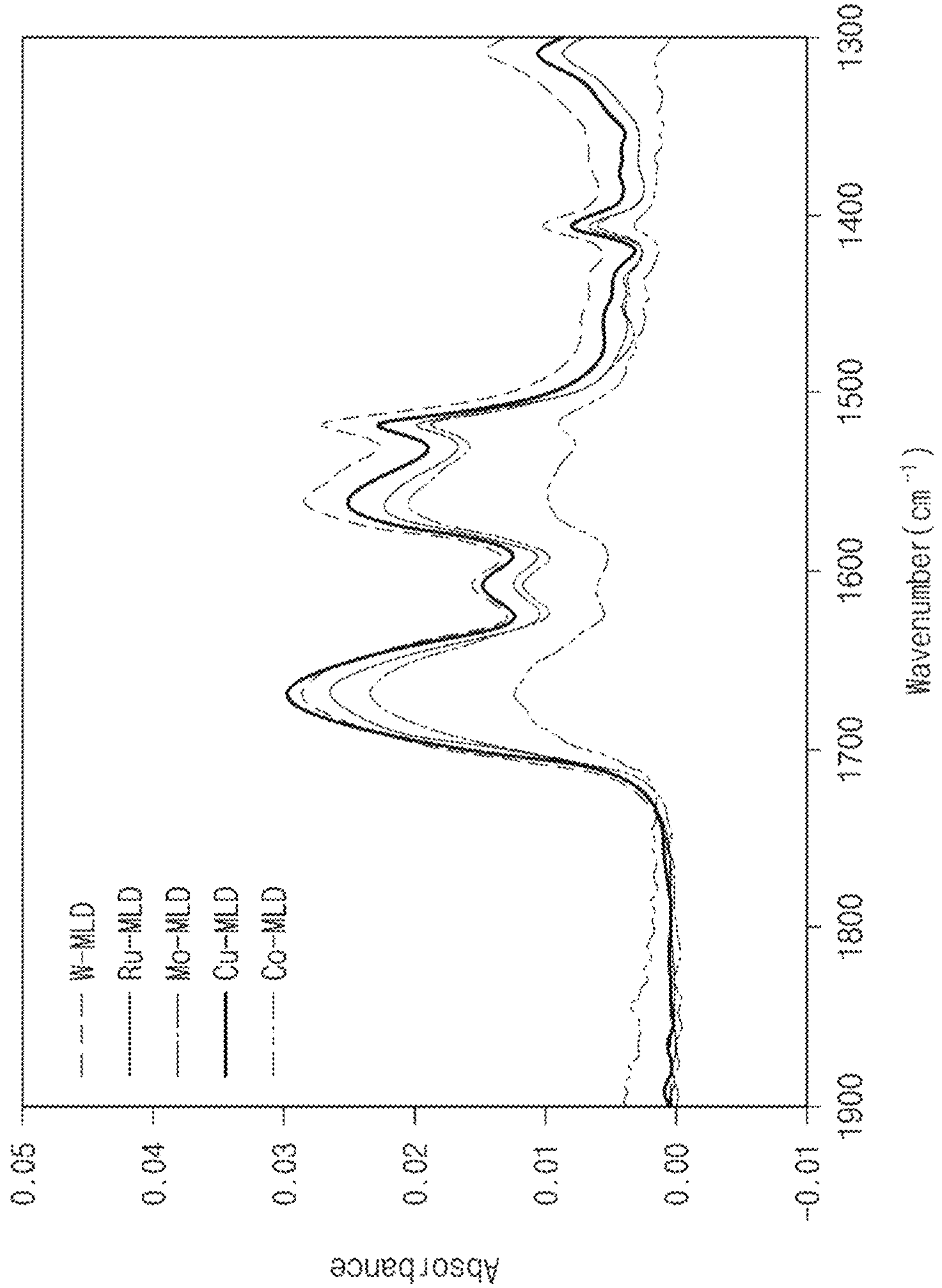
FIG. 22A illustrates an ATR-IR analysis result of the polyurea film when W, Ru, Mo, Co, and Cu are used as the second film and the polyurea film is deposited according to the experimental example 9.
Figure 22B:
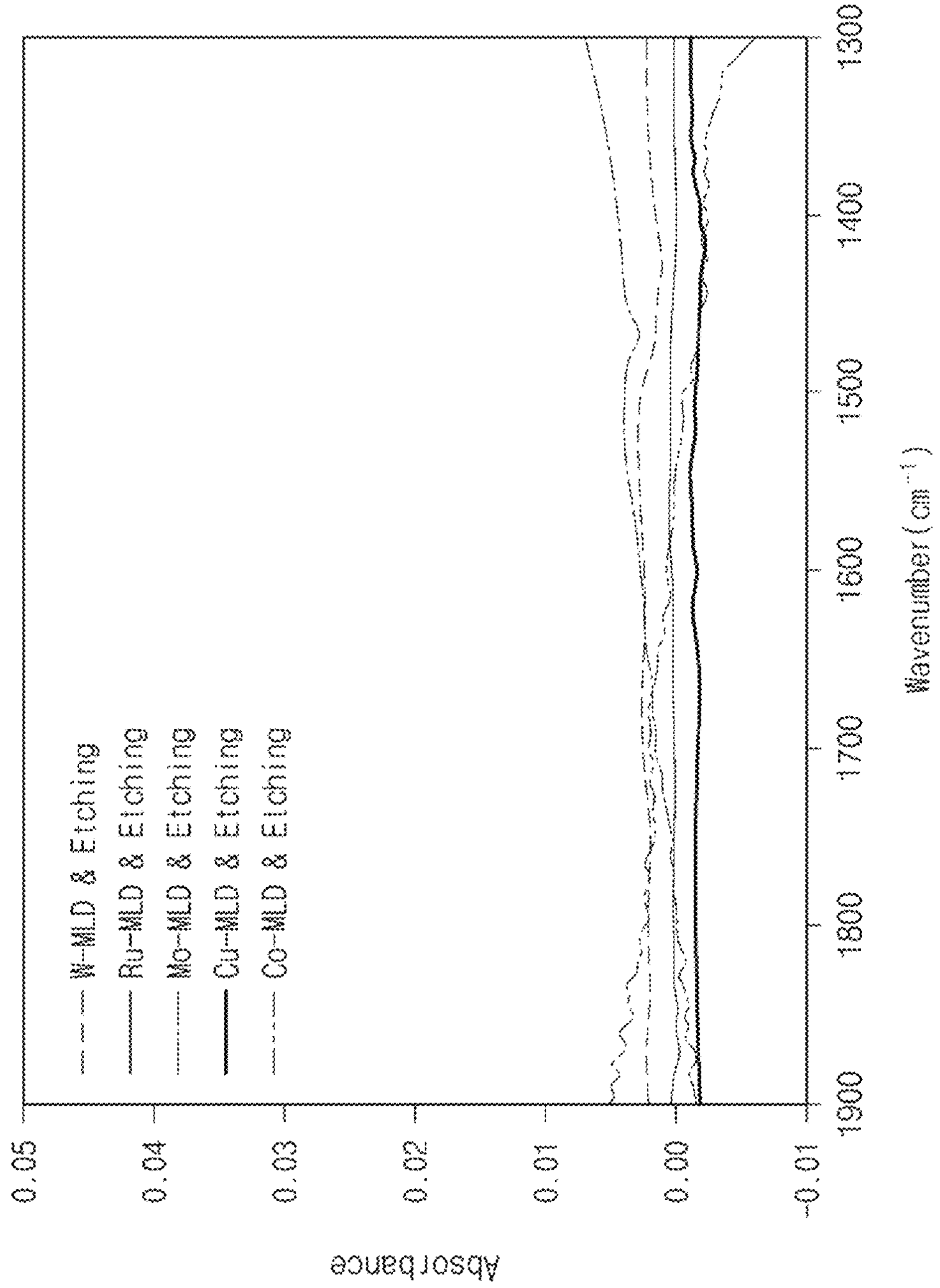
FIG. 22B illustrates an ATR-IR analysis result of the polyurea film after W, Ru, Mo, Co, and Cu are used as the second film and the polyurea film is deposited and annealed according to the experimental example 9.

FIG. 22A illustrated an ATR-IR analysis result of the polyurea film when W, Ru, Mo, Co, and Cu are used as the second film and the polyurea film is deposited according to the experimental example 9, and FIG. 22B illustrated an ATR-IR analysis result of the polyurea film after W, Ru, Mo, Co, and Cu are used as the second film and the polyurea film is deposited and annealed according to the experimental example 9.

Referring to Table 9, FIGS. 19, FIG. 20A, FIG. 20B, FIG. 21A, FIG. 21B, FIG. 22A, and FIG. 22B, both when various different non-metals were used as materials of the first film and when various different metals were used as materials of the second film, the polyurea film on the second film might be selectively removed.

In particular, the polyurea film formed on the metallic film might be identified in FIG. 22A, and it might be identified in FIG. 22B that the polyurea film was substantially and completely removed after the etching using the vacuum annealing.

Experimental Example 11

The polyurea film was deposited on the first film and the second film in the MLD, atomic layer deposition (ALD) of ruthenium (Ru) was performed to form a ruthenium film, and the annealing was performed to remove the polyurea film on the first film.

Experimental Condition

MLD process temperature: 30° C.
1,4-phenylene diisocyanate canister heating temperature: 60° C.
Canister heating temperature for ethylenediamine: Room temperature
Source carrier argon flow rate: 400 sccm
Pure argon flow rate: 1300 sccm
Operating pressure: 0.8 Torr
Operating period: The one period included ① diisocyanate provision—② diisocyanate purge—③ diamine provision—④ diamine purge and was performed for the following time.

① Provision time of 1,4-phenylene diisocyanate: 50 sec
② Purge time: 100 sec
③ Provision time of ethylenediamine: 20 sec
④ Purge time: 100 sec MLD period: 40 period
Ruthenium precursor: Ethylbenzyl (1-ethyl-1,4-cyclohexadienyl) Ruthenium Reactant: $O_2$ Ru ALD Temperature: 220° C.

ALD operating period: One period included ① Ru precursor provision—② Ru precursor purge—③ $O_2$ provision—④ $O_2$ purge and was performed for the following time.

① Ru precursor providing time: 5 sec
② Purge time: 5 sec
③ $O_2$ providing time: 5 sec
④ Purge time: 5 sec ALD period: 200 period Condition after annealing: The polyurea film was maintained for 20 minutes under a vacuum state and maintained for five minutes under argon (400° C.).

Experimental Example 12

Ru was directly deposited on the SIN film and the SiO2 film that were the first film and the tungsten film that was the second film in the ALD process and then was annealed. Ru ALD and annealing conditions were as follows.

Experimental Condition

Ruthenium precursor: Ethylbenzyl(1-ethyl-1,4-cyclohexadienyl) ruthenium

Reactant: $O_2$

Ru ALD Temperature: 220° C.

ALD operating period: One period included ① Ru precursor provision—② Ru precursor purge—③ $O_2$ provision—④ $O_2$ purge and was performed for the following time.

① Ru precursor providing time: 5 sec
② Purge time: 5 sec
③ $O_2$ providing time: 5 sec
④ Purge time: 5 sec ALD period: 200 period Condition after annealing: The polyurea film was maintained for 20 minutes under a vacuum state and maintained for five minutes under argon (400° C.).

Table 10 represented the results according to experimental example 11 and experimental example 12 and was the result sequentially representing the thickness of the polyurea film and the thickness of the Ru film 1) when the polyurea film was formed in the MLD, 2) when Ru was deposited on the substrate in the ALD process, and 3) when the substrate formed in the Ru was annealed. Portions expressed as MLD/Ru ALD/Ru annealing in the following table referred to the thickness of the polyurea film when the processes 1), 2), 3) were completed.

The thickness of the Ru film on the polyurea film in Table 10 below referred to the thickness of the Ru film on the polyurea film in experimental example 11, and the thickness of the Ru film on the tungsten film in Table 10 referred to the thickness of the Ru film in experimental example 12.

TABLE 10

| Second film | Thickness of polyurea film (nm) MLD | Ru ALD | Ru annealing | Thickness of Ru film on polyurea film (nm) | Thickness of Ru film on tungsten film (nm) Comparative Example |
|---|---|---|---|---|---|
| SiN | 25 | 17 | 0 | 0 | 16 |
| SiO2 | 30 | 21 | 0 | 0 | 13 |
| W | 21 | 12 | 0 | 0 | 18.5 |

Referring to Table 10, the polyurea film was deposited on the first film and the second film through the MLD, and a portion of the polyurea film was removed under $O_2$ thermal gas conditions during the ALD process of RU. Further, all the remaining polyurea film was removed during the annealing process after the Ru film formation. In addition, it might be identified that no RU film was formed on a surface of the polyurea film on the first film and the second film. These results indicated that the polyurea film might be used as a layer forming inhibitor or a passivation layer when the Ru film was formed.

Experimental Example 13

Selective deposition between the first film and the second film was evaluated to identify whether the polyurea film might be used as the layer forming inhibitor when the Ru film was deposited through experimental example 11. After the SiN film, the $SiO_2$ film, the AlN film, and the $HfO_x$ film were formed as the first film and the W film and the Cu film were formed as the second film, the polyurea film was deposited for 40 periods in the MLD and then vacuum-annealed. Thereafter, an in-situ Ru ALD process and an Ru annealing process were performed. The Ru films were deposited directly on the first film and the second film according to experimental example 12 to compare the thicknesses of the Ru films. Reproducibility of the SiN film and the $SiO_2$ film of the first film and the W film of the second film was evaluated three times.

Table 11 represented results of the thickness of the Ru film when the Ru film was formed on the substrate in the process of experimental example 12 and the thickness of the Ru film when the Ru film was formed on the substrate manufactured according to experimental example 8.

TABLE 11

| | | In experimental example 12 Thickness of RU (nm) | In experimental example 8 Thickness of RU (nm) |
|---|---|---|---|
| First film | SiN | 15 ± 1 | 0 |
| | $SiO_2$ | 12 ± 1 | 0 |
| | AlN | 17 | 0 |
| | $HfO_x$ | 15 | 0 |
| Second film | W | 17.5 ± 1 | 15 ± 2 |
| | Cu | 21 | 20 |

Figure 23A:
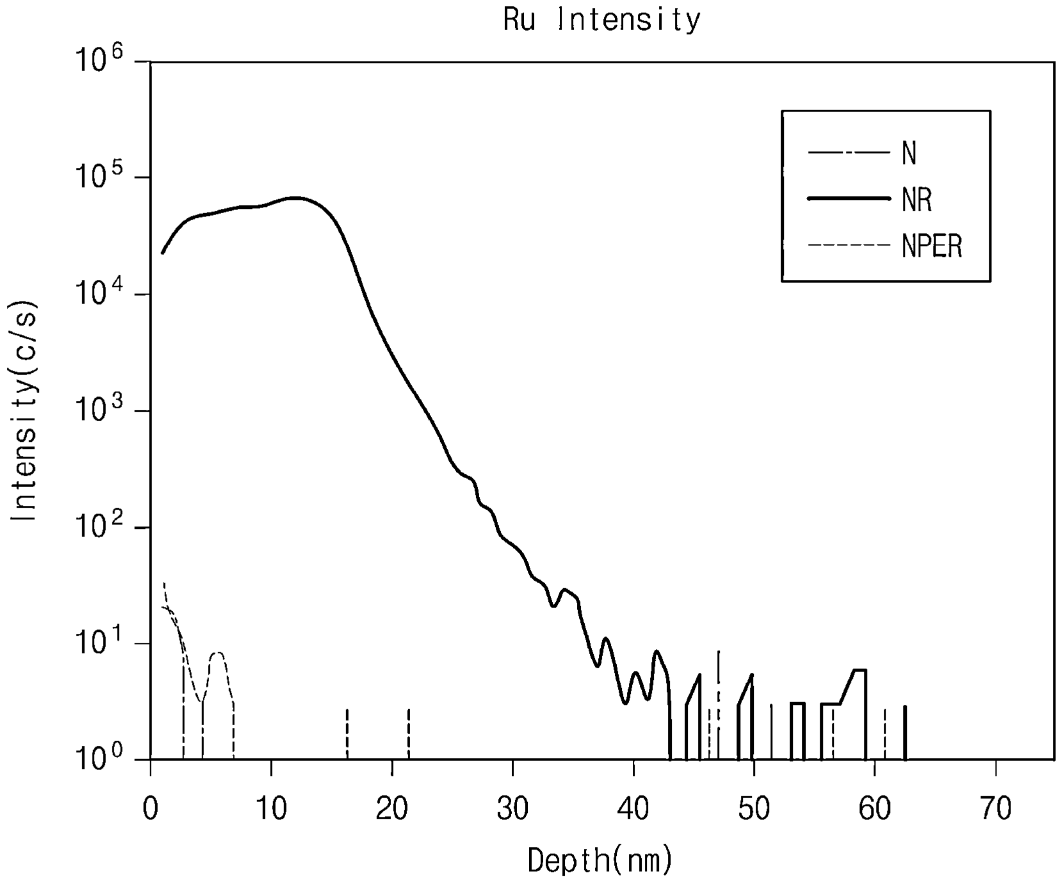
FIGS. 23A to 23C illustrate a secondary ionization mass spectrometry (SIMS) depth profile of a Ru film according to the present experimental example.
Figure 23B:
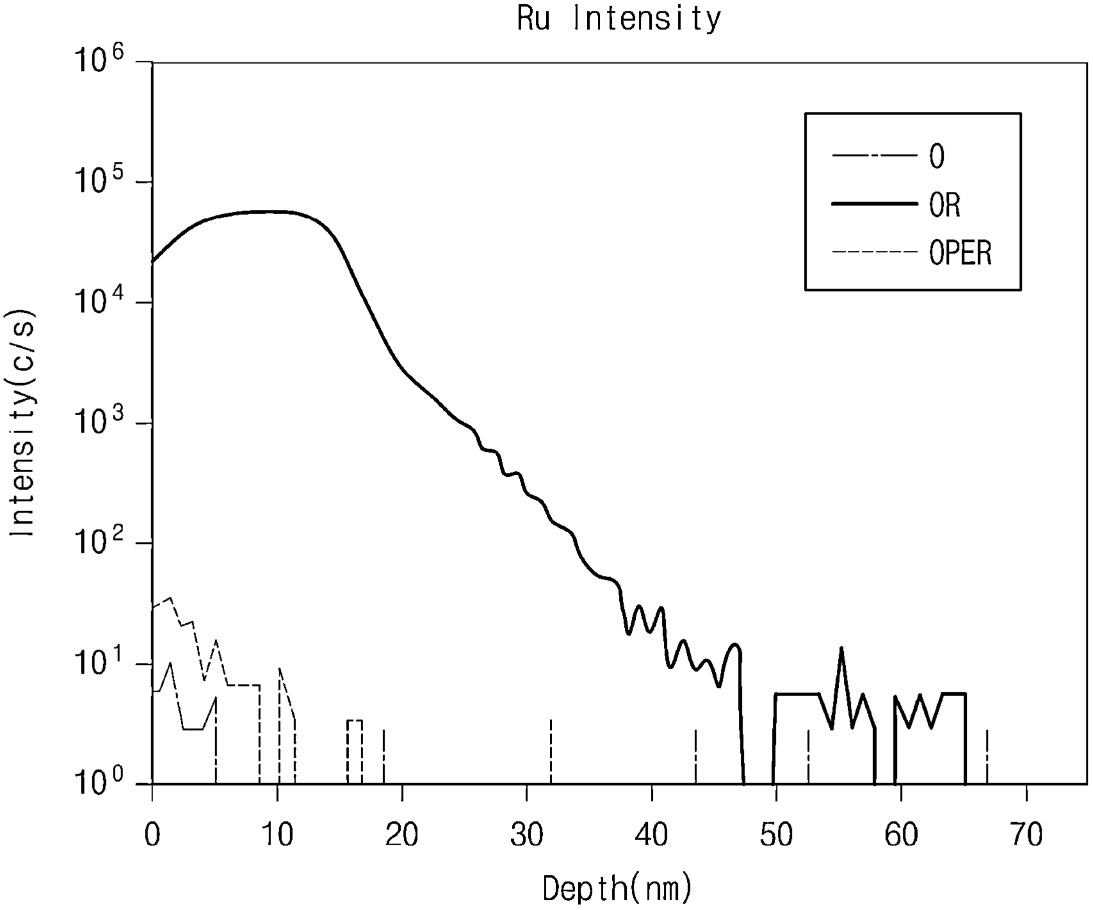
Figure 23C:
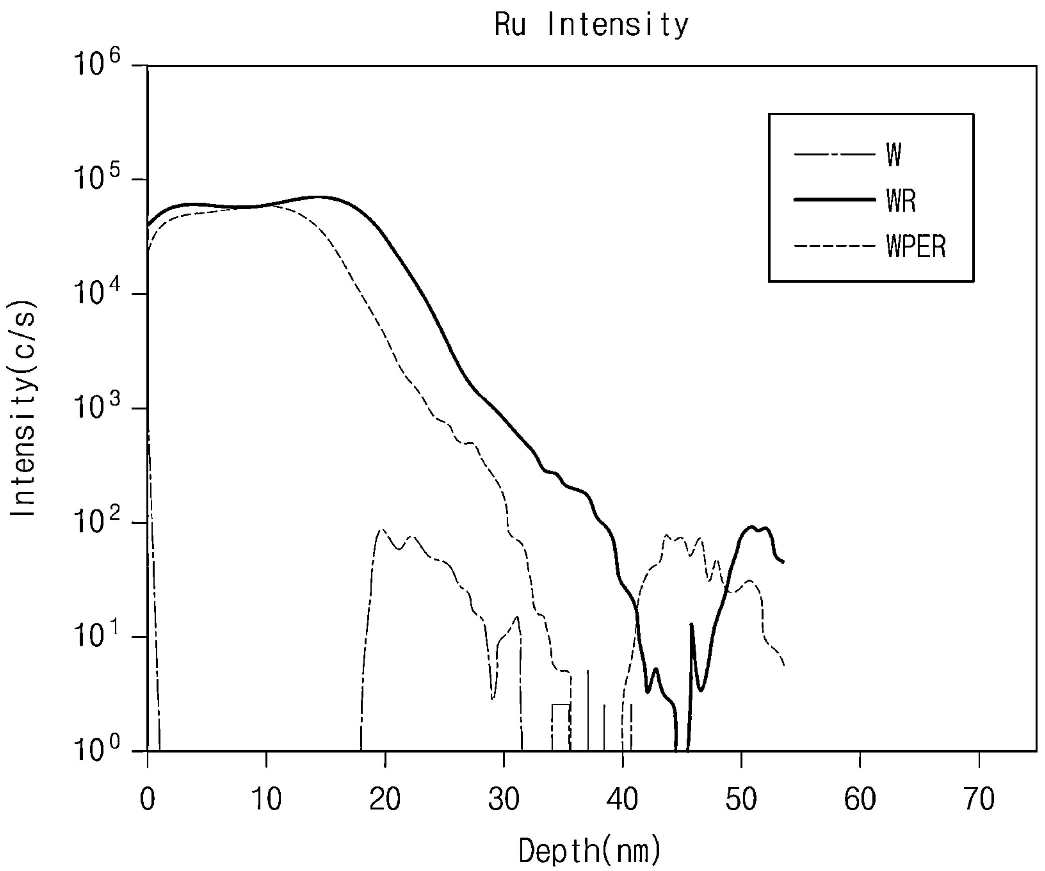

Referring to Table 11, the Ru film was deposited on surfaces of W and Cu that were pure metals but the Ru film was not deposited on the SiN film, the $SiO_2$ film, the AlN film, and $HfO_x$ film that were the first film. FIGS. 23A to 23C illustrated a secondary ionization mass spectrometry (SIMS) depth profile of the Ru film according to the present experimental example, FIG. 23A was a graph depicting a result value of the Ru film on the SiN film, FIG. 23B was a graph depicting a result value of the Ru film on the $SiO_2$ film, and FIG. 23C was a graph depicting a result value of the Ru film on the W film. Here, a green line was a SIMS profile according to the present experimental example, a blue line was a SIMS profile manufactured according to experimental example 12, and a red line was a SIMS profile of a substrate on which no other processes were performed.

Referring to FIGS. 23A to 23C, the Ru film was selectively deposited only on the second film, that is, the W film, among the first film and the second film. Therefore, it might be identified that the polyurea film remaining on the first film served as the layer forming inhibitor.

According to an embodiment of the present disclosure, an area-selective film forming method using polyurea is provided. The area-selective film forming method according to an example embodiment of the present disclosure facilitates selective formation and removal of a layer forming inhibitor without causing defects in other components, so that a target film may be formed in a desired area.

The above embodiments have been described as an example for convenience of description, the present disclosure is not limited thereto, and the above-described embodiments may be variously combined without departing from the concept of the present disclosure. Various types of pixel groups may be provided, and colors allocated to the pixel groups may also be changed variously.

Although the description has been made above with reference to an embodiment of the present disclosure, it may be understood that those skilled in the art or those having ordinary knowledge in the art may variously modify and change the present disclosure without departing from the spirit and technical scope of the present disclosure described in the appended claims.

Thus, the technical scope of the present disclosure is not limited to the detailed description of the specification, but should be defined by the appended claims.

What is claimed is:

1. An area-selective film forming method comprising:
- preparing a substrate having a first area and a second area, the first area and the second area being made of different materials;
- forming a polyurea film on the first area and the second area;
- annealing the polyurea film and selectively removing the polyurea film from the second area to form a polyurea film pattern on the first area, wherein a thickness of the polyurea film pattern is smaller than a thickness of the polyurea film on the first area;
- selectively forming a layer forming inhibitor on the second area from which the polyurea film is removed;
- removing the polyurea film pattern on the first area;
- forming a target film on the first area, wherein a thickness of the target film is greater than a thickness of the layer forming inhibitor; and
- removing the layer forming inhibitor on the second area.

2. The area-selective film forming method of claim 1, wherein the first area is made of a non-metallic film and the second area is made of a metallic film.

3. The area-selective film forming method of claim 2, wherein
- annealing the polyurea film completely removes the polyurea film formed on the second area.

4. The area-selective film forming method of claim 3, wherein the polyurea film formed on the second area is catalytic-cracked by the metallic film.

5. The area-selective film forming method of claim 2, wherein the metallic film includes at least one of cobalt (Co), copper (Cu), nickel (Ni), niobium (Nb), molybdenum (Mo), ruthenium (Ru), rhodium (Rh), tungsten (W), palladium (Pd), silver (Ag), gold (Au), iridium (Ir), or platinum (Pt).

6. The area-selective film forming method of claim 2, wherein the non-metallic film is made of at least one of:
- a non-metallic compound including one or more group 13 to 17 elements in periods of 3 to 6, one or more oxides thereof, one or more nitrides thereof, or one or more oxy nitrides thereof;
- a metallic compound including one or more metal oxides, one or more metal nitrides, or one or more metal oxy nitrides;
- a silicon-based compound; or
- a carbon compound including amorphous carbon, graphite, graphene, or carbon nanotubes; an aluminum compound including aluminum, aluminum oxide, or aluminum nitride, or aluminum oxynitride.

7. The area-selective film forming method of claim 1, wherein annealing the polyurea film is performed at a temperature of 200° C. to 350° C.

8. The area-selective film forming method of claim 1, wherein annealing the polyurea film is performed under a vacuum state.

9. The area-selective film forming method of claim 8, wherein annealing the polyurea film is performed at a pressure of 100 Torr or less.

10. The area-selective film forming method of claim 1, wherein
- forming the polyurea film on the first area and the second area comprises forming the polyurea film with different heights on the first area and the second area.

11. The area-selective film forming method of claim 1, wherein forming the target film on the second area includes selectively depositing the target film on the second area.

12. The area-selective film forming method of claim 1, wherein the polyurea film pattern on the first area is removed in a reaction space using at least one of vacuum annealing, annealing under a gas, or plasma treatment.

13. The area-selective film forming method of claim 12, wherein
- the polyurea film pattern on the first area is removed in the reaction space using annealing under the gas,
- the gas includes at least one of hydrogen, oxygen, ammonia, argon, or nitrogen.

14. The area-selective film forming method of claim 1, comprising:
- performing plasma treatment on the substrate before forming the polyurea film.

15. The area-selective film forming method of claim 1, wherein forming the polyurea film includes reacting an amine-based precursor excluding monoamine with an isocyanate to form a reacted material and depositing the reacted material on the substrate, and
- the isocyanate includes diisocyanate, triisocyanate, or both diisocyanate and triisocyanate.

16. The area-selective film forming method of claim 15, wherein forming the polyurea film is performed by at least one of vapor deposition, molecular layer deposition, or atomic layer deposition.

17. An area-selective film forming method comprising:
- preparing a substrate including a non-metallic film in a first area of the substrate and a metallic film in a second area of the substrate;
- forming a polyurea film having different heights on the first area and the second area of the substrate by at least one of vapor deposition, molecular layer deposition, or atomic layer deposition;
- annealing the polyurea film under a vacuum state and selectively removing the polyurea film on the second area to form a polyurea film pattern on the first area, wherein a thickness of the polyurea film pattern is smaller than a thickness of the polyurea film on the first area;
- selectively forming a layer forming inhibitor on the second area from which the polyurea film is removed;
- removing the polyurea film pattern on the first area;
- selectively depositing a target film on the first area, wherein a thickness of the target film is greater than a thickness of the layer forming inhibitor; and
- removing the layer forming inhibitor on the second area.

18. An area-selective film forming method comprising:

preparing a substrate including a first film and a second film having different materials, the first film being in a first area of the substrate, the second film being in a second area of the substrate, and the first area and the second area being different from each other;

forming a polyurea film on the first area and the second area;

annealing the polyurea film and selectively removing the polyurea film from the second area to form a polyurea film pattern on the first area, wherein a thickness of the polyurea film pattern is smaller than a thickness of the polyurea film on the first area;

selectively forming a layer forming inhibitor on the second area from which the polyurea film is removed;

removing the polyurea film pattern on the first area;

forming a target film on the first area, wherein a thickness of the target film is greater than a thickness of the layer forming inhibitor; and removing the layer forming inhibitor on the second area.

* * * * *